(12) United States Patent
Sumita

(10) Patent No.: US 8,290,445 B2
(45) Date of Patent: Oct. 16, 2012

(54) ELECTRONIC DEVICE, AND INFORMATION APPARATUS, COMMUNICATIONS APPARATUS, AV APPARATUS, AND MOBILE APPARATUS USING THE SAME

(75) Inventor: Masaya Sumita, Hyogo (JP)

(73) Assignee: Panasonic Corporation, Osaka (JP)

( * ) Notice: Subject to any disclaimer, the term of this patent is extended or adjusted under 35 U.S.C. 154(b) by 1032 days.

(21) Appl. No.: 12/188,490

(22) Filed: Aug. 8, 2008

(65) Prior Publication Data

US 2009/0039985 A1 Feb. 12, 2009

(30) Foreign Application Priority Data

Aug. 10, 2007 (JP) ................................ 2007-209884
Jul. 1, 2008 (JP) ................................ 2008-172484

(51) Int. Cl.
*H04B 1/38* (2006.01)
(52) U.S. Cl. ......................................... 455/73; 333/109
(58) Field of Classification Search ................. 455/73; 333/109
See application file for complete search history.

(56) References Cited

U.S. PATENT DOCUMENTS

| | | | | |
|---|---|---|---|---|
| 4,855,696 | A * | 8/1989 | Tan et al. ........................ | 333/20 |
| 5,208,560 | A * | 5/1993 | Yasutake ........................ | 333/12 |
| 5,559,448 | A * | 9/1996 | Koenig ............................ | 326/30 |
| 5,767,695 | A * | 6/1998 | Takekuma et al. ............ | 326/30 |
| 6,788,102 | B2 * | 9/2004 | Atyunin et al. ................ | 326/30 |
| 2004/0104903 | A1 | 6/2004 | You | |
| 2004/0165669 | A1 * | 8/2004 | Otsuka et al. ................ | 375/257 |
| 2005/0265526 | A1 * | 12/2005 | Saeki ........................... | 379/90.01 |
| 2006/0108640 | A1 | 5/2006 | Kajigaya et al. | |
| 2010/0007445 | A1 * | 1/2010 | Ishizaki et al. ............... | 333/204 |

FOREIGN PATENT DOCUMENTS

JP 7-297678 * 11/1995

OTHER PUBLICATIONS

Usui, Y., "All About Distributed Parameter Circuit for Board Designers", Oct. 25, 2004.*

(Continued)

*Primary Examiner* — Matthew Anderson
*Assistant Examiner* — David Bilodeau
(74) *Attorney, Agent, or Firm* — McDermott Will & Emery LLP

(57) ABSTRACT

An electronic device includes a transmitter circuit, a receiver circuit, a first conductor, and a second conductor of a return path being a grounded line. The first conductor is surrounded by a dielectric. A plurality of resistive elements are connected in parallel between the first conductor and the second conductor. The first conductor transfers therethrough a transmission signal from the transmitter circuit. The length of the line of the first conductor is set to be greater than or equal to one half of the product between the inverse of the signal transfer rate of the first conductor and the velocity of light traveling through the dielectric. The resistive elements are provided along the line of the first conductor for every unit distance being equal to one half of the product between the signal transfer rate of the first conductor and the velocity of light traveling through the dielectric. Thus, it is possible to reduce the signal waveform distortion along the transmission line.

39 Claims, 36 Drawing Sheets

OTHER PUBLICATIONS

Yamaguchi, K., et al., "12 Gb/s Duobinary Signaling with x2 Oversampled Edge Equalization", IEEE International Solid-State Circuits Conference Session 3 Backplane Transceivers, 2005, pp. 70-71.*

Schinkel, D., et al., "A 3-Gb/s/ch Transceiver for 10-mm Uninterrupted RC-Limited Global On-Chip Interconnects", IEEE Journal of Solid-State Circuits, Jan. 2006, pp. 297-306, vol. 41 No. 1, IEEE.*

Jose, A., et al., "Pulsed Current-Mode Signaling for Nearly Speed-of-Light Intrachip Communication", IEEE Journal of Solid-State Circuits, Apr. 2006, pp. 772-780, vol. 41 No. 4.*

Momtaz, A., et al., "A Fully Integrated 10-Gb/s Receiver With Adaptive Optical Dispersion Equalizer in 0.13-µm CMOS", IEEE Journal of Solid-State Circuits, Apr. 2007, pp. 872-880, vol. 42 No. 4.*

Wong, Koon-Lun, et al., "A 5-mW 6-Gb/s Quarter-Rate Sampling Receiver With a 2-Tap DFE Using Soft Decisions", IEEE Journal of Solid-State Circuits, Apr. 2007, pp. 881-888, vol. 42 No. 4.*

\* cited by examiner

24 Phase adjustment circuit

ELECTRONIC DEVICE, AND INFORMATION APPARATUS, COMMUNICATIONS APPARATUS, AV APPARATUS, AND MOBILE APPARATUS USING THE SAME

CROSS REFERENCE TO RELATED APPLICATION

This application claims priority under 35 U.S.C. §119 on Patent Application No. 2007-209884 filed in Japan on Aug. 10, 2007 and No. 2008-172484 filed in Japan on Jul. 1, 2008, the entire contents of which are hereby incorporated by reference.

BACKGROUND OF THE INVENTION

The present invention relates to an electronic device and, more particularly, to communications within an integrated circuit in an electronic device or between such integrated circuits and to techniques for increasing the operation speed and reducing the area and power consumption by using a transmission line.

A conventional method for high-speed communications within an integrated circuit including a semiconductor in an electronic device or between such integrated circuits includes the use of a transmission line between the transmitter circuit and the receiver circuit. The transmission line includes a device element, with which it is possible to obtain the same impedance value as the characteristic impedance of the line being a conductor. With a transmission line of a single line scheme, the device element is connected between the signal-carrying conductor line and the return path in the vicinity of the receiver circuit. With a transmission line of a differential transmission system, the device element is connected between two signal-carrying conductor lines.

With such a method, the coefficient of reflection of the signal propagating along the conductor line is suppressed to zero as much as possible, so that a reliable signal voltage waveform is generated near, and received by, the receiver circuit. One such technique is described in Yuzo Usui, "All About Distributed Parameter Circuit For Board Designers", Chapters 6 and 9 (Non-Patent Document 1).

With such a transmission line, actual signals to be transmitted do not always have the same frequency, and the signal reflection coefficient cannot be made zero due to the inter-symbol interference (ISI).

Conventional countermeasures against the problem include the duobinary signaling technique described in "12 Gb/s Duobinary Signaling with ×2 Oversampled Edge Equalization", IEEE International Solid-State Circuits Conference 2005, Session 3.6 (Non-Patent Document 2), the preemphasis technique described in "A 3-Gb/s/ch Transceiver for 10-mm Uninterrupted RC-Limited Global On-Chip Interconnects", IEEE Journal of Solid-State Circuits, vol. 41, no. 1, p. 297, January 2006 (Non-Patent Document 3), the return zero (RZ) technique described in "Pulsed Current-Mode Signaling for Nearly Speed-of-Light Intrachip Communication", IEEE Journal of Solid-State Circuits, vol. 41, no. 4, p. 772, April 2006 (Non-Patent Document 4), and the equalizer technique described in "A Fully Integrated 10 Gbp/s Receiver with Adaptive Optical Dispersion Equalizer in 0.13 μm CMOS", IEEE Journal of Solid-State Circuits, vol. 42, no. 4, p. 872, April 2007 (Non-Patent Document 5) and "A 5 mW 6 Gbp/s Quarter-Rate Sampling Receiver with a 2-Tap DFE Using Soft Decisions", IEEE Journal of Solid-State Circuits, vol. 42, no. 4, p. 881, April 2007 (Non-Patent Document 6).

With the configurations of Non-Patent Documents 2 to 6, however, extra circuits need to be added to the transmitter circuit and the receiver circuit, thereby increasing the area and power consumption of the transmitter circuit and those of the receiver circuit.

The signal reflection coefficient is prevented from becoming zero also by, for example, manufacturing variations of the device element, which is placed in the vicinity of the receiver circuit of the transmission line, variations in the device temperature thereof, and variations in the applied voltage value thereof. In order to solve this problem, Japanese Laid-Open Patent Publication No. 7-297678 (Patent Document 1) discloses a conventional technique of realizing, by means of a MOS resistive element (hereinafter referred to as a "terminating resistor"), an impedance value such that the signal waveform is unlikely to be reflected in the vicinity of the receiving terminal.

With this method, the value of the terminating resistor can be adjusted by a CMOS circuit technique. Specifically, this is a feedback system where an equal amount of current is conducted for a reference resistor value and for a replica CMOS terminating resistor value to make a comparison between the voltage values each obtained by multiplying the resistance value by the current value, based on which the gate voltage value of the replica CMOS is adjusted so that the reference resistor value and the replica CMOS terminating resistor value are equal to each other. The gate voltage value of the replica CMOS is applied also to the gate of the CMOS terminating resistor circuit so that the terminating resistor eventually has a resistance value equal to the value of the reference resistor.

With the method of Patent Document 1, however, the reference resistor needs to be placed outside the semiconductor integrated circuit. If the reference resistor is provided inside the semiconductor integrated circuit, the terminating resistor value will then vary due to process variations and temperature variations, whereby it will not be possible to accurately achieve the impedance match. Then, the signal voltage waveform in the vicinity of the receiver circuit has disturbed phase, resulting in unreliable data being received.

SUMMARY OF THE INVENTION

In order to solve the problems set forth above, the present invention provides an electronic device, including: at least one transmitter circuit; at least one receiver circuit; at least two conductors; a dielectric surrounding the conductors; and a plurality of resistive elements connected in parallel between a first conductor including at least one of the conductors and a second conductor including at least one of the conductors excluding the first conductor, wherein: the first conductor transfers a signal therethrough; a length of a line of the first conductor is greater than or equal to one half of a product between an inverse of a signal transfer rate of the first conductor and a velocity of light traveling through the dielectric; and at least one of the resistive elements is provided along the line of the first conductor for every unit distance being equal to one half of the product between the signal transfer rate of the first conductor and the velocity of light traveling through the dielectric.

Thus, the present invention reduces the distortion in the signals transferred through the transmission line, thereby enabling a signal transfer at a higher speed.

In one preferred embodiment, a potential of the second conductor is forcibly fixed from outside. Thus, the radiation direction of the electromagnetic wave along the first conductor is more converged, thus enabling a signal propagation at a higher speed.

In one preferred embodiment, the fixed potential of the second conductor stays unchanged also while the first conductor is transferring a signal therethrough. Thus, the impedance of the first conductor becomes a function of the frequency component of the signal being transferred, thereby reducing the signal distortion and enabling a signal transfer at a higher speed.

In one preferred embodiment, the second conductor transfers a complementary signal to the signal of the first conductor. Thus, the system will be more robust against the common mode noise from other conductors.

In one preferred embodiment, the line of the first conductor has a branched structure, and the resistive element is provided at a point of divergence. Thus, the straightness of the propagation of the electromagnetic wave to each of the transmission lines branching off of the point of divergence is improved, thereby maintaining the high speed of signal transfer.

In one preferred embodiment, the transmitter circuit or the receiver circuit is provided along the line of the first conductor. Thus, it is no longer necessary to provide a plurality of transmission lines, thereby realizing a reduction in the area.

In one preferred embodiment, the resistive element is included in the receiver circuit or the transmitter circuit. Thus, it is no longer necessary to separately arrange the transmitter/receiver circuits and the resistive elements, thereby reducing the layout overhead and realizing a reduction in the area.

In one preferred embodiment, the transmitter circuit sends out information on a signal-receiving position. Thus, it can be determined whether or not the receiver circuit is to receive a signal. If not, the receiver circuit can be shut down, whereby the output signal of the receiver circuit will not be propagated, thus realizing a reduction in the power consumption.

In one preferred embodiment, the transmitter circuit sends out, to the receiver circuit, information on a signal-transmitting position. The voltage amplitude value of the signal to arrive at the receiver circuit can be known in advance, whereby it is possible to accordingly adjust the sensitivity of the receiver circuit.

In one preferred embodiment, the receiver circuit adjusts a signal-receiving sensitivity depending on information on a position of the transmitter circuit. Thus, it is possible to adjust the sensitivity of the receiver circuit, thus improving the reliability of the signal transfer.

In one preferred embodiment, wherein a minimum signal transfer rate of the conductor is zero. Thus, it is no longer necessary to provide a circuit for modulating the signal transmitted from the transmitter circuit, thus realizing a reduction in the area.

In one preferred embodiment, the electronic device further includes: an integration circuit for integrating together a resistance value of the first conductor and a resistance value of the resistive element; and a comparison circuit for comparing an integrated value obtained by the integration circuit with a reference value, wherein a resistance value of the resistive element is adjusted so that the integrated value and the reference value become equal to each other. Thus, it is possible to transfer a non-distortion signal, wherein the eyepattern amplitude variation range of the transmission line is not dependent on the temperature.

In one preferred embodiment, the reference value is an inductance value per unit capacitance of the first conductor. Thus, it is possible to transfer a non-distortion signal, wherein the eyepattern amplitude variation range of the transmission line is not dependent on the variations in the shape of the wires after the manufacturing process.

In one preferred embodiment, the reference value is variable depending on a resulting shape of the conductor and an interlayer film surrounding the conductor. Thus, it is possible to transfer a non-distortion signal, wherein the eyepattern amplitude variation range of the transmission line is not dependent on the variations in the shape of the wires after the manufacturing process.

In one preferred embodiment, the integration circuit is a multiplier.

In one preferred embodiment, the multiplier receives, as an input, a product between the resistance value of the resistive element and a current value of a constant current source.

In one preferred embodiment, the multiplier receives, as an input, a product between a resistance value of a conductor imitating the conductor and a current value of a constant current source.

In one preferred embodiment, the first conductor is a transmission signal line in a semiconductor integrated circuit.

In one preferred embodiment, the electronic device further includes a power supply switch for tuning ON and OFF an external power supply to an FET in the semiconductor integrated circuit, wherein: the power supply switch is connected to a power supply line from the external power supply; and the second conductor, which is connected to the first conductor in the semiconductor integrated circuit via the resistive element, is the power supply line. Thus, the radiation direction of the electromagnetic wave along the first conductor is more converged, thus enabling a signal propagation at a higher speed.

In one preferred embodiment, the first conductor is connected to different processing units.

In one preferred embodiment, the first conductor is connected to a plurality of the same processing units.

In one preferred embodiment, the first conductor is connected to a plurality of processing elements forming a reconfigurable core.

In one preferred embodiment, a signal of the first conductor is transmitted from the transmitter circuit via a circuit receiving an electromagnetic wave.

In one preferred embodiment, the first conductor is covered by a silicon compound; and the silicon compound is polycrystalline in the resistive elements.

In one preferred embodiment, a connection between the conductor and a transmission signal line of a semiconductor integrated circuit is made via a conductor having a greater cross-sectional area than that of the conductor.

In one preferred embodiment, the resistive element includes at least one FET; and a source and a drain thereof are connected to different ones of the conductors, with a gate thereof receiving a voltage from a different conductor.

In one preferred embodiment, a voltage range of a signal line connected to the gate is a voltage region over which a source-drain current of the FET varies linearly while the first conductor is transferring a signal therethrough.

In one preferred embodiment, a voltage range of a signal line connected to the gate is a voltage region over which a source-drain current of the FET is cut off while the first conductor is not transferring a signal therethrough.

In one preferred embodiment, a voltage value of a substrate of the FET is variable independently of a source voltage, a drain voltage and a gate voltage thereof.

In one preferred embodiment, at an end portion of conductors connected to the first conductor via the resistive element, there exists a space greater than or equal to an interval at which other conductors are inserted.

In one preferred embodiment, at least one of conductors connected to the first conductor via the resistive element is arranged in parallel to the first conductor.

In one preferred embodiment, the second conductor is located between a semiconductor forming a substrate and the first conductor.

In one preferred embodiment, the second conductor includes a plurality of layers, with a bottom layer overlapping a third layer from the bottom layer.

Other preferred embodiments are directed to a communications apparatus, an information reproduction apparatus, an image display apparatus and an electronic control apparatus, each including a semiconductor integrated circuit including an electronic device of the present invention, and also to a mobile apparatus including the electronic control apparatus.

As described above, when a signal is propagated through a conductor line of an electronic device of the present invention, the signal can be propagated to the receiving terminal without introducing a distortion to the voltage waveform thereof. Thus, it is possible to realize a signal transfer at a higher speed than that in the prior art, while reducing the area and the power consumption.

DETAILED DESCRIPTION OF THE PREFERRED EMBODIMENTS

Preferred embodiments of the present invention will now be described with reference to the accompanying drawings.

First Embodiment

Figure 1:
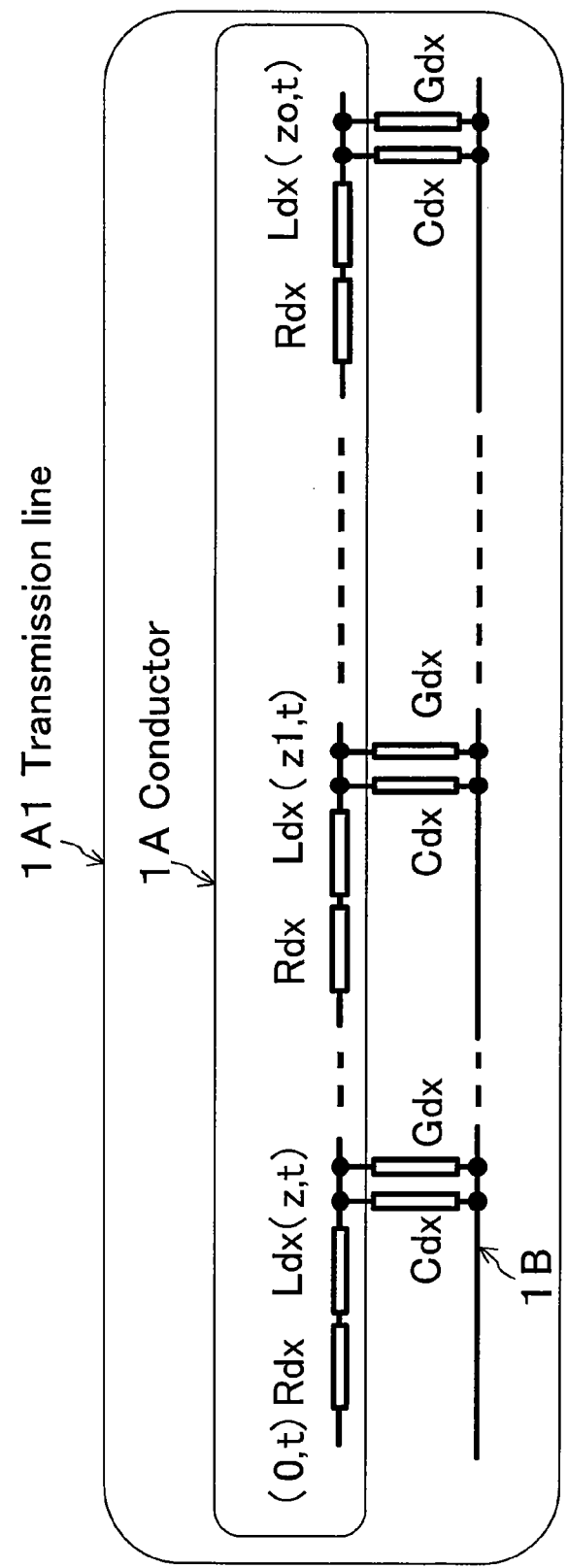
FIG. 1 shows a transmission line of the present invention.

Referring to FIG. 1, a first embodiment of the present invention is directed to a transmission line 1A1 including a conductor 1A.

The conductor 1A is herein defined as a substance whose electric resistivity [ohm·m] is on the order of $10^{-5}$ or less. The conductor 1A is used as a line for transmitting a signal carrying information. The transmission line 1A1 of the present embodiment is herein defined as a mechanism for propagating an electromagnetic wave therethrough. A transmission line shown without a reference numeral or a reference character refers to a transmission line in general and is not limited to the transmission line 1A1 of the present embodiment. The term "line" is herein used in the same sense as "wire". The conductor 1A is surrounded by a dielectric substance. The term "being surrounded" as used herein means being substantially surrounded, and the conductor is not necessarily surrounded completely by a dielectric substance. Depending on the process used for manufacturing the present mechanism, a slight amount of air, or the like, may be left inside the dielectric substance. In FIG. 1, z is the distance [m] from the leftmost, starting point of the line of the conductor 1A, t is the time [s], R is the resistance value [ohm/m] per unit length of the line of the conductor 1A, G is the conductance value [S/m] per unit length of the line of the conductor 1A, C is the capacitance value [F/m] per unit length of the line of the conductor 1A, and L is the inductance value [H/m] per unit length of the line of the conductor 1A. The line length of the conductor 1A is zo [m].

For an equivalent circuit of the transmission line 1A1, the voltage V(z,t) and the current I(z,t) at the distance z can be expressed as follows.

$$-\frac{\partial v}{\partial x}dx = iRdx + L\frac{\partial i}{\partial t}dx \quad \text{[Expression 1]}$$

Expression 1 can be rearranged as follows.

$$-\frac{\partial v}{\partial x} = Ri + L\frac{\partial i}{\partial t} \quad \text{[Expression 2]}$$

$$-\frac{\partial i}{\partial x}dx = Gdxv + Cdx\frac{\partial v}{\partial t} \quad \text{[Expression 3]}$$

Expression 3 can be rearranged as follows.

$$-\frac{\partial i}{\partial x} = Gv + C\frac{\partial v}{\partial t} \quad \text{[Expression 4]}$$

Telegraphic equations as shown in Expressions 5 and 6 below can be obtained from Expressions 2 and 4.

$$\frac{\partial V(z,t)}{\partial z} = -RI(z,t) - L\frac{\partial I(z,t)}{\partial t} \quad \text{[Expression 5]}$$

$$\frac{\partial I(z,t)}{\partial z} = -GV(z,t) - C\frac{\partial V(z,t)}{\partial t} \quad \text{[Expression 6]}$$

Where the transmission signal is a sine wave, the voltage amplitude V(z) at the distance z along the line of the conductor 1A can be expressed as shown in Expression 7, on the S plane (Laplace transformation), by solving Expressions 5 and 6, wherein γ is called the "propagation constant", the real part α of γ is called the "attenuation constant", and the imaginary part β is called the "phase constant".

$$V^+(z) = V_0^+ e^{-\gamma z} = V_0^+ e^{-\alpha z - j\beta z} \quad \text{[Expression 7]}$$

$$\gamma = \alpha + j\beta = \sqrt{(R + j\omega L)(G + j\omega C)} \quad \text{[Expression 8]}$$

$$v = \frac{\omega}{\beta} \quad \text{[Expression 9]}$$

Herein, v is the propagation velocity of the signal.

In Expression 7, a non-distortion signal propagation is realized if the phase constant α is independent of the frequency and the phase difference β is in proportion to the operating frequency of the signal. In other words, the characteristic impedance of the line of the conductor needs to be a positive real number. In order for the impedance to be a positive real number, the phase angles need to be equal to each other.

$$arg(R+j\omega L)=arg(G+j\omega C) \quad \text{[Expression 10]}$$

Thus, when $$\frac{R}{G} = \frac{L}{C}, \quad \text{[Expression 11]}$$

$$\alpha = \frac{R}{\sqrt{L/C}} = \frac{R}{Zo}, \text{ and} \quad \text{[Expression 12]}$$

$$v = \frac{\omega}{\beta} = \frac{1}{\sqrt{LC}} = \frac{c_0}{\sqrt{\varepsilon_r}}. \quad \text{[Expression 13]}$$

Herein, $c_o$ is the velocity of light in vacuum, i.e., $$c_0 = 3 \times 10^8 \text{ [m/s]}. \quad \text{[Expression 14]}$$

Herein, ω is the angular frequency (2πf:f is the frequency [Hz] of the signal), and ∈r is the dielectric constant of the dielectric surrounding the transmission line.

The conditions for the non-distortion signal propagation (the non-distortion conditions) were mathematically demonstrated by Heaviside in 1888.

In the present embodiment, under a condition where the telegraphic equation is used (it is treated as the distributed constant where the wavelength of the signal transmitted is close to the length of the line of the conductor), resistive elements Rg having a resistance value being the inverse of the conductance value satisfying Expression 10 are provided between the conductor 1A (the first conductor) and a conductor 1B (the second conductor) along the return path, over the line length over which the conductor 1A extends. Herein, it is assumed that the conductor 1B is an ideal plane with respect to the conductor 1A. Where the conductor 1B uses substantially the same conductor material as the conductor 1A, with a signal in antiphase with the signal being transmitted along the line o the conductor 1B, the system is a differential transmission system, in which case the impedance is defined to be 2Zo. Since the potential of the conductor 1B is externally fixed, the radiation direction of the electromagnetic wave becomes more straight, thereby propagating the signal at a higher speed. By making the potential of the conductor 1B to be antiphase with the transmission signal, the system will be more robust against the common mode noise from other conductors. The interval between the resistive elements Rg is determined as follows, based on the line length of the conductor and the highest operating frequency of the transmission signal.

Herein, the operating frequency f [Hz] of the transmission signal has the following relationship with the data transfer rate d [bps/wire] per transmission signal [wire].

$$2f [Hz] = d [bps/wire] \quad \text{[Expression 15]}$$

Where f [Hz] is the operating frequency of the transmission signal, the wavelength of the signal propagating through the transmission line 1A1 is expressed as follows.

$$\lambda = \frac{v}{f} \quad \text{[Expression 16]}$$

Herein, $$v = \frac{c_o}{\sqrt{\varepsilon_r \mu_r}}, \quad \text{[Expression 17]}$$

where $\mu_r$ is the magnetic permeability.

Since a signal resonates with the line length of the conductor being $\lambda/4$, the resistive elements Rg need to be provided along the transmission line at an interval within $\lambda/4$ in order to eliminate the influence of the source of the electromagnetic wave noise (there is no problem if the transmission power is small). Of course, the smaller the interval between the inserted resistive elements Rg, the more ideal is the non-distortion signal voltage waveform produced.

Specifically, the number of resistive elements Rg to be inserted can be expressed as follows.

$$N \geq \frac{\text{Transmission line length}}{\text{Signal wavelength} \times \left(\frac{1}{4}\right)} \quad \text{[Expression 18]}$$

$$= \frac{4 \times z}{\lambda}$$

$$= \frac{4 \times f \times z}{v}$$

$$= \frac{4 \times f \times z \times \sqrt{\varepsilon_r \mu_r}}{v_0}$$

The value of each resistive element Rg can be expressed as follows.

$$R_g = \frac{L}{C \times R} \times N \quad \text{[Expression 19]}$$

For example, where dielectric constant ∈r=4 and $\mu$r=1, the interval between the resistive elements Rg along the transmission line 1A1 should be 3.75 [mm] or less when the maximum frequency of the transmission signal is 10 [GHz]. Where a silicon (Si) substrate is used, the resistive element Rg may be a MOSFET having a higher resistivity than a conductor, a polysilicon or a diffusion layer region, whereby it is possible to reduce the area. With an organic semiconductor, an element having a higher resistivity than a conductor or an organic FET may be used, whereby it is possible to reduce the area. Thus, with the transmission line 1A1 along which the resistive elements Rg of the present embodiment are arranged so as to satisfy Expressions 18 and 19, it is possible to reduce the distortion of the signal waveform of the transmission line 1A1. Providing resistive elements at regular intervals along the transmission line, as in the present embodiment, has not been proposed before in the art. In the prior art, a loaded transmission line is a cable such as a thick copper wire, and the resistance of a copper wire per unit length is very small, whereby resistive elements cannot be inserted along such a transmission line. The reason why there were no transmission lines using resistive elements satisfying Expressions 18 and 19 will now be discussed from a historical point of view by way of specific examples.

In the past, there have been arrangements where some elements are provided at different points along the transmission line, which are called "loaded cables". In 1894, M. Pupin proposed an arrangement where inductors are inserted at regular intervals in order to reduce the attenuation constant. However, this was not effective as it rather produced noise with signal waveforms whose frequency is several hundreds of kHz or higher. Thereafter, Matsumae, et al., proposed an unloaded cable, and then a coaxial cable was proposed. At present, most transmission lines are coaxial cables, and transmission lines having the same structure have been used on boards, or the like, so as to realize an impedance matching with coaxial cables.

Now consider whether the transmission line 1A1 of the present embodiment can be realized with a copper wire coaxial cable. Where the impedance of the coaxial cable is Z=50 [ohm] and the resistance thereof is R=0.1 [ohm/m], the inverse of the conductance for a length of 1 [m] is as follows, based on Expression 11.

$$1/G = 2500/0.1 = 25000 \text{ [ohm/m]} \quad \text{[Expression 20]}$$

If the resistive element Rg of the inverse of the conductance is inserted for every 2.5 [mm], the resistance value of each resistor is as follows, based on Expressions 18 and 19.

$$25000 \times 400 = 10000000 \text{ [ohm]} \quad \text{[Expression 21]}$$

Thus, the resistance value of the inverse of the inductance value will be very large.

The conductance value, including the dielectric loss of the dielectric surrounding the conductor, is 0.18 [S/m] @ 10 GHz or less for a board FR4 substrate, and 0.1 [S/m] @ 10 GHz or less for a semiconductor such as $SiO_2$. Therefore, only the dielectric loss accounted for 1/G=2222 [ohm] to 4000 [ohm] with a 2.5 [mm] wire length, and it was not practically possible, due to the large amount of leak current, to insert more insulative resistors of 10000000 [ohm].

In contrast, the present invention is directed to a transmission line where the transmission signal is transferred along a very thin conductor line. There is a 100-fold or more difference per unit length between the wire resistance of a coaxial cable and that of the present integrated circuit apparatus. For example, where the resistance of 10 mm of the conductor 1A is 50 ohm, the resistance value of the resistive element Rg inserted along the transmission line 1A1 is as follows;

$$1/G = 2500/50 = 50 \text{ [ohm]} \quad \text{[Expression 22]}$$

Where the maximum frequency of the transmission signal is 5 [GHz] and the resistive elements Rg are arranged at intervals of 2.5 mm, the resistance value of each resistive element Rg is as follows.

$$50 \times (\text{Line length}/(\text{Resistive element interval})+1)) = 50 \times (10/2.5+1) = 250 \text{ [ohm]} \quad \text{[Expression 23]}$$

This resistance value is within an applicable range of resistance value, even in view of the leak current due to the dielectric loss mentioned above. Therefore, the resistive element Rg takes a reasonable value, whereby the present arrangement can be realized.

Then, the advantage of the present arrangement of the transmission line that the transmission signal can be transmitted with no distortion over a wide frequency band will be discussed, in comparison with the prior art. In the prior art, where ratio between the resistance value R [ohm/m] per unit length of the line of the conductor and the inductance value L [H/m] multiplied by the angular frequency ω:

$$R : \omega L \qquad \text{[Expression 24]}$$

is about 1:100, the attenuation constant and the phase difference constant are approximated based on the telegraphic equations above (Expressions 5 and 6), and the attenuation constant α and the phase difference constant β can be expressed as follows.

Based on ωL≫R and G≈0, $$\alpha = \frac{R}{2\sqrt{L/C}} = \frac{R}{2Z_o} \qquad \text{[Expression 25]}$$

$$v = \frac{\omega}{\beta} = \frac{1}{\sqrt{LC}} = \frac{c_0}{\sqrt{\varepsilon_r}}. \qquad \text{[Expression 26]}$$

With the conventional method using the terminating resistor, the impedance Z of the conductor is expressed as follows:

$$Z = \sqrt{\frac{L}{C}} \qquad \text{[Expression 27]}$$

within the frequency band where the resistance of the conductor is negligible, and since the terminating resistor takes a value of Expression 27, the reflection coefficient can be zero.

For a frequency band of the transmission signal as shown above, there are no problems for the production and the reception of more reliable waveforms. However, for a frequency band of the transmission signal such that the ratio of Expression 24 is in the range of about 1:0.01 to about 1:10, the attenuation constant α and the phase constant β can be expressed as follows, as being approximated based on the telegraphic equations (Expressions 5 and 6).

Based on ωL≪R and G≈0, $$\alpha = \sqrt{\frac{\omega RC}{2}} \qquad \text{[Expression 28]}$$

$$v = \frac{\omega}{\beta} = \sqrt{\frac{2\omega}{RC}} \qquad \text{[Expression 29]}$$

Where the conventional terminating resistor is used with the resistance value of the terminating resistor being set to the same value as the impedance Z of the conductor (Expression 27), the attenuation constant changes due to variations in the angular frequency, thereby disturbing the waveform in the vicinity of the receiver circuit. In order to solve this problem, the preemphasis technique, the equalizer technique, etc., need to be added to each of the transmitter circuit and the receiver circuit in the prior art, thereby increasing the area and the power consumption of each circuit.

Figure 34:
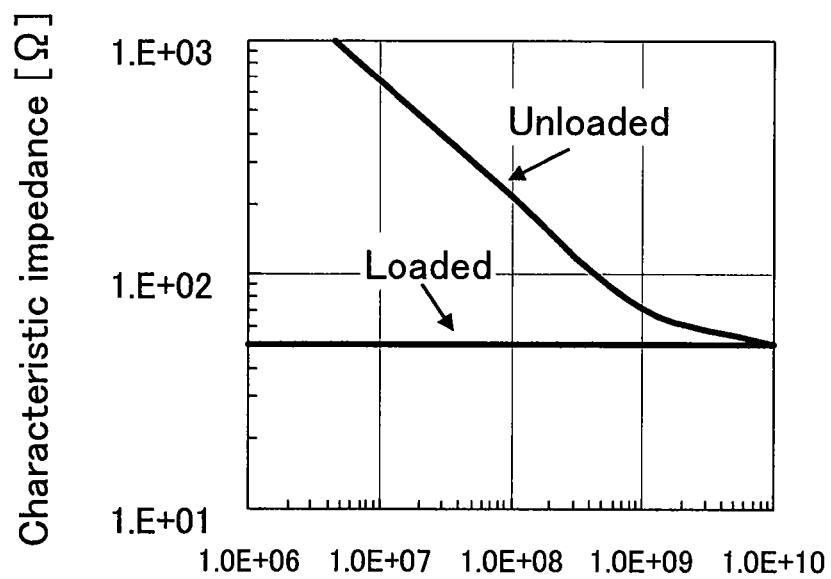
FIG. 34 is a characteristic impedance graph, with and without the loading of the present invention.

In contrast, with the transmission line 1A1 of the present embodiment, the attenuation constant, the phase constant and the characteristic impedance do not change irrespective of the frequency band of the transmission signal, as can be seen from Expressions 11, 12 and 13. FIG. 34 is a graph showing cases with and without the loading of the present invention. The horizontal axis represents the frequency, and the vertical axis represents the characteristic impedance. As can be seen from FIG. 34, the characteristic impedance is independent of the frequency in the present embodiment. Therefore, it is no longer necessary, as in the prior art, to provide the transmitter circuit with the complicated preemphasis technique or the RZ technique and the receiver circuit with the equalizer technique, whereby it is possible to significantly reduce the area and the power consumption of the transmitter circuit and the receiver circuit.

In the description above, the arrangement is formulated with one end of the resistive element Rg fixed along the return path for the sake of simplicity. However, it does not need to be connected to the return path, and substantially the same effect can be exerted also when it is connected to another conductor whose voltage is externally fixed.

Figure 5:
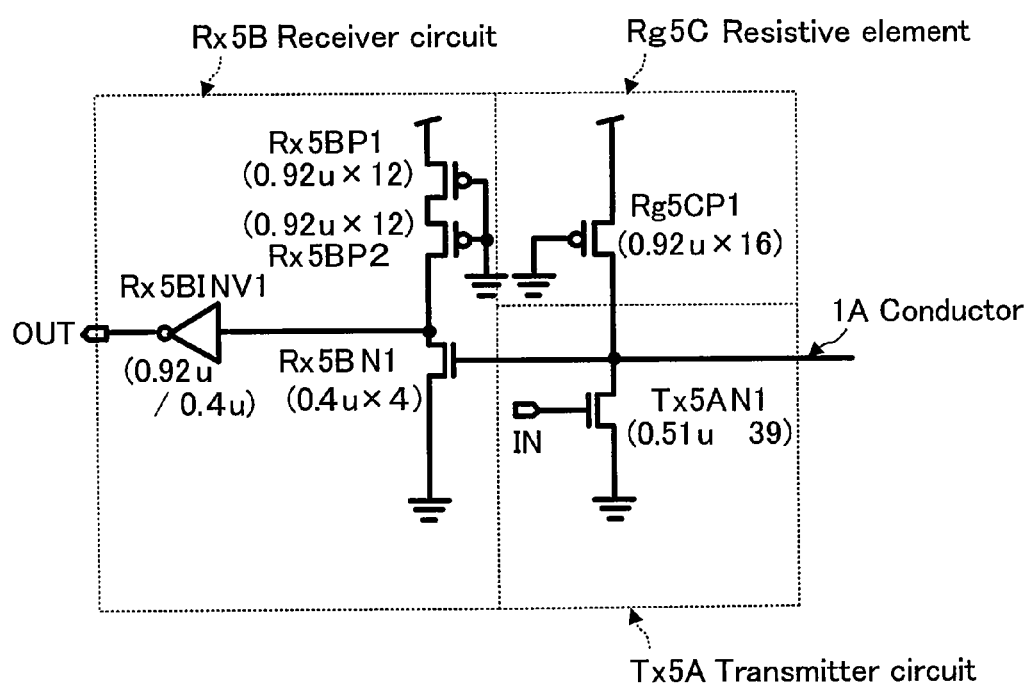
FIG. 5 shows a transmitter circuit, a receiver circuit and a resistor circuit of the transmission line of the electronic device.

FIG. 5 shows a circuit diagram of the resistive elements Rg, the transmitter circuit and the receiver circuit, such that Expressions 17 and 18 above are satisfied, using CMOS transistors whose gate length is 45 nm.

The transmitter circuit is denoted as Tx5A, and a signal to be transmitted is input to the gate of an NMOS transistor Tx5AN1 of the transmitter circuit Tx5A, wherein the drain of the NMOS transistor Tx5AN1 is connected to the conductor 1A of the transmission line 1A1. The gate length of the MOS transistor is 45 nm, and the gate width thereof is 0.51 μm times 39.

The receiver circuit is denoted as Rx5B, and the conductor 1A of the transmission line 1A1 is connected to the gate of an NMOS transistor Rx5BN1 of the receiver circuit Rx5B, wherein the drain of the NMOS transistor Rx5BN1 is connected to the input terminal of an inverter Rx5BINV1 and the drain of a PMOS transistor Rx5BP2. The source of the PMOS transistor Rx5BP2 is connected to the drain of a PMOS transistor Rx5BP1, and the gates of the PMOS transistors Rx5BP2 and Rx5BP1 are grounded via a node Rx5BPG. The gate length of the NMOS transistor Rx5BN1 is 45 nm, and the gate width thereof is 0.4 μm times 4. The gate length of the PMOS transistors Rx5BP2 and Rx5BP1 is 45 nm, and the gate width thereof is 0.92 μm times 12. The size of the inverter Rx5BINV1 is such that the gate length is 45 nm for both MOS transistors, with the gate width of the PMOS transistor being 0.92 μm and that of the NMOS transistor being 0.4 μm.

The resistive element is denoted as Rg5C, and the gate of a PMOS transistor Rg5CP1 is grounded and the drain thereof is connected to the conductor 1A of the transmission line 1A1, wherein the resistance is determined based on the relationship between Vds and Ids with the voltage Vgs being constant, and it operates in the linear region. The gate length of the PMOS transistor Rg5CP1 is 45 nm, and the gate width thereof is 0.92 μm times 16.

When a layout cell is produced where the transistor pitch is 0.18 μm, the upper limit of the vertical length parallel to the gate width of the PMOS region is 1 μm, and the upper limit of the vertical length parallel to the gate width of the NMOS region is 0.6 μm, with the horizontal dimension being the transistor pitch number plus two, the horizontal length of the receiver circuit Rx5B is 0.18 μm×(39+2) and the area of the transmitter circuit Tx5A is as follows.

$$0.18 \text{ μm} \times (39+2) \times 0.6 \text{ μm} = 4.4 \text{ [μm}^2\text{]} \qquad (25)$$

In a similar manner, the area of the receiver circuit Rx5B can be obtained as follows.

$$0.18 \mu m \times (24 + 1 + 2) \times 1.0 \mu m + \quad (26)$$
$$0.18 \mu m \times (4 + 1 + 2) \times 0.6 \mu m = 5.6 [\mu m^2]$$

The transmitter circuit, the receiver circuit and the resistor circuit each occupy one of the MOS regions. Therefore, if they are combined together, it is no longer necessary to separately arrange the transmitter/receiver circuits and the resistive elements, thereby reducing the layout overhead and realizing a reduction in the area.

The quantified values of these effects can easily be determined by referring to past articles on the preemphasis circuit area and the equalizer area, and making a comparison with a simple inverter or a simple circuit that operates on one channel. For example, past articles directed to a transmitter circuit with a preemphasis function include Non-Patent Document 3 ("A 3-Gb/s/ch Transceiver for 10-mm Uninterrupted RC-Limited Global On-Chip Interconnects", IEEE Journal of Solid-State Circuits, vol. 41, no. 1, p. 297, FIGS. 9 and 11, January 2006).

Figure 10:
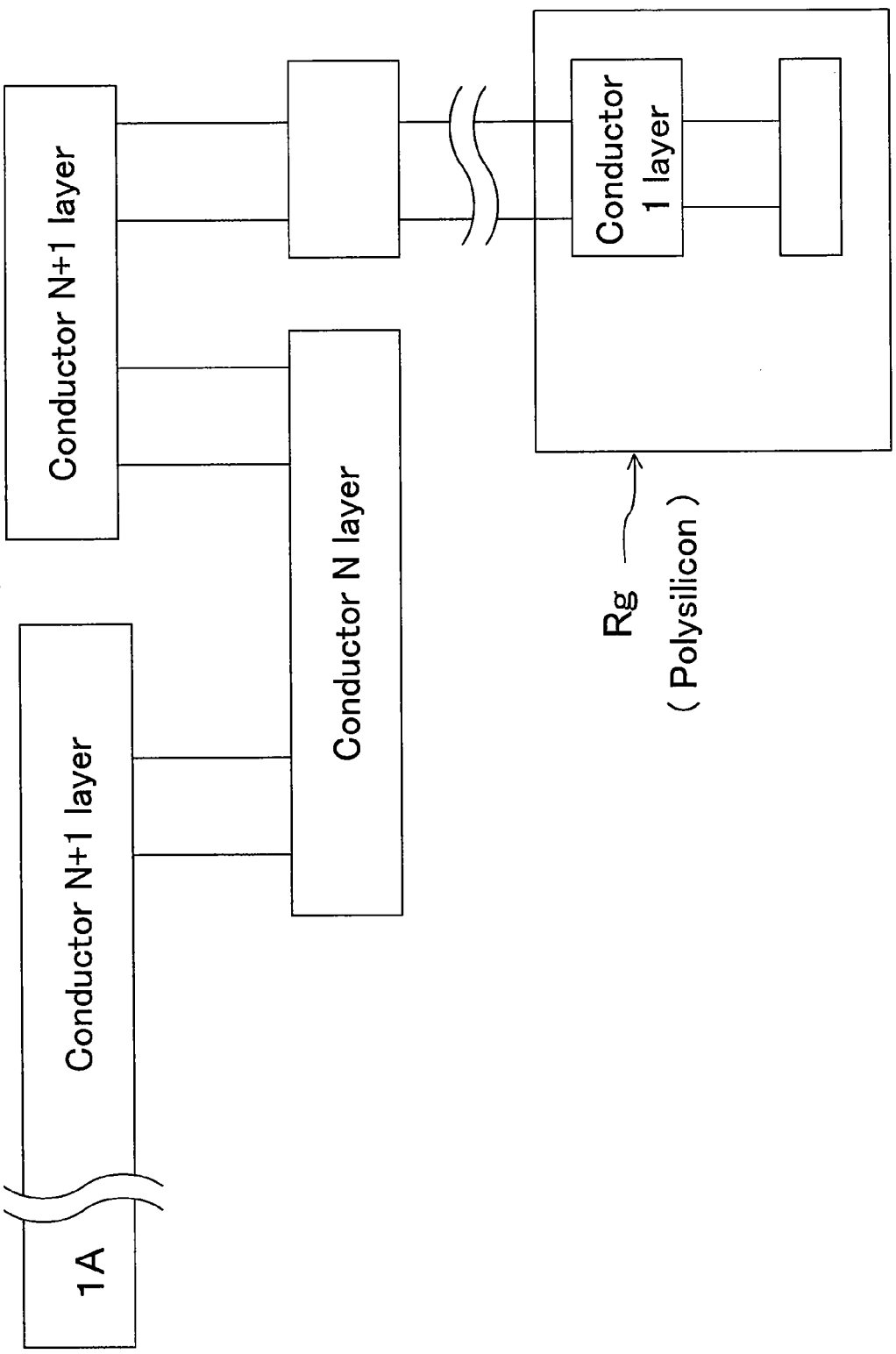
FIG. 10 is a physical arrangement diagram showing the cross section of the transmission line.

Transmitter circuits having a function such as RZ include Non-Patent Document 4 ("Pulsed Current-Mode Signaling for Nearly Speed-of-Light Intrachip Communication", IEEE Journal of Solid-State Circuits, vol. 41, no. 4, p. 772, FIG. 10, April 2006).

Figure 16:
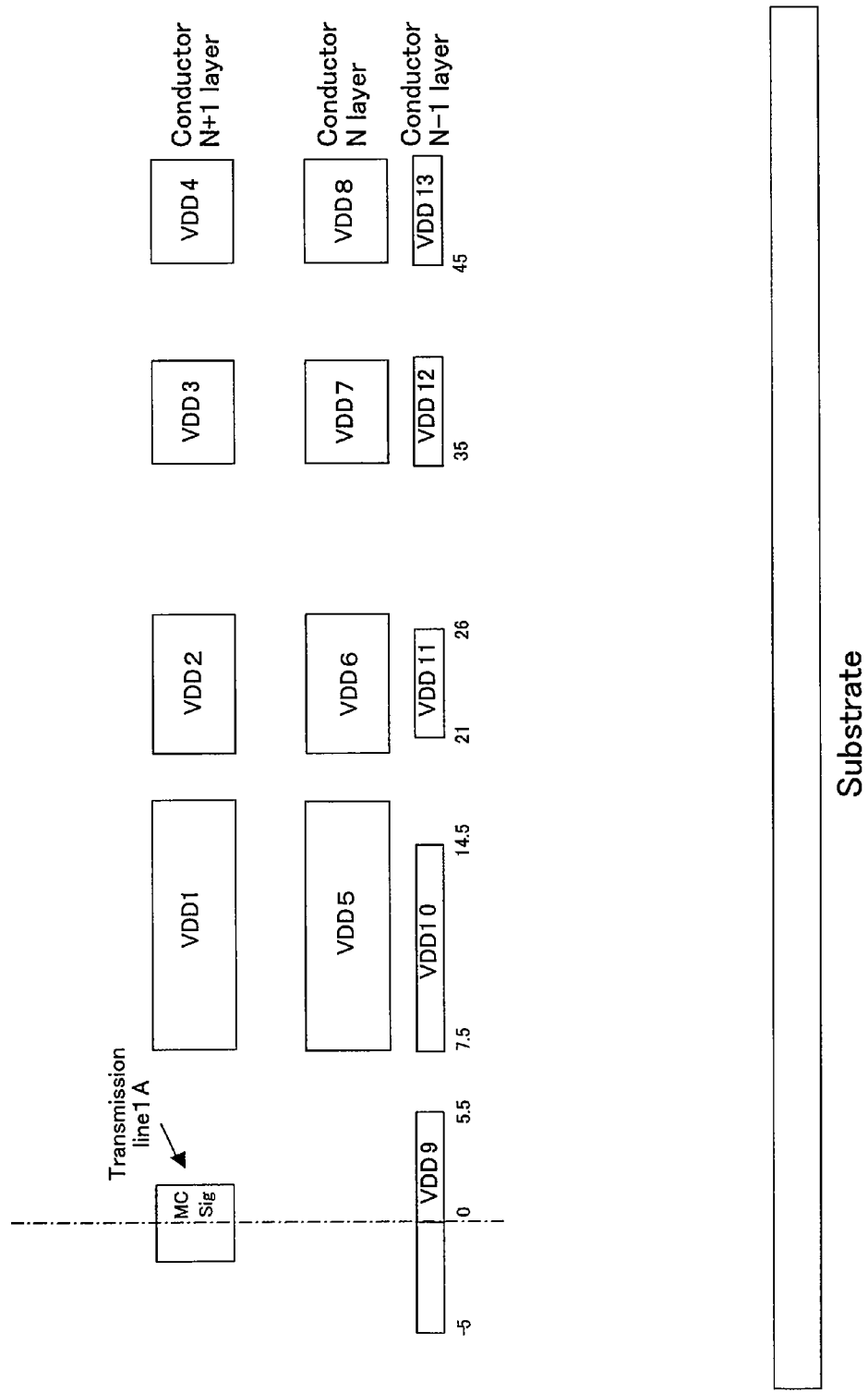
FIG. 16 is a cross-sectional view of the transmission line in an integrated circuit of the electronic device.

For receiver circuits having an equalizer function, see Non-Patent Document 5 ("A Fully Integrated 10 Gbp/s Receiver with Adaptive Optical Dispersion Equalizer in 0.13 μm CMOS", IEEE Journal of Solid-State Circuits, vol. 42, no. 4, p. 872, Equalizer in FIG. 13, April 2007) and Non-Patent Document 6 ("A 5 mW 6 Gbp/s Quarter-Rate Sampling Receiver with a 2-Tap DFE Using Soft Decisions", IEEE Journal of Solid-State Circuits, vol. 42, no. 4, p. 881, 2-Tap DFE in FIG. 16, April 2007).

An advantage of the non-distortion transmission line is that a plurality of receiver circuits can receive appropriate non-distortion waveforms, irrespective of the positions along the line of the conductor where the transmitter/receiver circuits are provided and irrespective of the positions from which signals are transmitted.

Figure 2A:
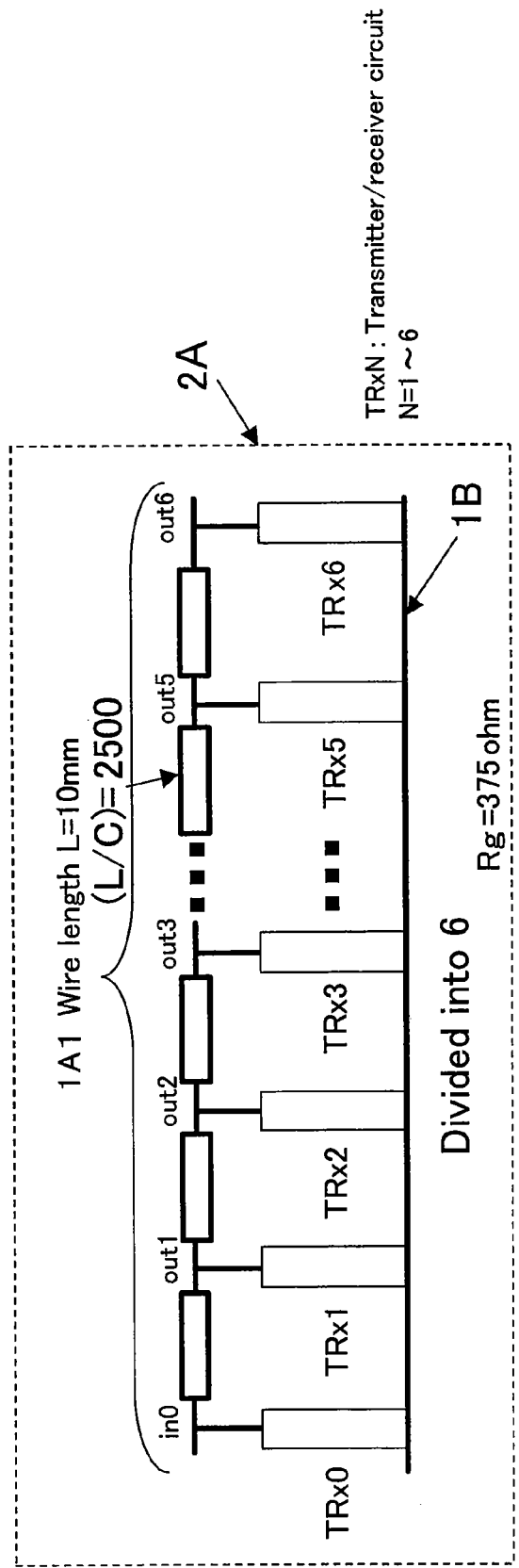
FIG. 2A shows an arrangement of transmitter/receiver circuits and resistors of the transmission line.

FIG. 2A shows the transmission line 1A1 in an integrated circuit apparatus, and an arrangement of the transmitter/receiver circuits and the resistive elements of the present embodiment. In the figure, 2A denotes an integrated circuit apparatus. The wire length of the conductor 1A of the transmission line 1A1 is 10 mm, and L/C=2500. The conductor 1B has a plane structure.

Figure 2B:
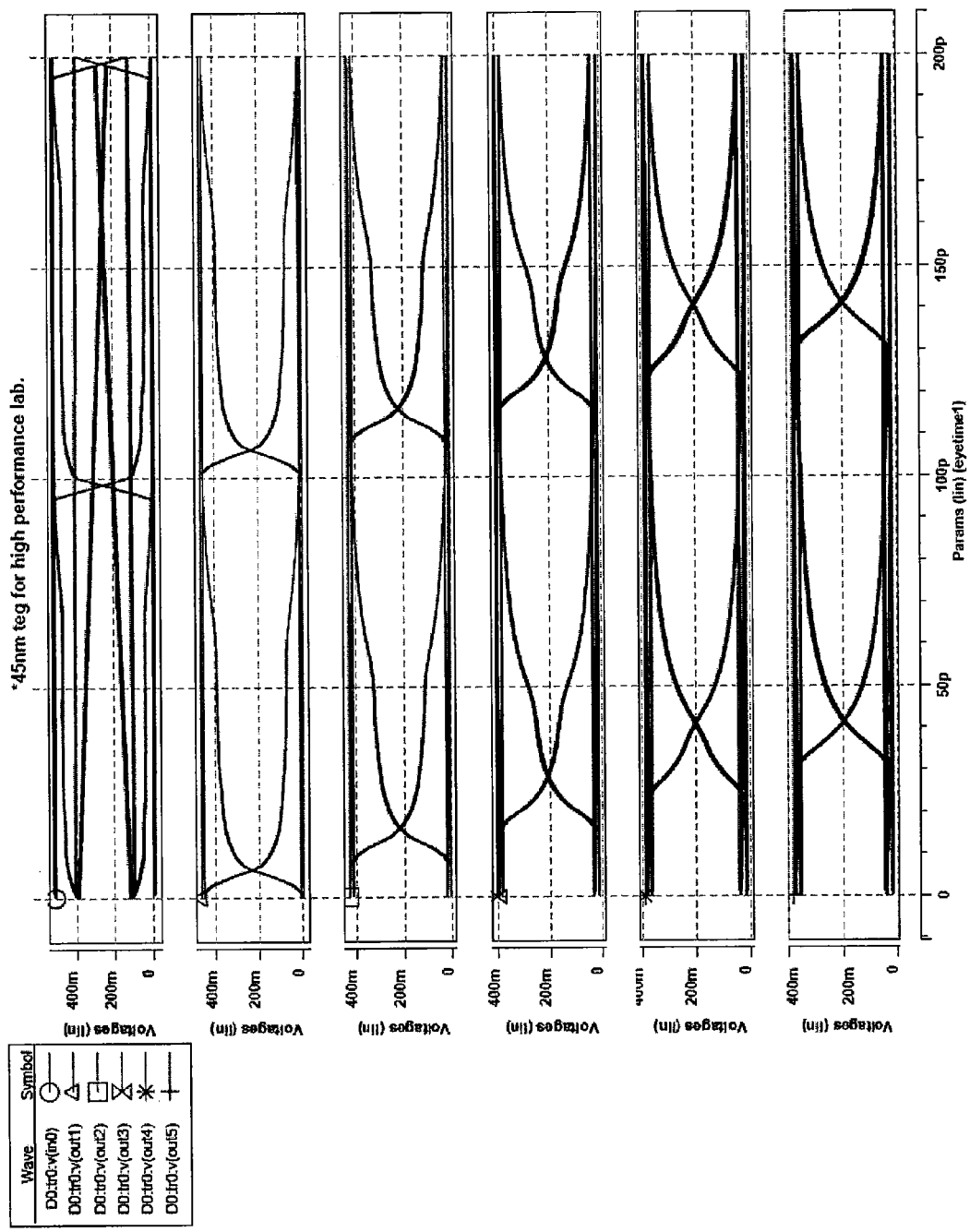
FIG. 2B shows simulated waveforms obtained for a case where a pseudorandom bit string is transmitted from TRX0 in the circuit of FIG. 2A.
Figure 2C:
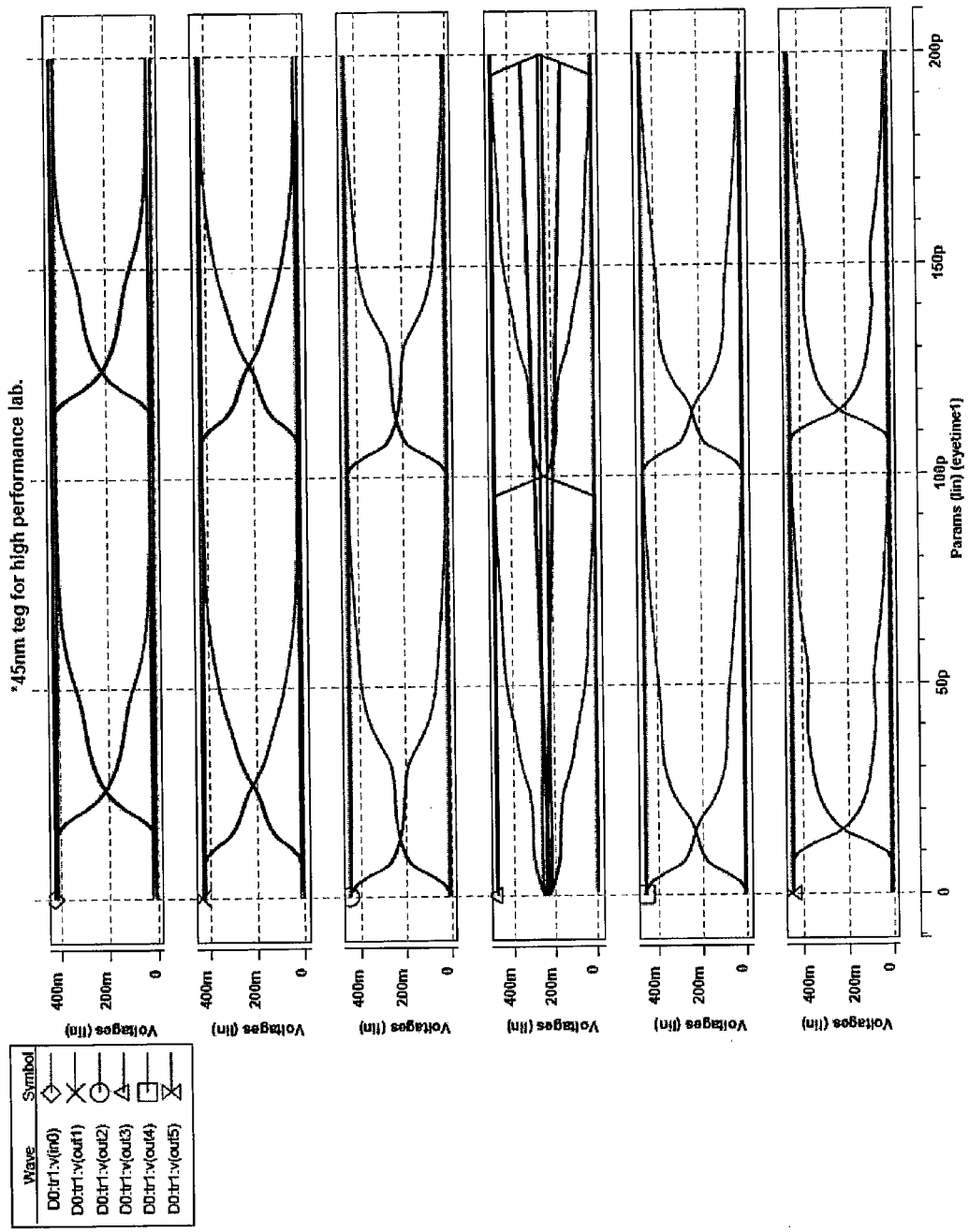
FIG. 2C shows simulated waveforms obtained for a case where a pseudorandom bit string is transmitted from TRX3 in the circuit of FIG. 2A.
Figure 2D:
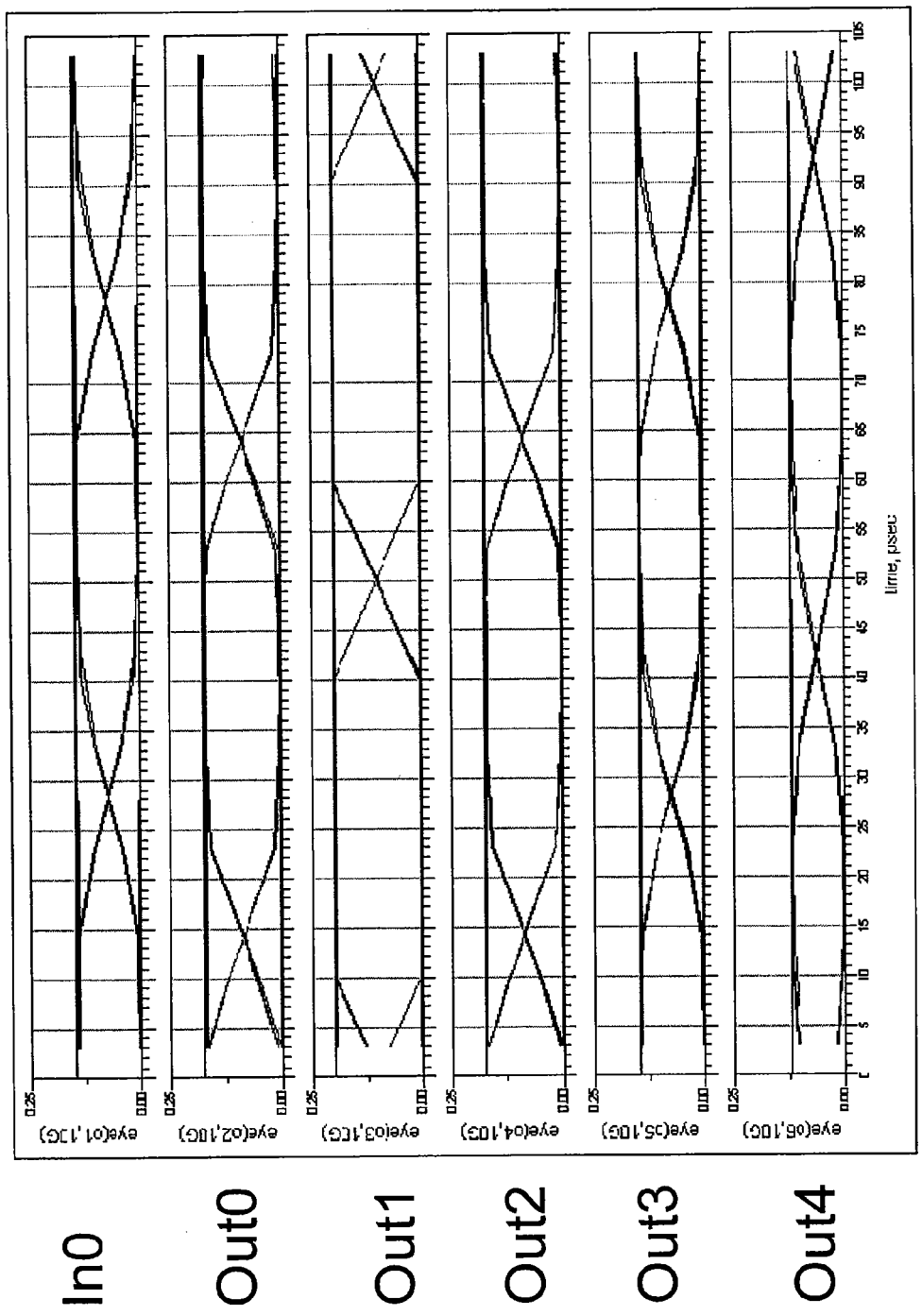
FIG. 2D shows the eyepattern at each node in FIG. 2A, where a terminating resistor (50Ω) is inserted between the node in0 and a conductor 1B and between the node out6 and the conductor 1B.

In the figure, TRxN (N is an integer of 1 to 6) denotes a transmitter circuit, a receiver circuit or the resistive element Rg (Rg=375 ohm) inserted between the conductor 1A and the conductor 1B. FIG. 2B shows the eyepattern of the signal waveform received at each receiving terminal (the nodes in0, out1, out2, out3, out4, out5 and out6 along the transmission line 1A1 in FIG. 2A) as simulated by transition analysis when a $2^{11-1}$-bit PRBS (Pseudorandom Binary (Bit) Sequence: pseudorandom bit string) is transmitted from TRX0, and FIG. 2C shows the same when a $2^{11-1}$-bit PRBS signal pattern is transmitted from TRX3. It can be seen that an effective eyepattern is ensured with no distortion at every receiving terminal. Thus, it is not necessary to provide a plurality of transmission lines with a 1:1 transmitter-receiver circuit ratio, and it is possible to realize a reduction in the area. FIG. 2D shows the eyepattern at each node when a terminating resistor (50Ω) is inserted between the node in0 and the conductor 1B and between the node out6 and the conductor 1B in the configuration of FIG. 2A. As can be seen from FIG. 2D, the signal waveform at any node has a sharper rise than the eyepattern of FIG. 2C. Thus, by further inserting a terminating resistor having about the same impedance as the characteristic impedance of the conductor 1A at both ends of the conductor 1A and the conductor 1B, the reflection of the signal waveform is suppressed at the ends of the conductors. Therefore, there is no interference between the traveling wave and the reflected wave, thereby even sharpening the rise of the waveform and thus realizing a signal transfer at a higher speed.

Figure 3A:
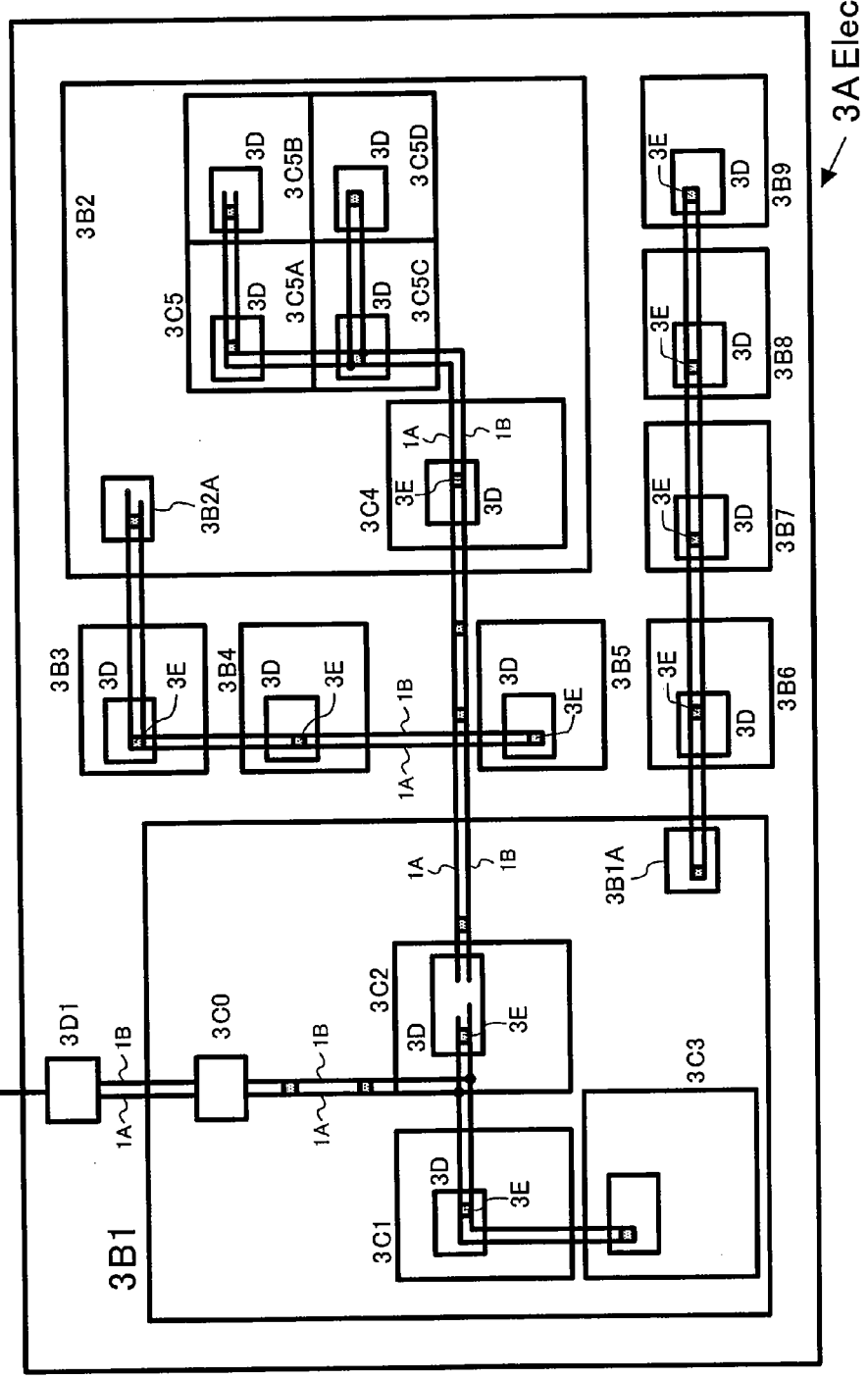
FIG. 3A is a schematic diagram showing a configuration of an electronic device including the transmission line.
Figure 3B:
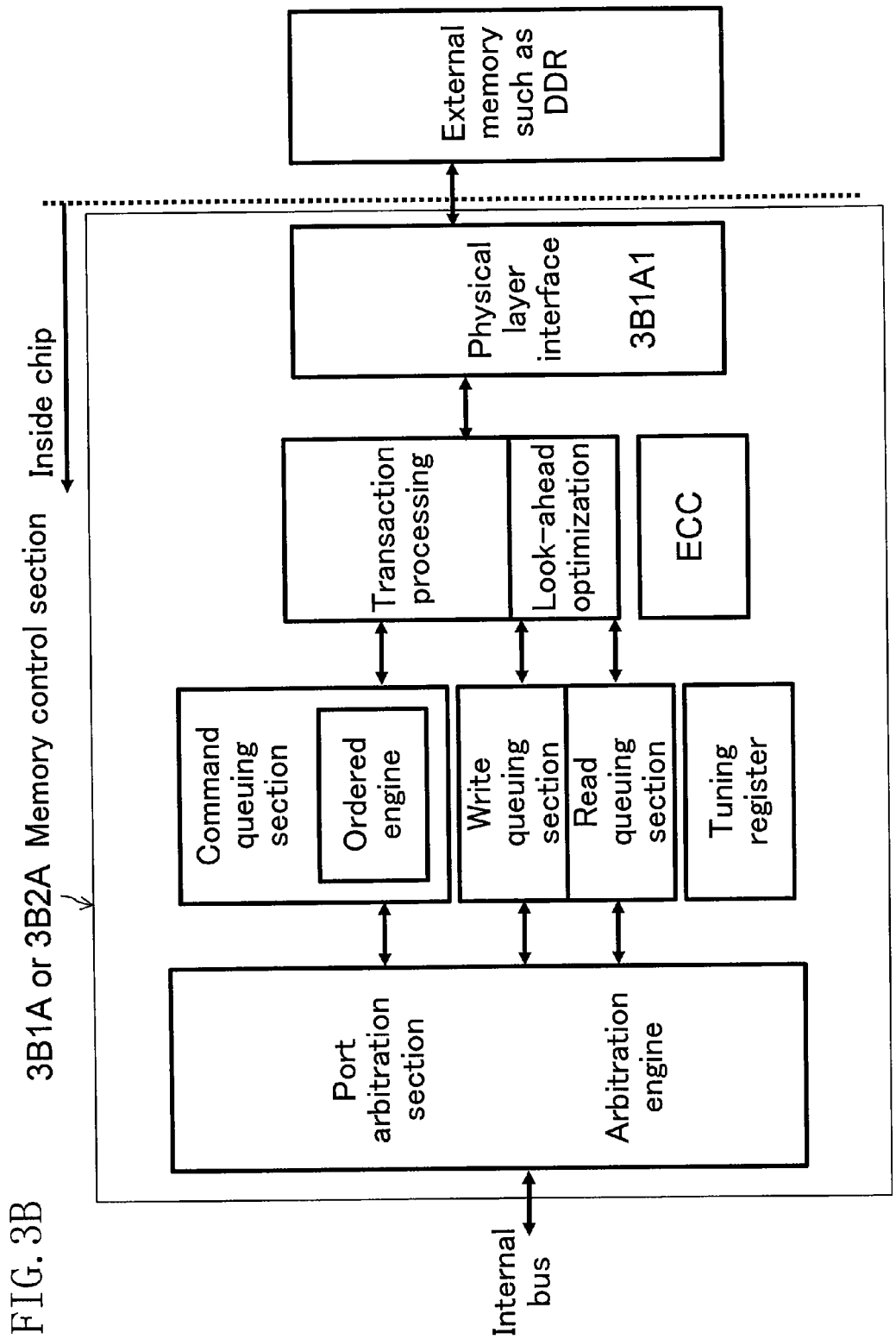
FIG. 3B shows a function of the interface of a memory control section 3B1A or 3B2A.

FIG. 3A is an example where the method of the transmission line 1A1 of the present embodiment is used for the entire electronic device. In the figure, 3A denotes the entire electronic device, and 3B denotes an integrated circuit (an IC chip). The integrated circuit 3B1 is a heterogeneous multi-core processor (cores 3C1, 3C2 and 3C3). The integrated circuit 3B2 is also a heterogeneous multi-core processor (cores 3C4 and 3C5), wherein the core 3C5 is a reconfigurable core including PEs (processing elements) 3C5A to 3C5D having the same logic circuit. Reference numerals 3B3 to 3B9 denote memory ICs, each including a transmitter/receiver circuit 3D, a resistive element 3E, and a memory. Reference numerals 3B1A and 3B2A denote interface portions between the memories 3B3 to 3B9 and the multi-core processors 3B1 and 3B2, each being a core called a memory control section. FIG. 3B shows an interface function of the memory control sections 3B1A and 3B2A. Referring to FIG. 3B, data and commands (addresses, enable signals, etc.) are exchanged via the memories 3B3 to 3B9 and a physical layer interface 3B1A1. Between the physical layer interface 3B1A1 and the internal bus of the multi-core processors 3B1 and 3B2, the sequence of data receptions and data transmissions from/to an external memory are controlled, in view of the power consumption and the transfer efficiency, via a transaction processing section, a command queuing section, a port arbitration section, a write queuing section, a read queuing section, etc., as indicated by arrows in FIG. 3B. In order to interface between integrated circuits and between logic circuits in the core of an integrated circuit, the conductors 1A and 1B are connected to the transmitter/receiver circuits 3D with the resistive elements 3E between the conductors 1A and 1B. A wireless signal is transmitted/received by a transmitter/receiver circuit 3D1 via an antenna. There is no specifications as to where the memory ICs 3B3 to 3B9 are provided along the transmission line. If there is no transmitter/receiver circuit with a resistive element within λ/4, the resistive element 3E is provided within each λ/4 stretch, as with the transmission line extending between the integrated circuit 3B1 and 3B2. Where the dielectric constant of the dielectric substance surrounding the transmission line between the integrated circuits is different from that within an integrated circuit, the resistive element 3E is provided within each λ/4 stretch according to the dielectric constant. Such a structure has an advantage that the transmission line, serving as the interface between the inside and the outside of an integrated circuit can be connected directly, as opposed to the prior art where the connection to an integrated circuit (IC chip) was made via an IO circuit (including transistor elements such as a PAD (including an area PAD), an ESD protection, a driver circuit) serving as an interface between the outside and the inside of the integrated circuit. Thus, the I/O circuit is no longer necessary, and signals can be transmitted at higher rates. In addition, it is possible to reduce the total area of the electronic device and the area of the integrated circuit, and thus to reduce the parasitic capacitance, thereby reducing the power consumption. With high-speed transmission, it is possible to reduce the memory cores within the integrated circuit. Therefore, it is also possible to reduce the power consumption including the wasteful leak current at a core of a lower activation rate such as a memory. It is preferred that a resistive element is provided at a position where a single conductor line is branched into two. This improves the straightness of the electromagnetic wave propagation from the point of divergence to each branch line, thereby maintaining the high speed of signal transfer.

While the conductor 1A has been described above focusing on the wire connections for data and commands, a configuration as described above is advantageous also when used for the clock of the processors 3B1 and 3B2. For example, where the clock frequencies are switched from one to another for better efficiency of applications of the processors 3B1 and 3B2, it is possible, with the configuration of the present embodiment, to prevent the inter-symbol interference, whereby it is possible to transmit an effective clock from the next cycle after the frequency switching.

The transmission line method of the present embodiment is not limited to the electronic device shown in FIG. 3A, but is also applicable to a sensor such as an image sensor, a display device such as a PDP, an LCD or an organic EL, and an internal interface of an integrated circuit such as FPGA and an interface between integrated circuits.

Figure 4:
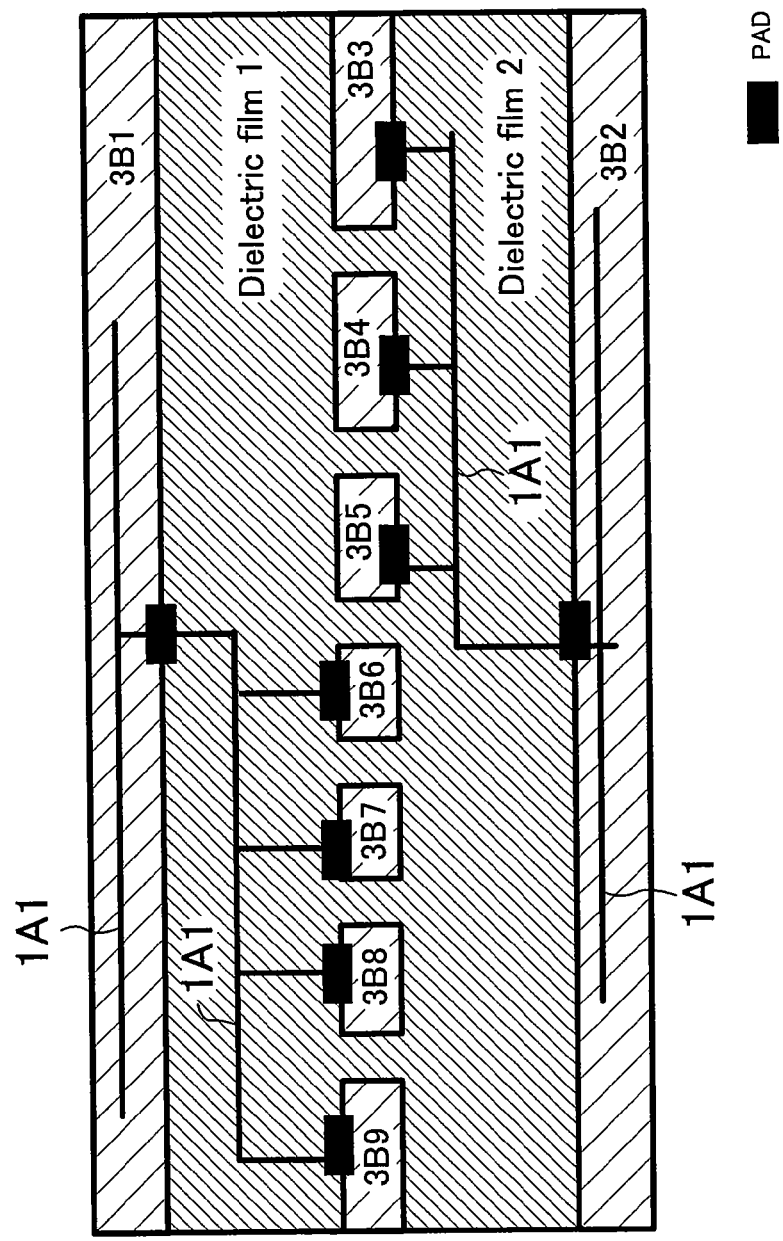
FIG. 4 is a cross-sectional view showing the transmission line of the electronic device.

FIG. 4 is a cross-sectional view of an electronic device 3A. The integrated circuit 3B1 and 3B3 to 3B9 are provided on the upper side and the lower side, respectively, of a dielectric film 1, and the transmission line 1A1 in the dielectric film 1 and the transmission line 1A1 of the integrated circuit 3B1 and 3B3 to 3B9 are connected to each other via a PAD. Similarly, the integrated circuits 3B3 to 3B9 and 3B2 are provided on the upper side and the lower side, respectively, of a dielectric film 2, and the transmission line 1A1 in the dielectric film 2 and the transmission line 1A1 of the integrated circuits 3B2 to 3B9 are connected to each other via a PAD.

In view of the production yield, the width of the PAD is preferably equal to or greater than the wire width of the conductor line of the transmission line 1A1. This reduces the probability of misalignment between chips and cracks in the conductor and dielectric materials.

Figure 9:
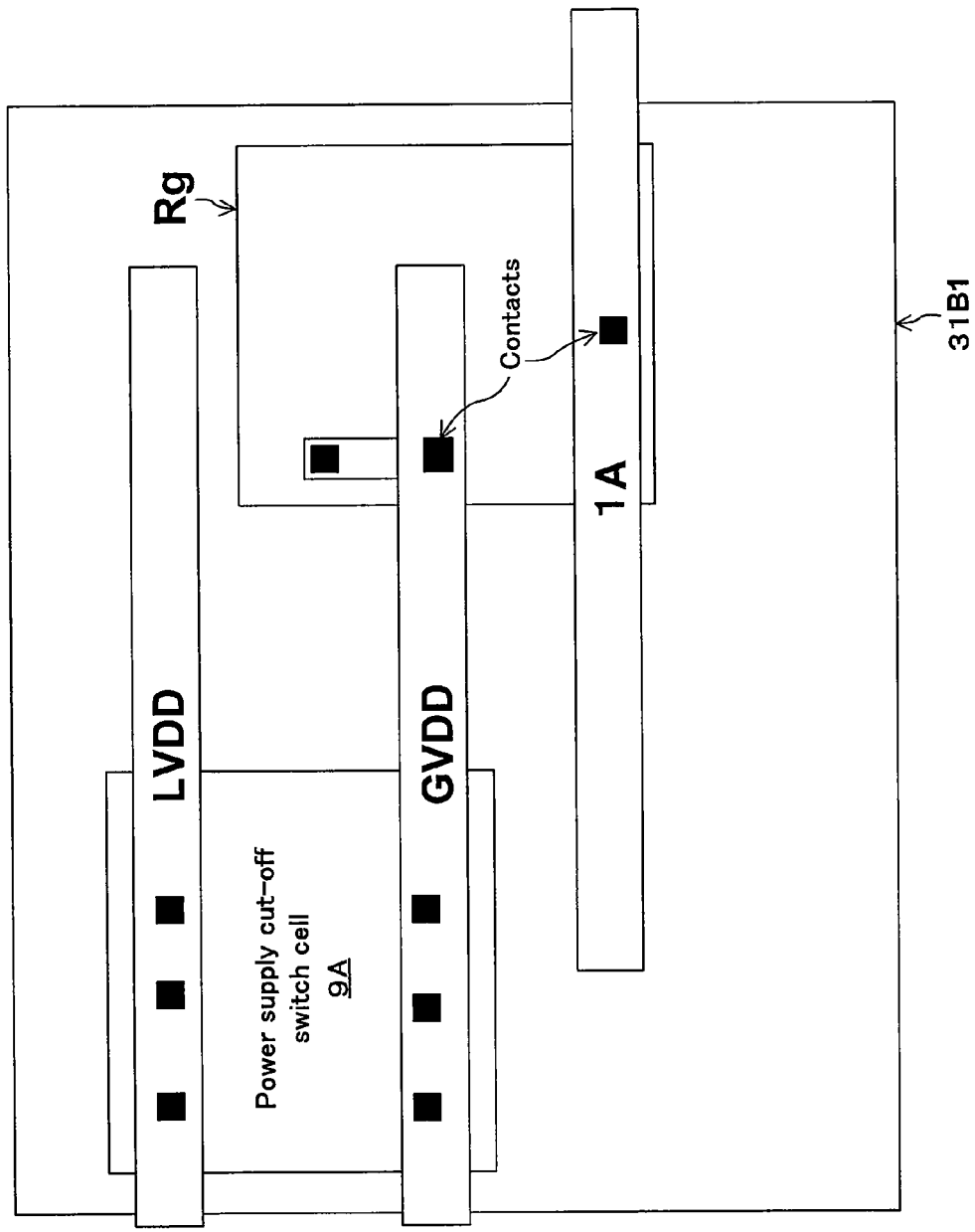
FIG. 9 is a physical arrangement diagram showing the transmission line of the electronic device.

FIG. 9 shows a physical arrangement of the transmitter/receiver circuit of a core 31B1 in the integrated circuit 3B1 as viewed from above. The figure shows the resistive element Rg of the transmission line 1A1, and a power supply cut-off switch cell 9A in the core 31B1. The power supply cut-off switch cell 9A is a switch for controlling whether or not to block the power supply line ("LVDD") being a conductor used in the core 31B1 from the power supply line GVDD being the conductor routed across the area within the integrated circuit 3B1. The power supply cut-off switch cell 9A includes a diode inserted in parallel to the switch in order to fix the potential of the power supply line LVDD and hold the data information inside the core 31B1. The power supply cut-off switch cell 9A is formed by a MOS transistor in order to stabilize the power supply voltage value of the power supply line LVDD inside the core 31B1 when it is ON, and the gate of the MOS transistor is connected also to a signal from the signal processing circuit having a function of monitoring the voltage of the power supply line LVDD and stabilizing the voltage thereof. Since the resistive element Rg connected to the conductor 1A needs to be always connected to the power supply line, whose potential is externally fixed, the resistive element Rg is not connected to the power supply line LVDD in the core 31B1 but is connected to the power supply line GVDD.

The power supply lines GVDD and LVDD may be lines extending in the vertical direction in the figure. The layer of the conductor 1A and the conductor layer of GVDD and LVDD may be the same layer or different layers.

With such a configuration, the potential of the resistive element Rg is fixed even when the core 31B1 is being blocked in the present embodiment, whereby the attenuation constant α of the transmission line including the conductor 1A and the resistive element Rg becomes a function of the frequency component of the signal being transmitted, thus reducing the signal distortion and enabling a faster and more stable signal transfer.

FIG. 10 is a cross-sectional view of the transmission line 1A1 in the integrated circuit 3B1. The transmission line 1A1 is connected to the polysilicon forming the resistive element Rg via a path extending from the conductor N+1 layer to the conductor N layer, back to the conductor N+1 and then to the conductor 1 layer being the bottom conductor layer. With the path from the transmission line 1A1 extending from one upper conductor layer to a lower conductor layer and then back to the upper conductor layer, it is possible to reduce the possibility of breaking the device in a CMP, or the like, during the manufacturing process even if the conductor of a layer of the transmission line 1A1 has a large area. Since resistors are inserted more densely as compared with a case where only the conventional terminating resistor is used, the charge of the conductor 1A is more likely to be dispersed to other conductors and to the substrate, thus significantly reducing the possibility of breaking the device.

Figure 11A:
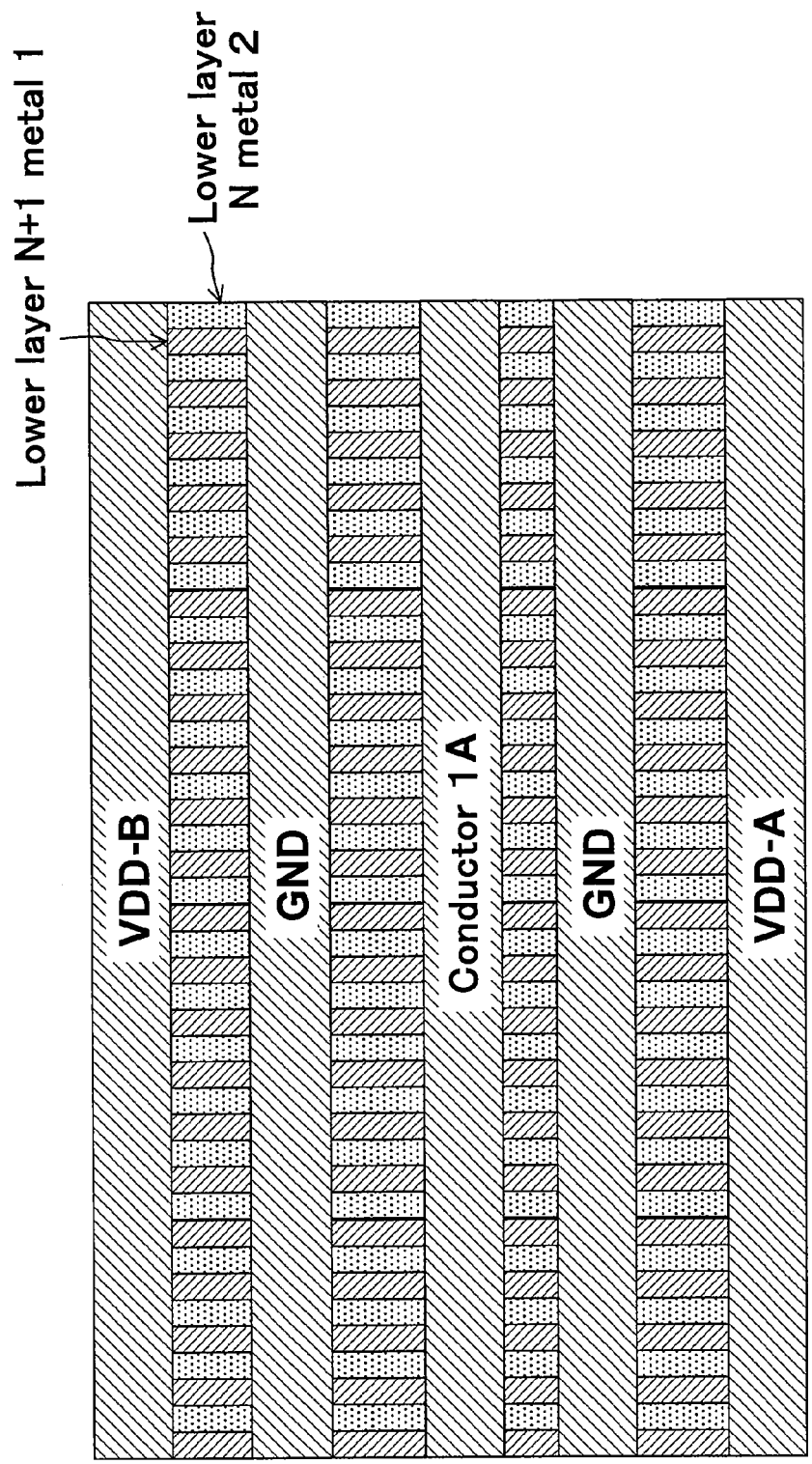
FIG. 11A is a physical arrangement diagram showing the transmission line as viewed from above.

FIG. 11A shows a physical arrangement of the transmission line 1A1 in the integrated circuit 3B1 as viewed from above (from the side opposite to the rear surface of the substrate of the integrated circuit 3B1). There are conductors denoted as "GND" on opposite sides of the conductor 1A. There are conductors denoted as "VDD-B" and "VDD-A" on the outside of the conductors GND. Since these conductors are metal conductors in the illustrated example, the term "metal" may herein be used for a conductor. Below the conductor 1A of the transmission line 1A1, there are a conductor denoted as "lower layer N metal" and another conductor denoted as "lower layer N−1 metal". The conductor layer of the lower layer N metal and that of the lower layer N−1 metal are different from each other, and they are arranged so that the silicon substrate lying further below cannot be seen from above. In other words, the arrangement is an overlapping arrangement or a flush arrangement as projected onto a plane. The conductors VDD-B and VDD-A are those whose potentials are controlled intentionally, and the conductors GND are those whose potentials are externally fixed when the integrated circuit 3B1 is operating. With such an arrangement, the main return path of the transmission line 1A1 is the GND lower layer N metal and the lower layer N−1 metal, and an intermediate substance, such as silicon, that can be a conductor or a dielectric depending on the frequency is not used as the return path, whereby the transmission signal can always be transmitted stably via the transmission line 1A1.

If there is a conductor that is long in the horizontal direction between the conductor 1A of the transmission line 1A1, the lower layer N metal and the lower layer N−1 metal, and if the conductor also has a fixed potential, the transmission of the electromagnetic waves becomes more effective, allowing for a more stable transmission.

Figure 11B:
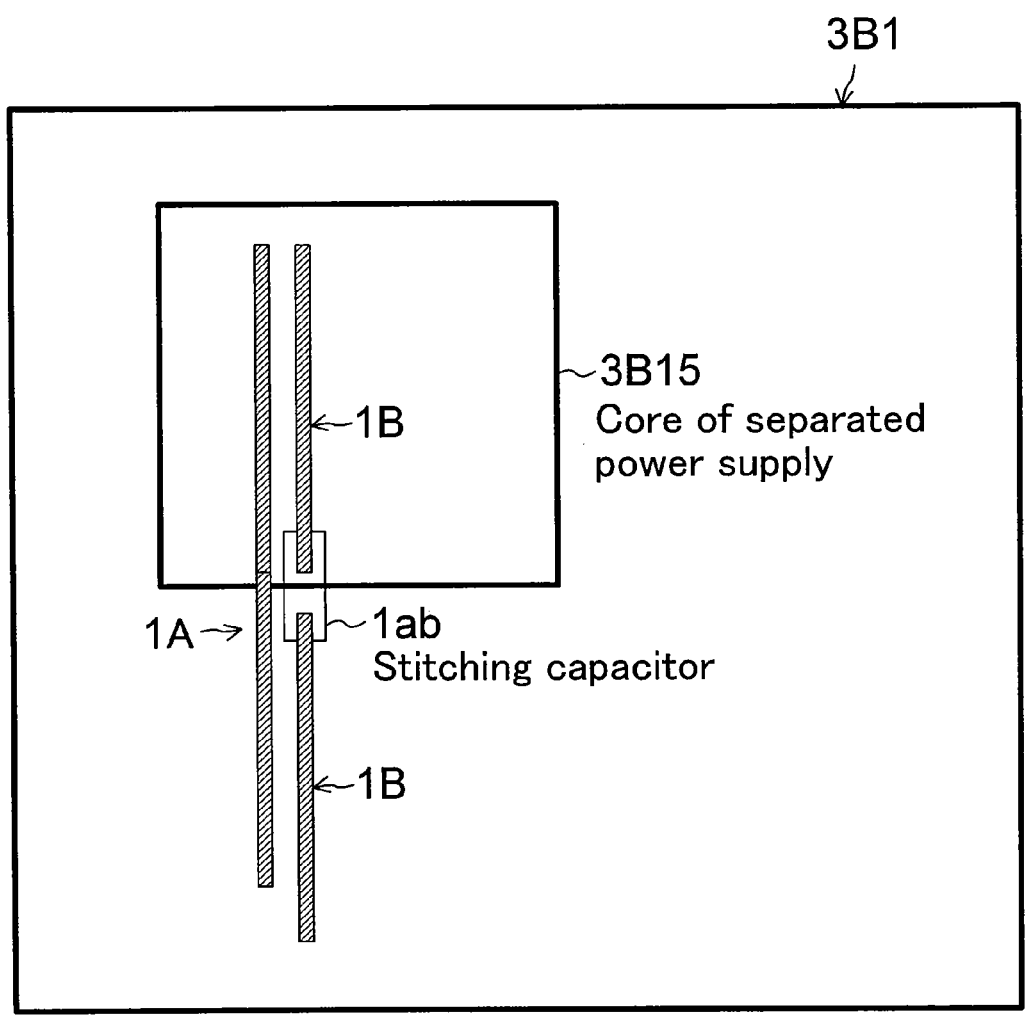
FIG. 11B shows an example of the present invention, where a global power supply layer of a core is separated from those of other cores.

FIG. 11B shows a physical arrangement of the conductor 1A and the conductor 1B in a case where the power supply layer of a core 3B15 is separated from other cores for a power supply blocking control, a power supply voltage variable control, etc. Where the conductor 1A is routed between the different power supplies (separated structures), the conductor 1B may be divided into separate portions in the case of a single end transmission method. It is preferred that a stitching capacitor 1ab is inserted between the separated portions of the conductor 1B. With the provision of the stitching capacitor, electrons flowing through the conductor 1B being the return path for the conductor 1A flow via the stitching capacitor without going through a large loop. Thus, the impedance of the conductor 1B can be reduced, and it is possible to transmit the signal at a higher speed while reducing the distortion component of the characteristic impedance of the conductor 1A.

FIG. 16 is a cross-sectional view of the transmission line 1A1 in the integrated circuit 3B1. The transmission line 1A1 includes, starting from the bottom, a substrate, a plurality of conductor N−1 layers, a plurality of conductor N layers and a plurality of conductor N+1 layers. Among the conductor N+1 layers, lines VDD1, VDD2, VDD3 and VDD4 of the same layer are arranged in parallel on the right side of the conductor 1A. There is no conductor N layer between VDD9 of the conductor N−1 layer and the conductor 1A. Among the conductor N layers, lines VDD5, VDD6, VDD7 and VDD8 are arranged in parallel. The numbers shown in FIG. 16 below the conductor N−1 layers each denote the distance in μm from the center of the conductor 1A. Although not shown in FIG. 16, other conductors are arranged on the left side of the conductor 1A so as to be symmetric with those on the right side with respect to the conductor 1A. Thus, by arranging the conductor 1A spaced apart from adjacent wires, and by eliminating one conductor layer in the vertically layered structure, it is possible to form a line of the conductor 1A having a large inductance value, thereby reducing the attenuation constant α and allowing a signal to be received with a more stable waveform.

A transmitter/receiver circuit section connected via the conductor 1A of the transmission line 1A1, such as the integrated circuit 3B1 shown in FIG. 3A, will now be discussed. Signals can be exchanged in many-to-many communications. For example, a signal can be transmitted from a core 3C1 to a core 3C3, from the core 3C1 to a core 3C2, from the core 3C3 simultaneously to the cores 3C0, 3C1 and 3C2, and simultaneously from the cores 3C1 and 3C3 to the core 3C2. Before transmitting real data, the transmitting side sends out in advance, to the transmission line 1A1, information as to where the data is to be received and information as to the location of the sender. Those information may be sent via the transmission line 1A1 or other signal lines. Based on such information, information prepared in advance on the receiving side as to distances along the transmission line 1A1 between the transmitting and receiving cores, and the attenuation constant, it is possible to know by the use of a lookup table, or the like, the voltage amplitude information of the receiving terminal, to adjust the gate voltage at the node Rx5BPG shown in FIG. 5, and to adjust the gain of the receiver circuit so as to more reliably obtain information of the transmission signal.

Where a request is issued from the transmitting side to a receiver circuit thereof, the gate voltage of the node Rx5BPG can be set to the same value as the source voltage of the PMOS transistor Rx5BP2, whereby data is not propagated from the receiver circuit into cores, thereby reducing the power consumption.

If there is no signal propagation at all, the resistive elements Rg, being MOS transistors, or the like, can be turned OFF by fixing the gate voltages thereof, so as to cut off the current path of the transmission line 1A1, thereby reducing the power consumption.

Figure 12:
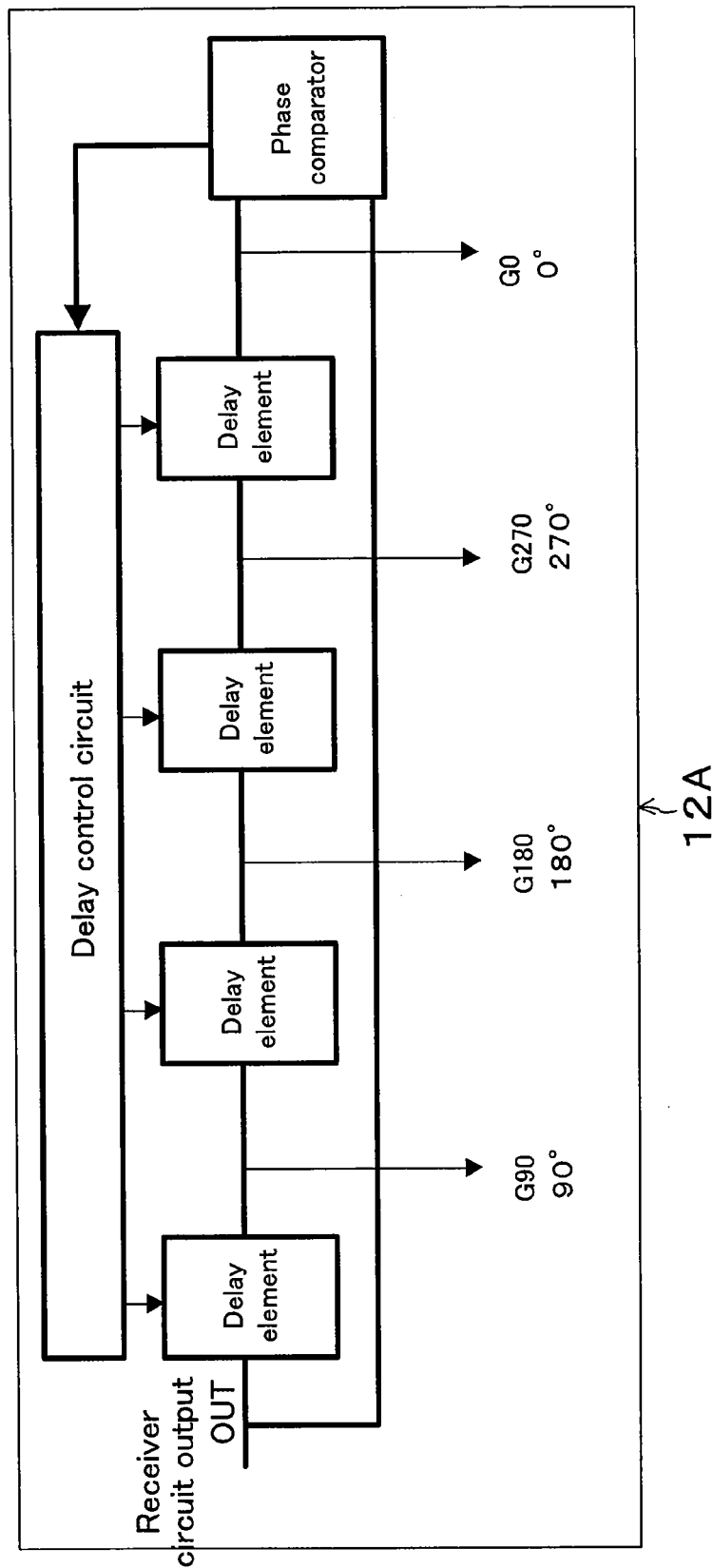
FIG. 12 is a schematic diagram showing an internal configuration of a DLL circuit of the electronic device.
Figure 13A:
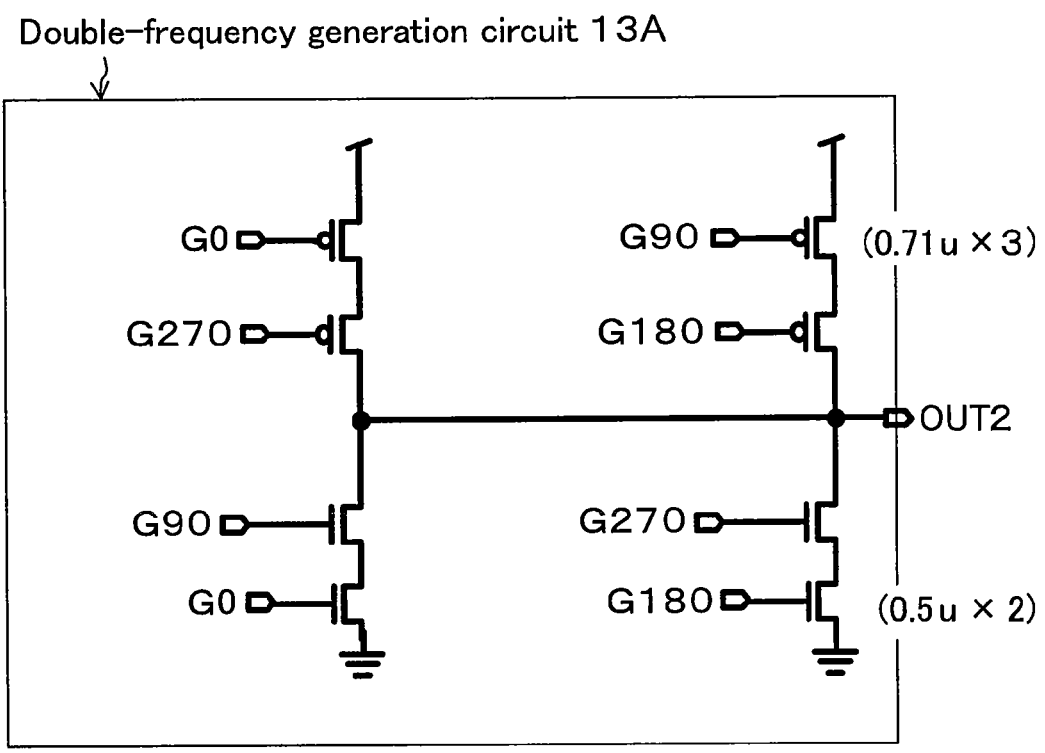
FIG. 13A is a schematic diagram showing a configuration of a double-frequency generation circuit of the electronic device.

In an alternative embodiment, a high-speed AD converter is provided separately in the vicinity of the receiving terminal, and the voltage amplitude value of the signal propagating along the transmission line 1A1 is monitored, so as to adjust the sensitivity of the receiver circuit based on the voltage value. This eliminates the need for information as to the position on the transmitting side from which the signal is transmitted, whereby it is possible to reduce the latency.

Where data are received from a plurality of transmitter circuits via a plurality of lines, the source synchronous technique may be used to thereby reduce erroneous signal-receiving operations. The source synchronous technique is a technique of transmitting data and a strobe signal from the transmitting side to the receiving side. Where there is an extra margin in the transfer rate, the strobe signal may be transmitted at a transfer rate twice as high as the data transfer rate, in which case there is no problems in terms of timing for receiving the output data of the receiver circuit by a flip flop (hereinafter referred to as an "FF"). However, the data transfer rate is normally the maximum transfer rate at which a normal operation can be guaranteed, in order to make good use of the capability of the transmission line. Therefore, the strobe signal transfer rate cannot be set to twice as high as the maximum data transfer rate, but will be equal to the maximum data transfer rate. Therefore, in order to receive the output data of the receiver circuit by an FF, the clock frequency of the FF needs to be twice as high as the strobe signal transfer rate. In order to produce the doubled clock frequency, a strobe signal is input to the receiver circuit Rx5B, and a signal is input from the output OUT of the receiver circuit Rx5B to a delay locked loop (DLL) circuit 12A, as shown in FIG. 12, to thereby output signals of different phases, i.e., 0°, 90°, 180° and 270°, from the delay elements of the DLL circuit 12A. As the four signals whose phases are shifted from one another by 90° are input to the input terminals of a double-frequency generation circuit 13A as shown in FIG. 13A, there is obtained an output of a doubled frequency.

Figure 13B:
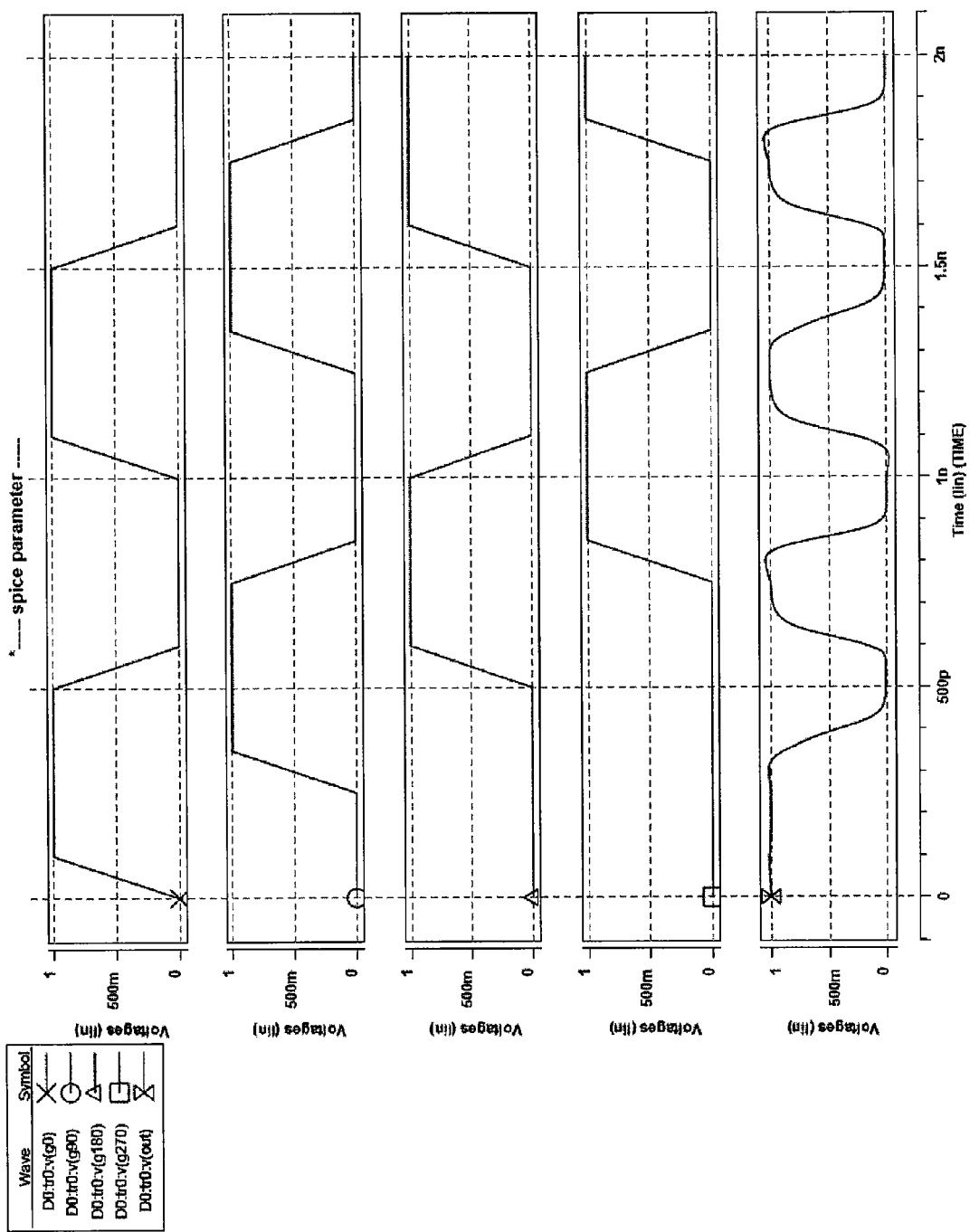
FIG. 13B shows simulated waveforms of the double-frequency generation circuit.

FIG. 13B shows simulated waveforms of the double-frequency generation circuit 13A. It can be seen that the output signal has twice the frequency as that of the input signal. By using the receiver circuit Rx5B as shown in FIG. 5 to again receive the output signal OUT of the receiver circuit Rx5B with a device to be shown below, it is possible to improve the speed and the area efficiency. The FF of the present invention is an FF with a multi-input selector function described in International Publication WO2007/046368 pamphlet.

Figure 14:
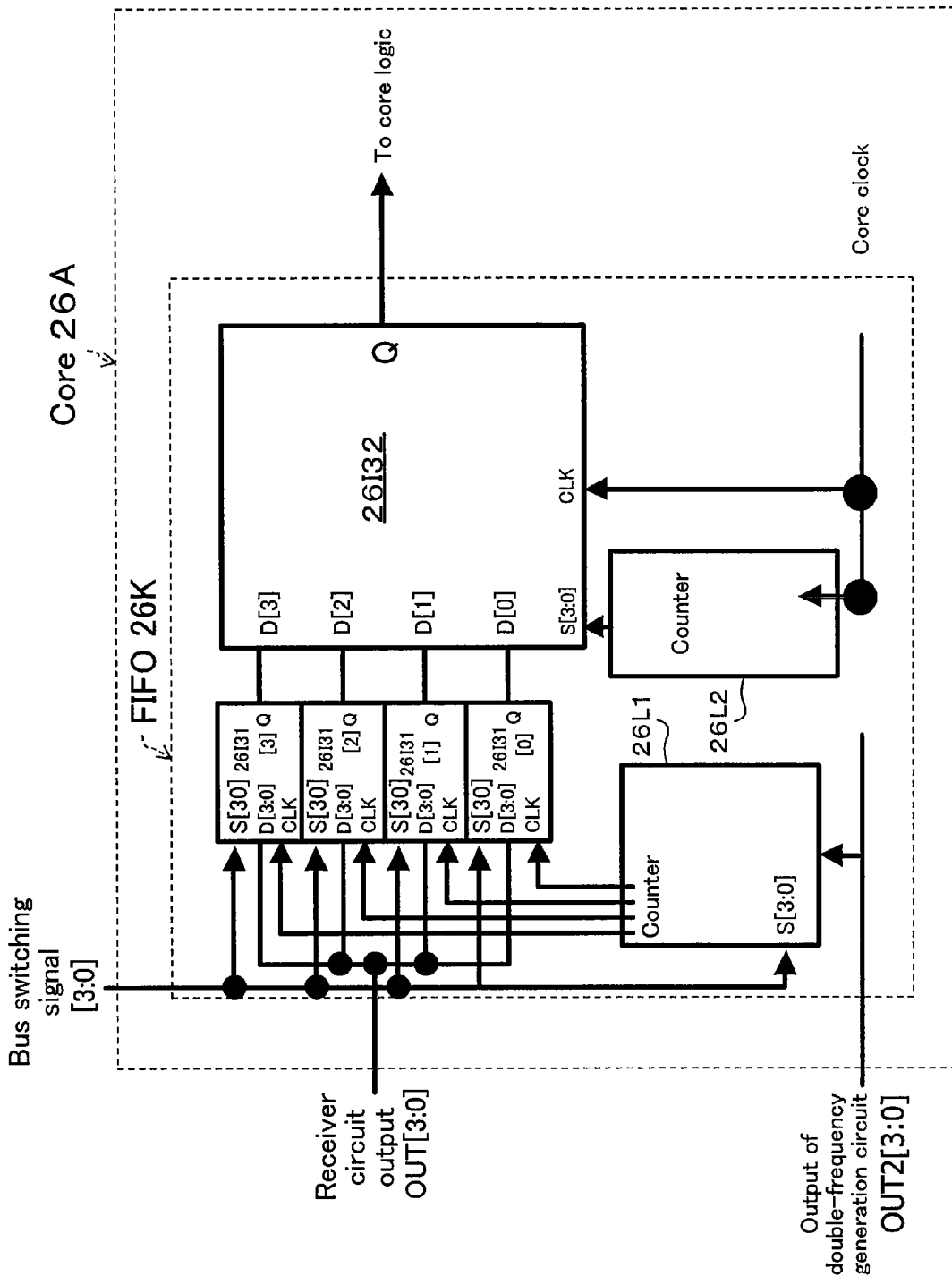
FIG. 14 is a schematic diagram showing a configuration of a source synchronous signal-receiving section of the electronic device.
Figure 23:
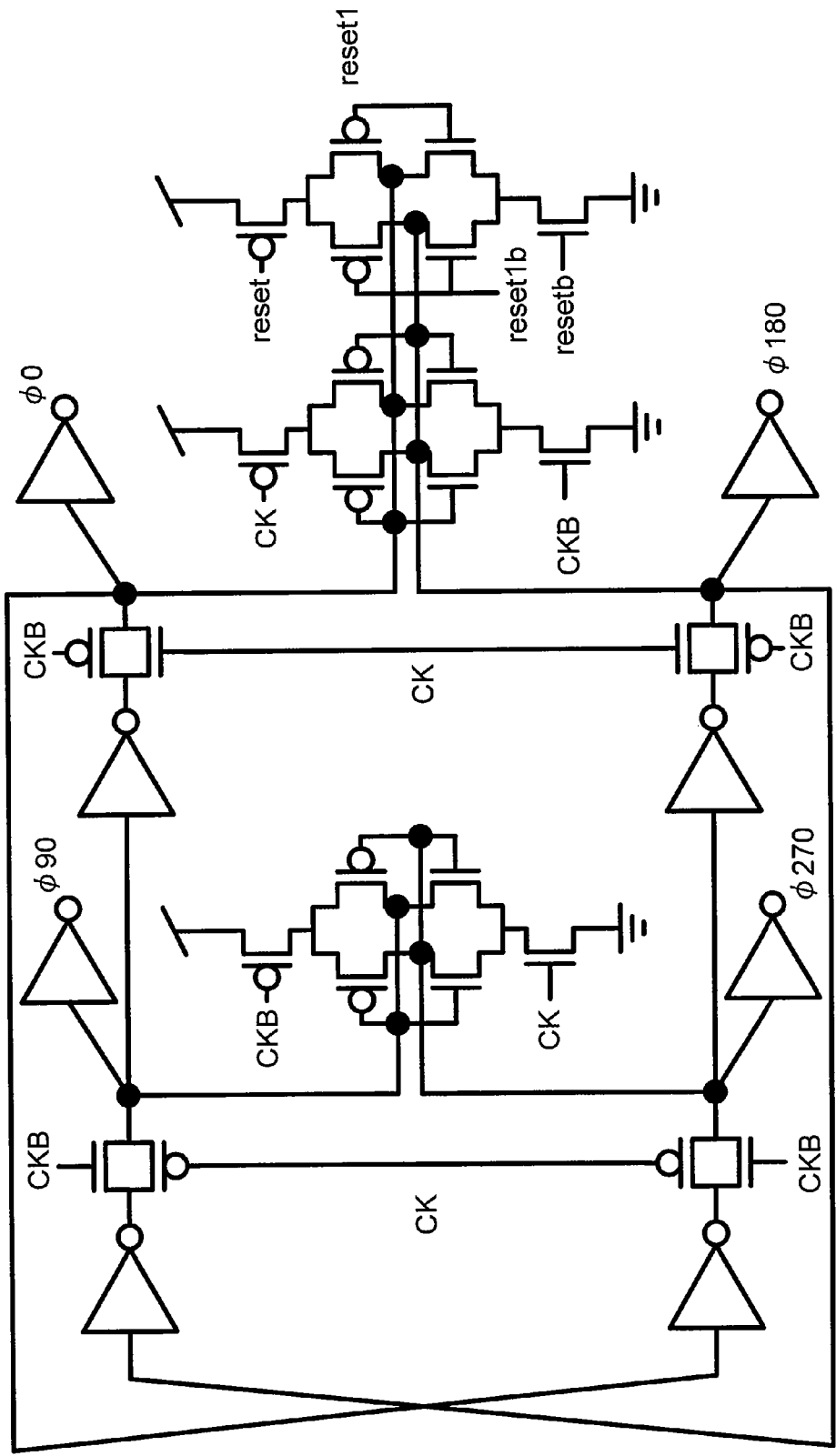
FIG. 23 shows a differential frequency divider circuit.
Figure 24:
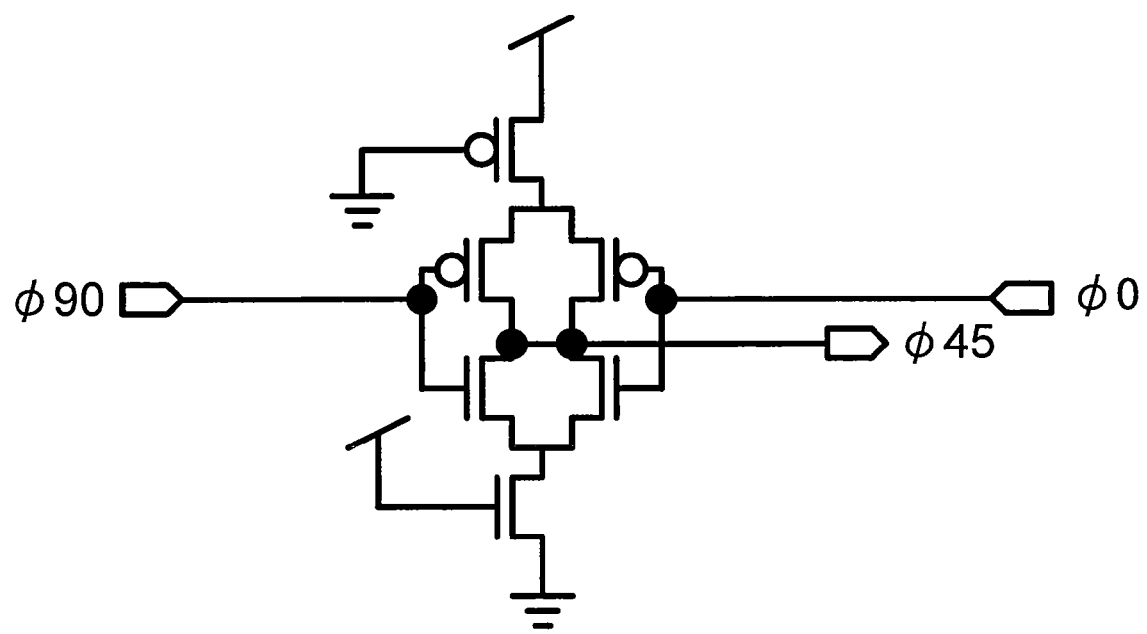
FIG. 24 shows a phase adjustment circuit.

Next, a case where the strobe signal is a differential signal will be discussed. FIG. 23 shows a differential frequency divider circuit 23. A differential pair strobe signal is input to each of the terminals CK and CKB of the differential frequency divider circuit 23 to thereby produce signals whose phases are 0°, 90°, 180° and 270°. A counter output signal of FIG. 14 is produced by using these signal lines. In a case where a desirable precision cannot be obtained, e.g., where a flip flop 26I31 becomes metastable, the phase granularity can be increased by using a phase adjustment circuit 24 as shown in FIG. 24. For example, using the 0° and 90° clocks of the output signal of the differential frequency divider circuit 23 shown in FIG. 23, it is possible to output a clock signal having an in-between phase, i.e., a 45° clock. When producing such a phase (45°), a circuit delay occurs, and an output signal of a reference phase (0°) can be obtained by obtaining a 0° block by inputting a 0° clock to both inputs of FIG. 24. With a circuit as shown in FIG. 24 being connected to the output of the differential frequency divider circuit 23, it is possible to obtain a set of phase differences of the output from the counter of FIG. 14 including 0°, 90°, 180° and 270° and another set including 45°, 135°, 225° and 315°. It is possible to switch between the sets depending on power supply voltage variations or temperature variations of the semiconductor integrated circuit. As to the switching method, it is possible to check whether dummy data can be transmitted and received before performing a read data access, wherein a set switching control signal can be selected so as to select a set with which the dummy data can be transmitted and received. While the illustrated example is an example with two sets, signal exchanges with an even higher precision may be possible by increasing the phase resolution.

FIG. 14 shows a FIFO circuit 26K in a core 26A of a signal-receiving section where the source synchronous method is employed.

Figure 15:
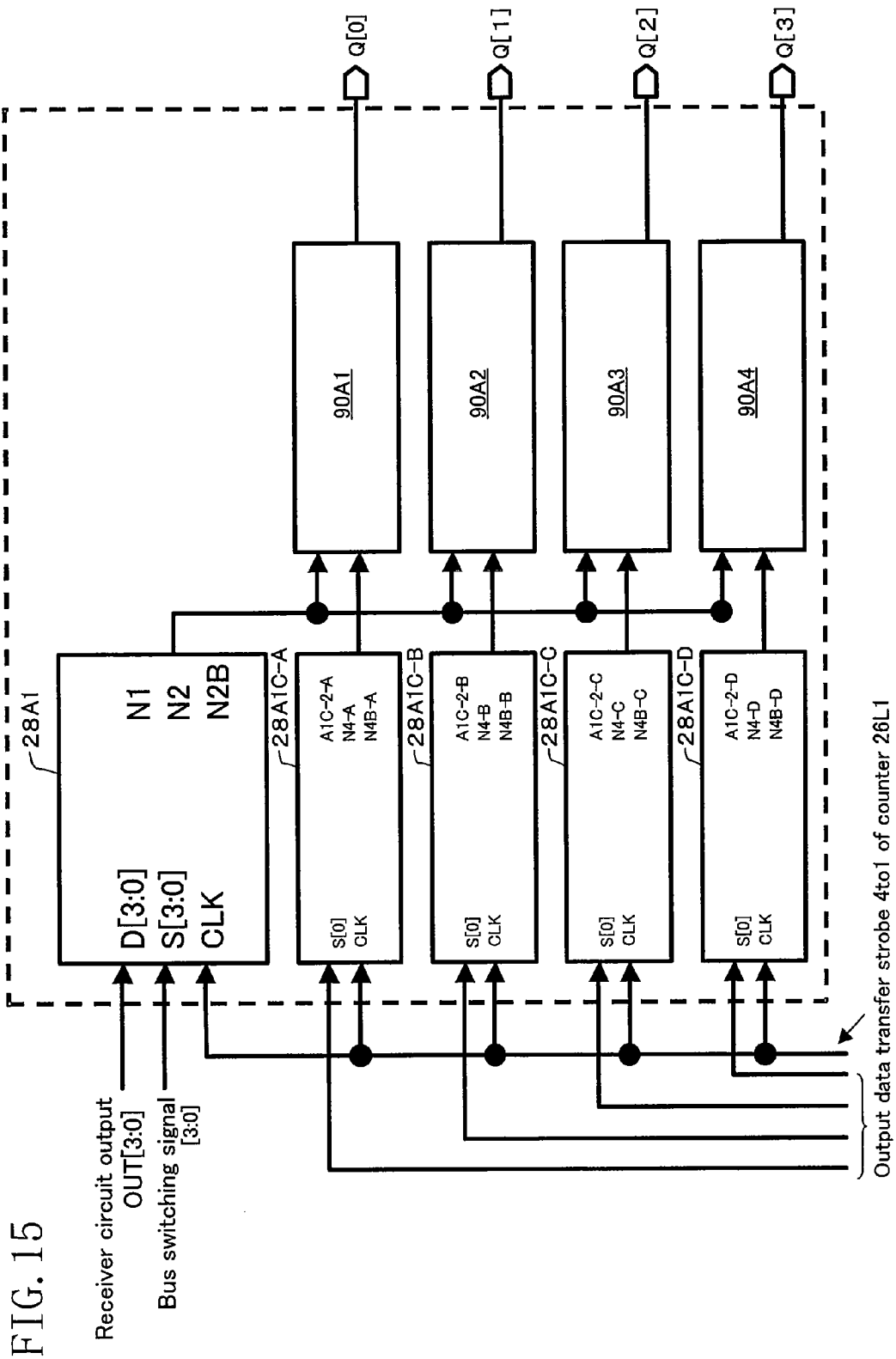
FIG. 15 is a schematic diagram showing an alternative internal configuration of the signal-receiving section of the electronic device.
Figure 31:
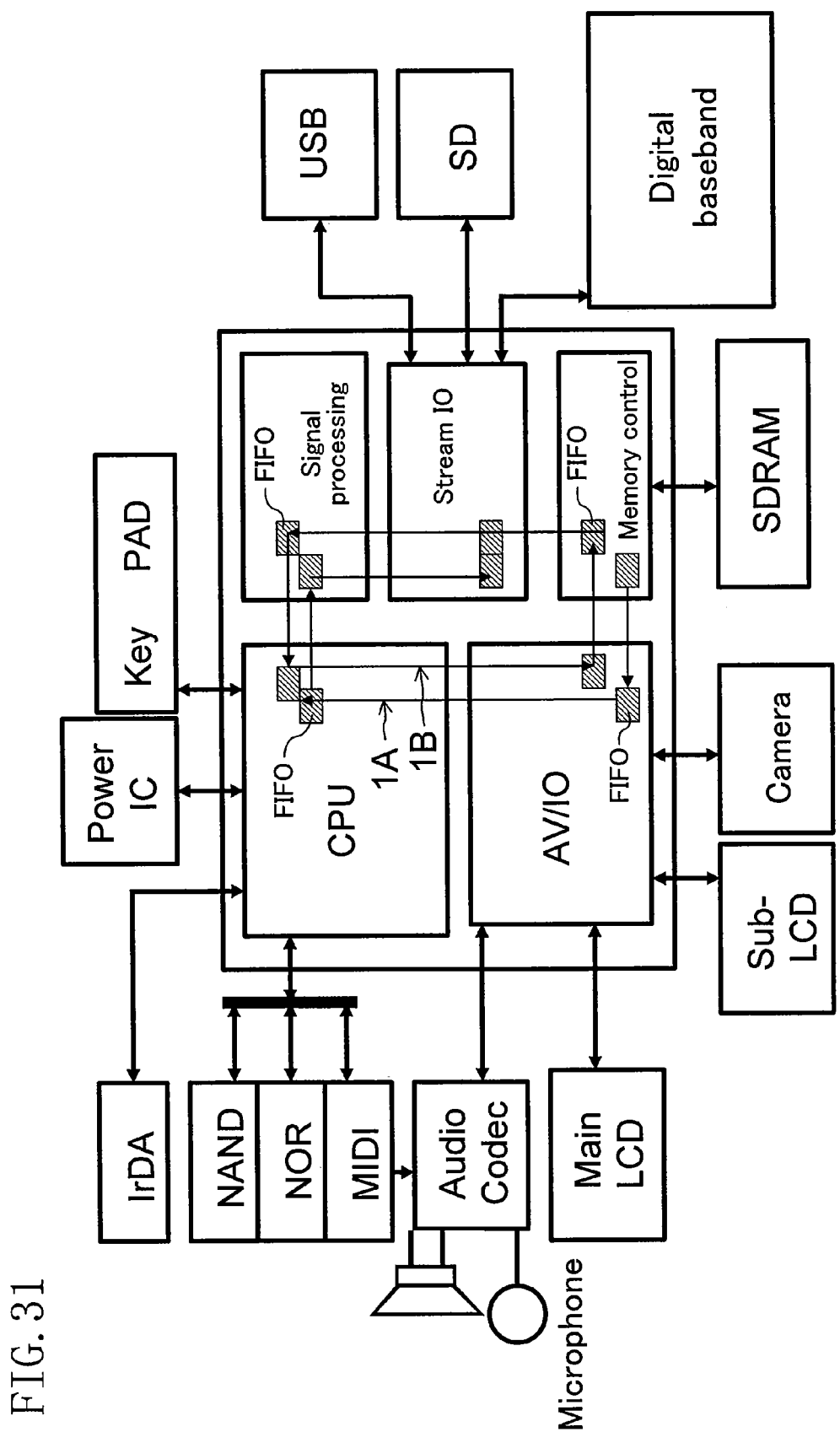
FIG. 31 shows a heterogeneous processor of the present invention, and a peripheral configuration thereto.

The FIFO circuit 26K includes a counter 26L1 for counting the number of data transfers based on the output signal OUT2 [3:0] of the double-frequency generation circuit 13A shown in FIG. 13A, a counter 26L2 for counting the number of core clock pulses, and an FF with multi-input selector 26I31 [3:0] and an FF circuit with multi-input selector 26I32 described in International Publication WO2007/046368 pamphlet. The four signals output from the counter 26L1 are digital signals whose rising edges and falling edges appear every ¼ of the strobe signal transfer rate. The four signals output from the counter 26L2 are digital signals whose Hi periods do not overlap with each other, but appear for every ¼ of the core clock signal transfer rate. The FF with multi-input selector 26I31 [3:0] receives data from the output OUT [3:0] of the receiver circuit, and a bus switching control signal is input to the port S [3:0] of the FF with multi-input selector 26I31, wherein input data is selected by the signal of the port S [3:0]. The clock terminal of the FF 26I31 [3:0] receives one of the four output signals from the counter 26L1. One of the four signals is enabled at a time, and only the FF with multi-input selector 26I31 [3:0] associated with the enabled signal takes in data. One of the output data of the FF with multi-input selector 26I31 [3:0] is selected by the FF circuit with multi-input selector 26I32, which uses the output signal from the counter 26L2 as a selection signal S [3:0], and the FF circuit with multi-input selector 26I32 takes in the data on the core clock. With the source synchronous method, if the data transfer strobe is used instead of the core clock, the data transfer timing margin is no longer dependent on the clock skew between the core clock and the data transfer strobe, and it is possible to realize an interface for more stable data receiving operations. Where the data transfer cycle is shorter than the core operating cycle, the output of the FF circuit with multi-input selector 26I31 is transferred directly to the core logic without passing it through the FF circuit with multi-input selector 26I32. In this case, the number of FIFOs (the FF with multi-input selector 26I31 [3:0]) is determined based on "Core operating cycle/Data transfer cycle". Where the data transfer cycle is shorter than the limit value of the operating cycle of the FF, this is very effective for realizing a stable signal receiving operation, and it also provides an effect of reducing the chip area because the number of transmission lines (buses) for the inter-core interface can be reduced.

Where the data transfer cycle is longer than the limit value of the operating cycle of the FF, another FIFO circuit configuration may be provided by using a circuit obtained by improving the multi-input FF shown in FIG. 31 of International Publication WO2007/046368 pamphlet. This circuit is shown in FIG. 15. The circuit of FIG. 15 has a configuration where the receiver circuit output OUT [3:0] is input to the data input terminal and the bus switching signal is input to the data selection signal terminal S [3:0], and has three differences from FIG. 31 of International Publication WO2007/046368 pamphlet.

Figure 25:
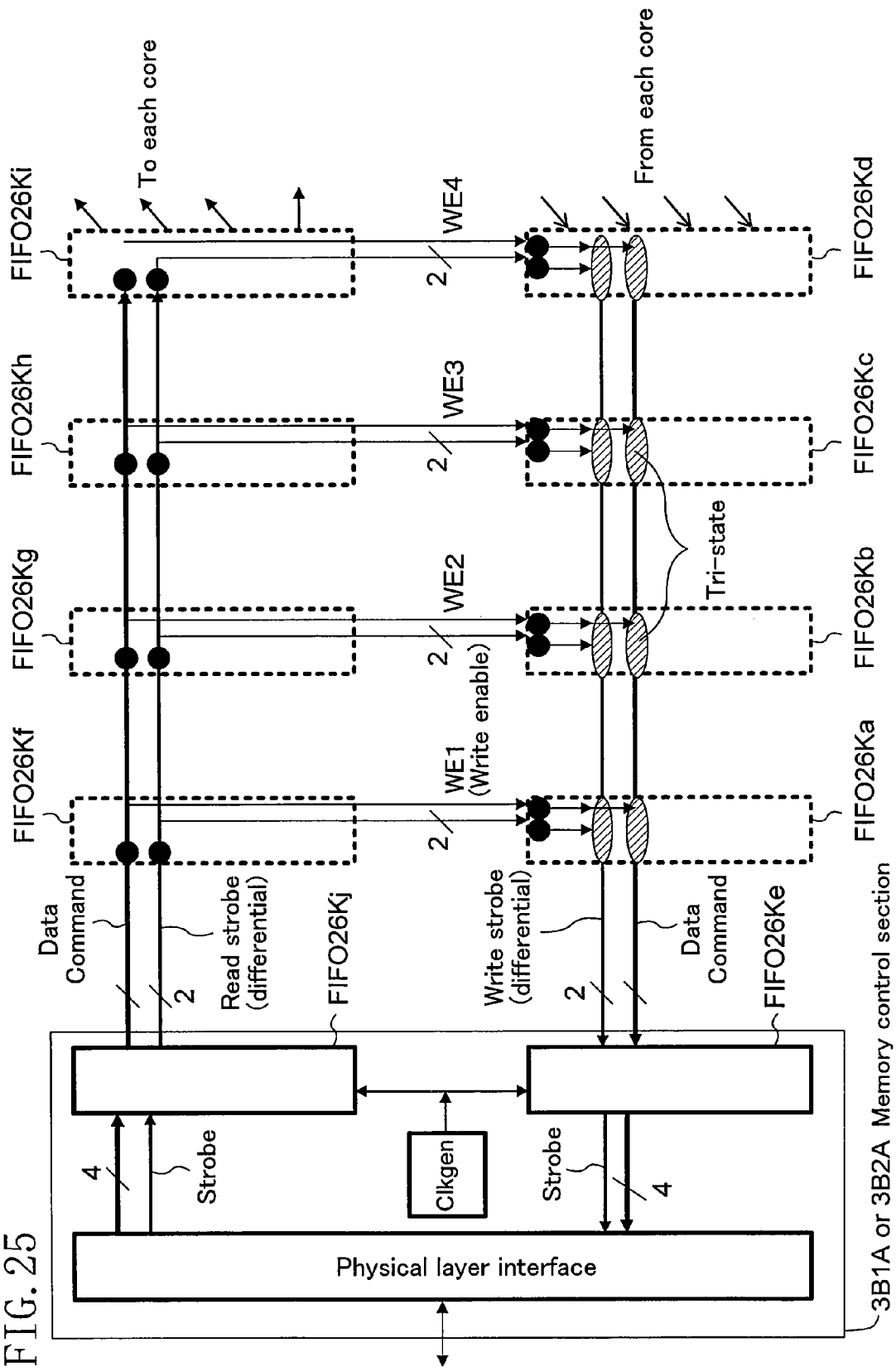
FIG. 25 shows an application where FIFOs 26K are used as relay points in a hierarchical bus architecture.

The first difference is that the output of the counter 26L1 is input instead of the control signal S [3:0] of a dynamic circuit 28A1C. The four signals output from the counter 26L1 are digital signals whose Hi periods do not overlap with each other, but appear for every ¼ of the strobe signal transfer rate, as opposed to the specifications shown in FIG. 14. The data transfer strobe 4to1 signal of the selected bus among the output signal [3:0] of the double-frequency generation circuit 13A shown in FIGS. 12 and 13 is used as the clock CLK. While the core 26A is specified as the receiving destination in FIG. 14, it is not limited to this, and the structure of the FIFO 26K may be provided at the relay point of the hierarchical bus architecture.

Where the FIFO 26K is used as a relay point of the hierarchical bus architecture, the Q output of the FF 26I32, being the transmission destination of the receiver circuit output, may be of a one-to-many or many-to-one communications scheme. A plurality of FIFOs 26K may be provided at each relay point. An example is shown in FIG. 25. Referring to FIG. 25, the memory control section receives data and commands from four FIFOs 26K (a, b, c and d) inside the chip, and the memory control section includes an FIFO 26K (e) for transmitting signals to the external memory. The memory control section also includes an FIFO 26K (j) for transmitting data and commands to four FIFO 26K (f, g, h and i) inside the chip. It is preferred to produce a strobe signal of the many-to-one communications scheme from a strobe signal of the one-to-many communications scheme, as shown in FIG. 25.

The second difference is that there are a plurality of dynamic circuits 28A1 (28A1C-A, 28A1C-B, 28A1C-C and 28A1C-D).

The third difference is that there are a plurality of hold circuits 90 (90A1, 90A2, 90A3 and 90A4), wherein the output from each hold circuit is used as the output of a dynamic FF circuit.

The internal signal connection between the dynamic circuits and the hold circuits inside the configuration of FIG. 15 is as follows. The outputs (A1C-2-A, N4-A and N4B-A (N4B being the inverted signal of N4)) of the dynamic circuits 28A1 are input to the corresponding hold circuits (90A1, 90A2, 90A3 and 90A4), respectively, and the outputs (A1C-2-A to A1C-2-D, N4-A to N4-D, and N4B-A to N4B-D) of the dynamic circuits (28A1C-A, 28A1C-B, 28A1C-C and 28A1C-D) are connected to the corresponding input signal ports of the respective hold circuits (90A1, 90A2, 90A3 and 90A4), respectively. By using the FF of FIG. 15 instead of the FF with multi-input selector 26I31 [3:0] shown in FIG. 14, the elements are significantly reduced, thus significantly reducing the area. Where the timing constraints for the signal output from the counter 26L1 do not adversely influence the data holding operation of the hold circuits (90A1, 90A2, 90A3 and 90A4), the dynamic circuits (28A1C-A, 28A1C-B, 28A1C-C and 28A1C-D) may be bypassed, in which case the dynamic circuits (28A1C-A, 28A1C-B, 28A1C-C and 28A1C-D) can be removed, thus further reducing the area.

If four NMOS transistors are provided with the drains of the NMOS transistors being connected to the output node OUT of the receiver circuit Rx5B shown in FIG. 5, and with the inverted signal of Q [3:0] being connected to the gates of the NMOS transistors, the output waveform of the receiver circuit Rx5B can be reliably transmitted to the following FF without being attenuated in the high frequency region. The four NMOS transistors each have a different current capability.

Second Embodiment

This embodiment is directed to a correction method, with which the eyepattern of the signal waveform is unlikely to vary due to temperature variations.

As described above in the first embodiment, the characteristic impedance Z of a line is expressed as shown in Expression 22 for a frequency band in which the resistance of the line is negligible. There is substantially no dependence on the temperature for a frequency band in which the dielectric loss and the skin effect are negligible. For example, for a transmission line using a terminating resistor, the terminating resistor is preferably set to 50 ohm if the characteristic impedance of the line is 50 ohm. In the configuration shown in FIG. 1 of Patent Document 1, if the reference resistor is formed by a copper wire, with the wire being provided in an integrated circuit, the value of the reference resistor varies due to temperature variations of the integrated circuit, and there is an about 2-fold difference over a temperature range from −40° C. to 125° C., whereby there is also a 2-fold difference in the value of the terminating resistor. Thus, there is an impedance mismatch between the transmission line and the terminating resistor due to temperature variations, leading to signal reflection. Therefore, it is difficult to realize a high-speed transmission over a wide temperature range.

The method for correcting the resistance value of the resistive element Rg in the transmission method of the present embodiment will now be described. The resistive element whose value is the inverse of G in the relationship shown in Expression 11 can be expressed as a function of the temperature T as follows.

$$Rg(T) = \frac{1}{G(t)} = \frac{L}{C} \times \frac{1}{R(t)} \qquad \text{[Expression 30]}$$

Expression 30 can be rearranged as follows.

$$Rg(T) \times R(t) = \frac{L}{C} \qquad \text{[Expression 31]}$$

Thus, the product of the resistance of the resistive element Rg and that of the conductor of the transmission line 1A1 is equal to a value obtained by dividing the inductance of the conductor by the capacitance, i.e., the square of the impedance of the conductor during the propagation of a signal of a high frequency such that the resistance component of the conductor is negligible. The inductance L and the capacitance C are very little dependent on temperature variations. Therefore, when the resistance value Rg of the transmission line 1A1 varies due to temperature variations, it is possible to reduce the distortion of the signal waveform due to temperature variations of the transmission line 1A1 by correcting the resistance value of the resistive element Rg so that the product of the resistance of the resistive element and that of the conductor becomes constant.

Figure 26A:
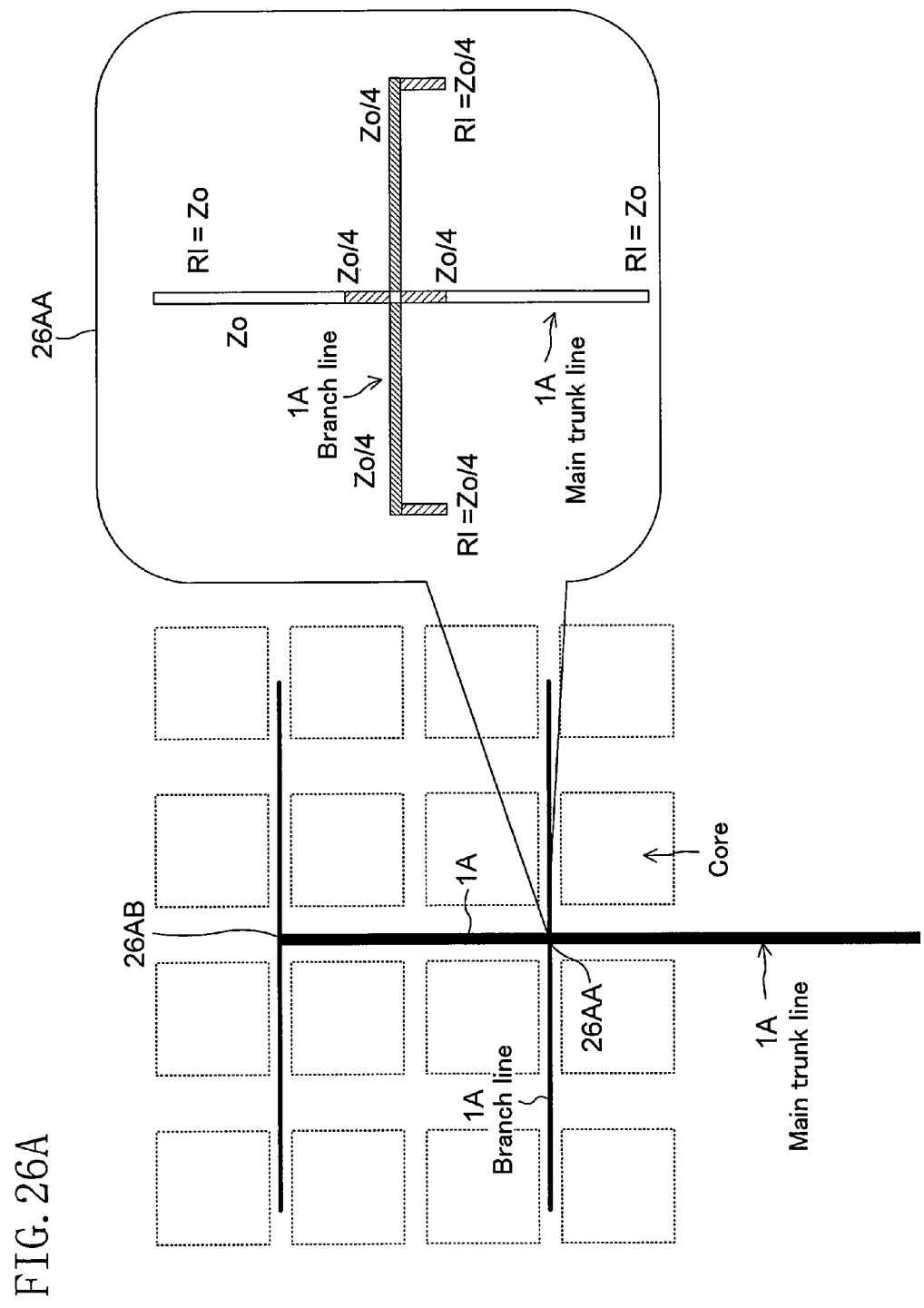
FIG. 26A shows in detail how a conductor 1A is branched.
Figure 26B:
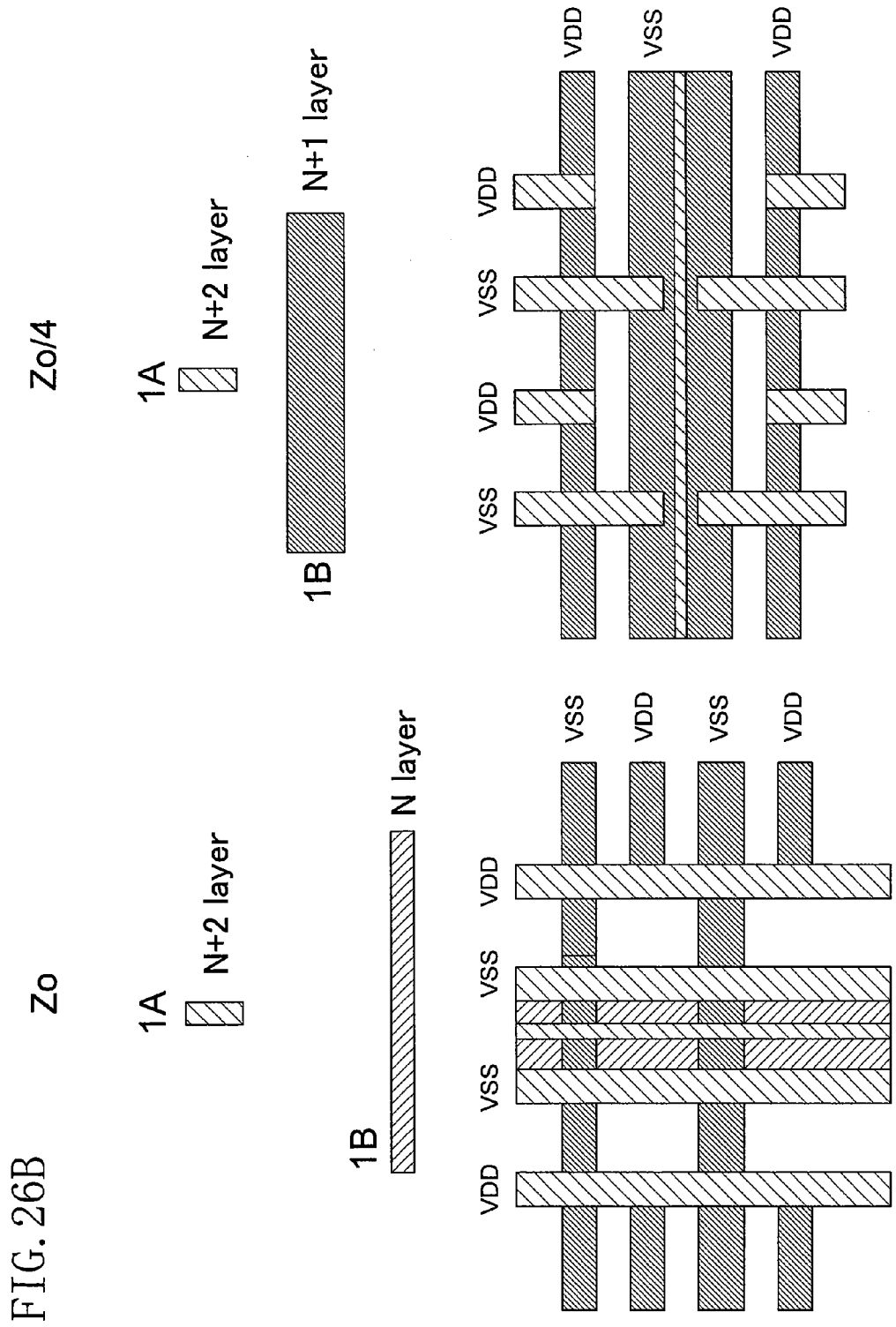
FIG. 26B is a cross-sectional view showing a specific example of a wiring structure.

In order to minimize the distortion due to branching, it is preferred to employ a configuration shown in FIG. 26A. FIG. 26A shows a chip as viewed from above, wherein the main trunk of the conductor 1A diverges at the point 26AA into three branches, one of which further diverges at the point 26AB into two branches. At the point of three-way divergence, if the characteristic impedance of the main trunk of the conductor 1A is Zo, the wiring structure is modified or a resistor is connected so that the characteristic impedance becomes Zo/4. FIG. 26B shows a specific example of the wire cross section. FIG. 26A also shows an example where a resistor accounting for the characteristic impedance Zo/4 is inserted in one of the three branches that further diverges later, i.e., the conductor 1A (main trunk line), with one side of the resistor being returned to the conductor 1A having the characteristic impedance Zo. Where the wire length is ¼ of the waveform of the transmission signal, it is preferred that the branch line as it is has a characteristic impedance of Zo/4. The designation "R1" in FIG. 26A may be a terminating resistor or a transmission resistor. It is preferred that those elements are matched with the characteristic impedance of the conductor 1A.

Moreover, the distinction between a main trunk line and a branch line should be defined based on the activity rate of the port to which the line is connected as shown below, if the power consumption and the energy consumption are to be taken into consideration.

Figure 27A:
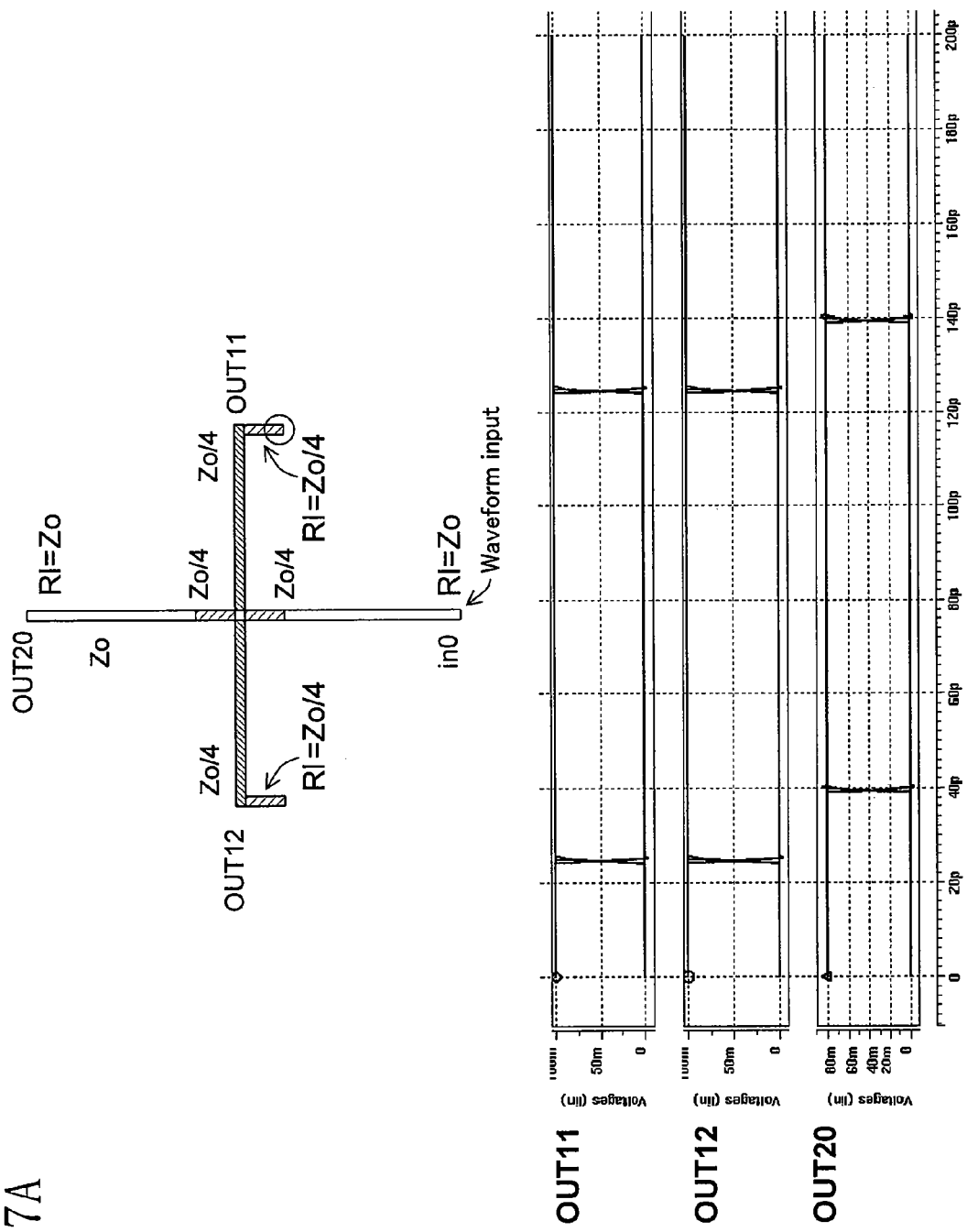
FIG. 27A shows the voltage waveform and the power consumption value of each terminal as a waveform is input to one of the ports of a 4-way branched conductor, the ports having different characteristic impedances from one another.
Figure 27B:
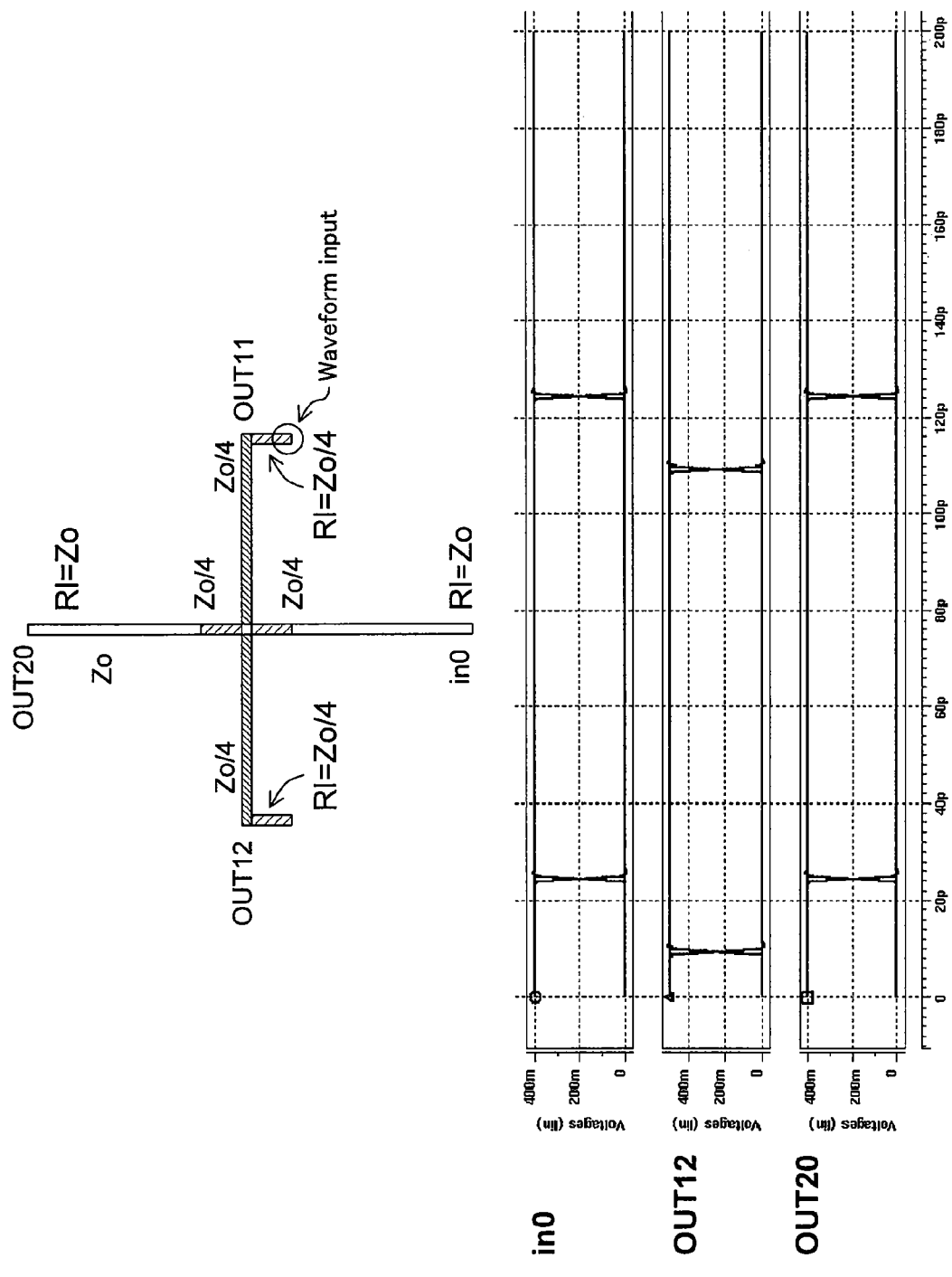
FIG. 27B shows the voltage waveform and the power consumption value of each terminal as a waveform is input to another one of the ports of a 4-way branched conductor, the ports having different characteristic impedances from one another.

FIGS. 27A and 27B show the voltage waveform and the current consumption value at each terminal when a waveform is input to different ports of different characteristic impedances of a conductor diverging into four branches. It can be seen that there is a difference in the power consumption. There is a smaller current consumption when a waveform is input through a port having the characteristic impedance Zo than when it is input through a port having the characteristic impedance Zo/4. Thus, the power consumption of a chip can be reduced by following rules as specified below.

1. A port having a high activity rate should be provided at a position where the power consumption is small, i.e., along a main trunk line where the characteristic impedance is large.

2. A port having a low activity rate should be provided at a position where the power consumption is large, i.e., along a branch line.

Figure 6A:
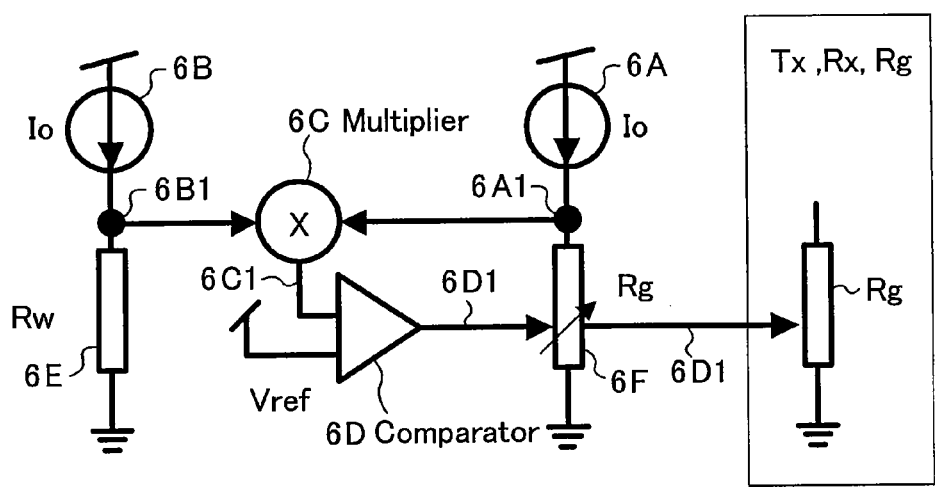
FIG. 6A shows a resistance adjusting circuit of the transmission line of the electronic device.
Figure 6B:
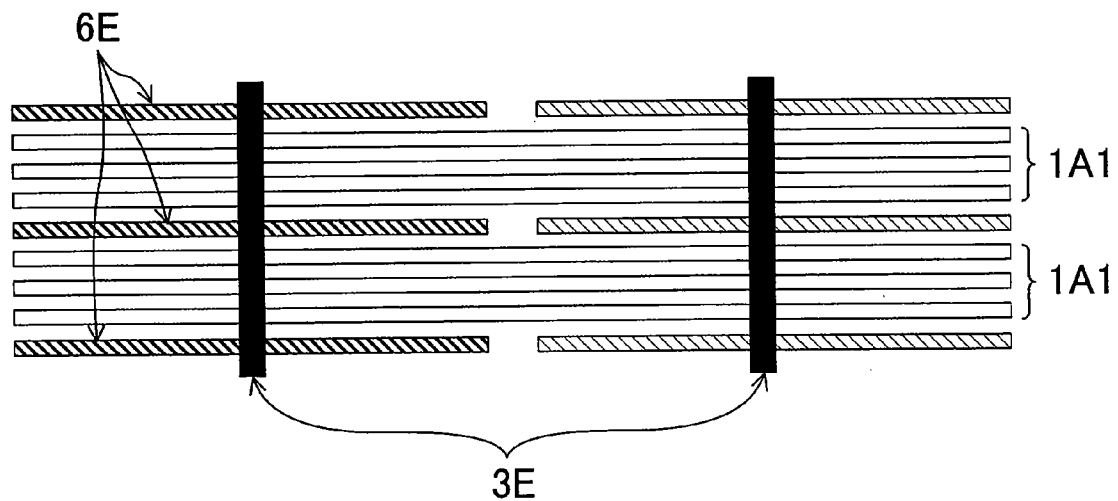
FIG. 6B shows an example of a physical arrangement of resistive elements.

FIG. 6A shows a specific circuit employing the resistance correction method in the transmission method of the present embodiment. Reference numeral 6A denotes a current source that gives a current Io. Reference numeral 6B also denotes a current source that gives about the same level of a current as the current source 6A. It is not necessary but is preferred that this employs a current mirror circuit using a bias voltage being a bandgap reference circuit, or the like. This is because it is possible to realize a more ideal current source in which the current value of the current source is not substantially influenced by the temperature or power supply voltage variations. Reference numeral 6E denotes a resistive element formed by the same conductor material as the conductor of the transmission line, wherein one end of the resistive element is connected to the ground and the other end to the current source 6B, forming a node 6A1. The physical arrangement of the resistive elements 6E will be referred to. More preferably, the temperature of the resistive elements 6E is approximated to that of the transmission lines 1A1. FIG. 6B shows an example of arrangement of the resistive elements 6E according to the arrangement of the transmission lines 1A1 shown in FIG. 3A. In FIG. 6B, the resister correction circuit in FIG. 6A is arranged in each resistive element 3E, though not shown. The resistive elements 6E are divided in the middle of the transmission lines 1A1 between the resistive elements 3E and are arranged at the center and each side of the bundles of the transmission lines 1A1. This arrangement approximates the temperature of the resistive elements 6E to that of the transmission lines 1A1. Reference numeral 6F denotes a resistive element formed by the same device as the resistive element Rg of the present invention, and the resistance value thereof can be varied by the control signal. One end of the resistive element 6F is connected to the ground and the other end to the current source 6A, forming a node 6B1. Reference numeral 6C denotes a multiplier (multiplication circuit) for multiplying together the voltage value of the node 6A1 and that of the node 6B1 to output the result to an output node 6C1. Reference numeral 6D denotes a comparator (comparison circuit) for comparing the reference voltage Vref with the voltage of the node 6C1 to output the difference therebetween to a node 6D1. The resistive element 6F and the resistive element Rg of the transmission line may be a variable element by the use of the node 6D1. This is a feedback system where the resistance of the resistive element 6F is reduced if the voltage value of the node 6C1 is higher than the reference voltage and the resistance value of the resistive element 6F is increased if the voltage value of the node 6C1 is lower than the reference voltage. Herein, the reference voltage Vref is set to a value that is linear with respect to the value L/C of the transmission line.

Figure 7:
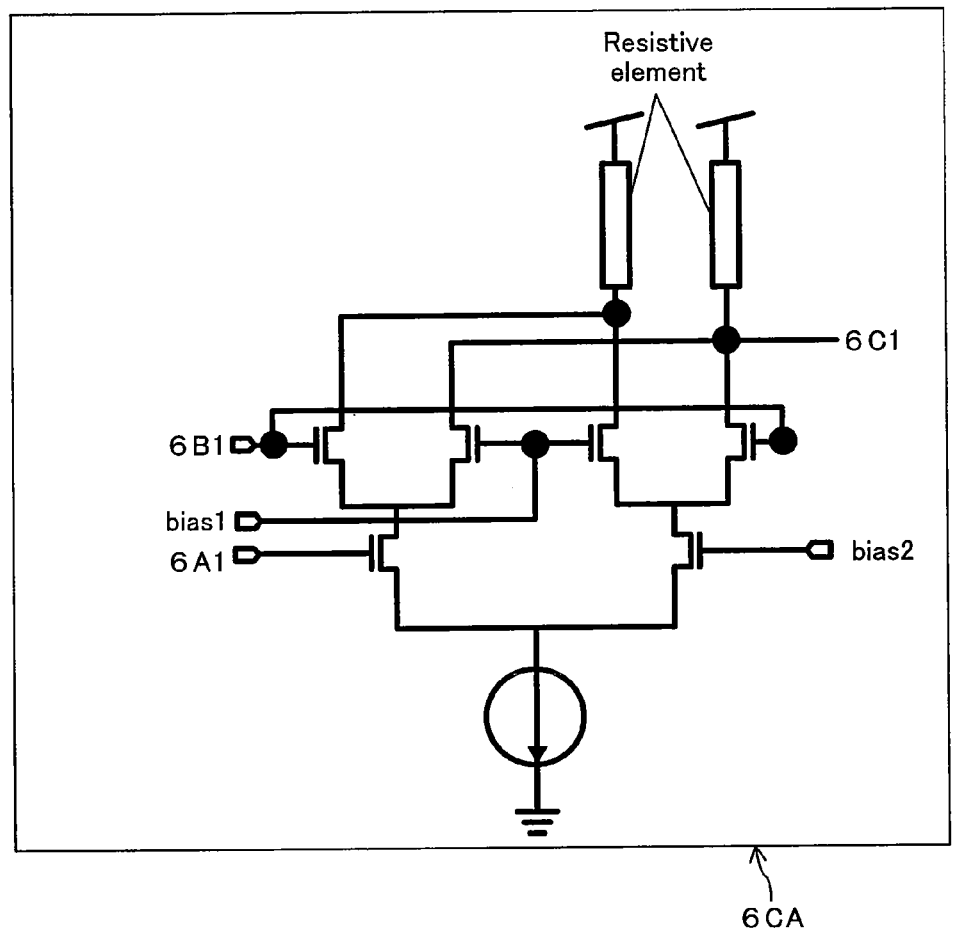
FIG. 7 shows an integration circuit provided in the resistance adjusting circuit.

FIG. 7 shows a specific circuit diagram of a multiplier 6C. This is a CMOS-type Gilbert analog multiplier 6CA. A differential signal 6B1 is input to bias1. A differential signal 6A1 is input to bias2. With such an analog multiplier, in which the response of the feedback system is good and which can be realized with a small number of elements, it is possible to control the resistance value of the resistive element Rg more desirably with less noise. The multiplier 6C is not limited thereto and may be an RF mixer operated at low voltage.

Figure 8:
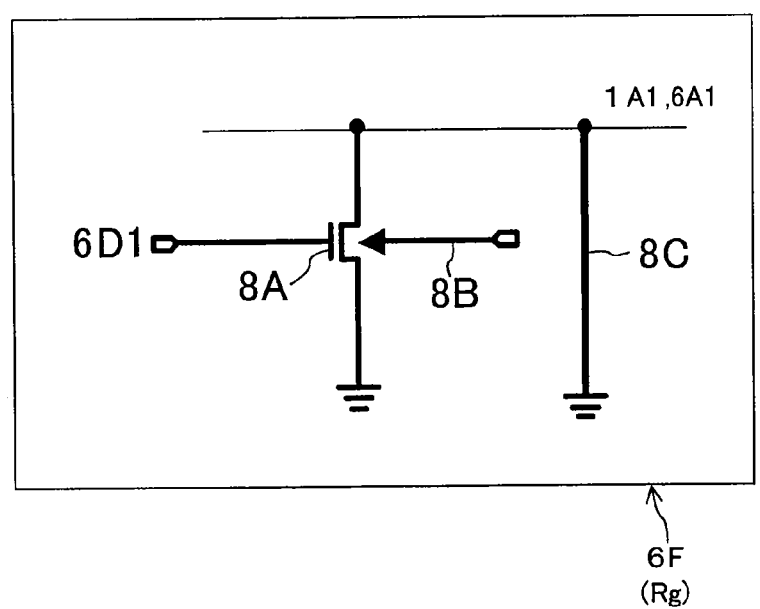
FIG. 8 shows in detail a resistor of the transmission line of the electronic device.

FIG. 8 shows a circuit diagram of a configuration for variably controlling the resistive elements 6F and Rg. An NMOS transistor 8A and a resistive element 8C are connected in parallel to form a resistor, and the gate of the NMOS transistor 8A is connected to the node 6D1, thereby adjusting the resistance value. The substrate of the NMOS transistor 8A is connected to the node 8B, and the substrate control method is used so that the same current characteristics are obtained irrespective of the process variations, the temperature variations and the voltage variations of the NMOS transistor 8A.

Figure 17:
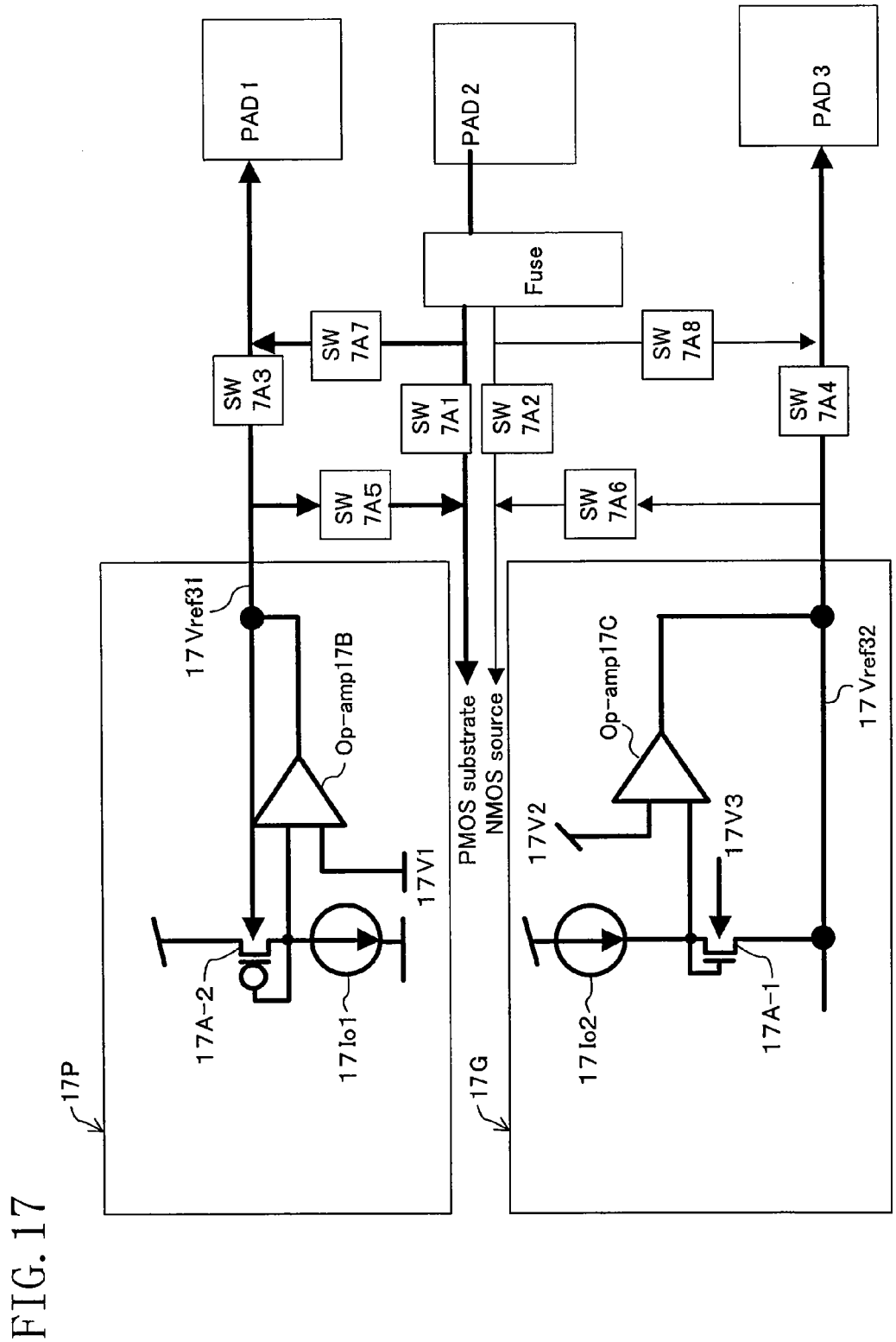
FIG. 17 is a schematic diagram showing an internal configuration of a substrate control circuit and a power supply control circuit of the electronic device.

Although such a substrate control method is described in, for example, Japanese Laid-Open Patent Publication No. 2004-165649 and Japanese Patent No. 3838655, FIG. 17 shows an additional example. FIG. 17 shows a substrate control method where the resistive element Rg is formed by a PMOS transistor, and a method for controlling the source potential of the NMOS transistor where a power supply cut-off switch is provided on the NMOS transistor side inside the core and the substrate of the NMOS transistor is fixed to 17V3.

Reference numeral 17G denotes a power supply control circuit, and reference numeral 17A-1 denotes an NMOS transistor that is formed by a manufacturing method similar to that for NMOS transistors inside the core, wherein the gate and the drain are connected to a current source 17Io2 and further to the input terminal of an operational amplifier Op-amp17C. The reference voltage of the operational amplifier Op-amp17C is the power supply voltage 17V2 inside the core. The operational amplifier Op-amp17C adjusts the source voltage of an NMOS transistor 17A-1 via a signal line 17Vref32 so that the saturation current of the NMOS transistor 17A-1 is constant. The signal line 17Vref32 is connected to a pad PAD3 via an analog switch SW7A4, and to the power supply (not the ground) of the NMOS transistor inside the core via an analog switch SW7A6. The power supply line of the NMOS transistor is connected, via an analog switch SW7A2, to the output terminal of a fuse box Fuse whose output voltage value is adjusted by an external signal from a pad PAD2. The output of the fuse box Fuse is connected to the pad PAD3 via an analog switch SW7A8. The fuse box includes a volatile memory, a non-volatile memory and a fuse.

In FIG. 17, reference numeral 17P denotes a substrate control circuit of the PMOS transistor, and reference numeral 17A-2 denotes a PMOS transistor that is formed by a manufacturing method similar to that for PMOS transistors inside the core, wherein the gate and the drain are connected to a current source 17Io1 and further to the input terminal of an operational amplifier Op-amp17B. The reference voltage of the operational amplifier Op-amp17B is the power supply voltage 17V1 inside the core. The operational amplifier Op-amp17B adjusts the substrate voltage of the PMOS transistor 17A-2 via a signal line 17Vref31 so that the saturation current of a PMOS transistor 17A-2 is constant. The signal line 17Vref31 is connected to a pad PAD1 via an analog switch SW7A3, and to the PMOS transistor substrate inside the core via an analog switch SW7A5. The PMOS transistor substrate is connected, via an analog switch SW7A1, to the output terminal of the fuse box Fuse controlled by an external signal from the pad PAD2. The output of the fuse box Fuse is connected to the pad PAD1 via an analog switch SW7A7. With the switches SW7A1 to SW7A8, there are two or more ways the power supply control and the substrate control can be used. Two effective ways will now be described.

One way is to turn the switches SW7A1 and SW7A2 OFF and the switches SW7A5 and SW7A6 ON so as to adaptively control the power supply inside the core and the substrate. This is responsive to instantaneous variations such as process deterioration variations, temperature variations and voltage variations, and can provide a high-precision control.

Another way is to turn the switches SW7A3 and SW7A4 ON and the switches SW7A2, SW7A8, SW7A3 and SW7A7 OFF before the core starts operating. That is, during shipment or when the core is not operating, the power supply to the power supply control circuit 17G and the substrate control circuit 17P can be cut off by outputting the information of the voltages 17Vref31 and 17Vref32 along the signal line via the pads PAD1 and PAD3 so as to externally adjust the fuse box Fuse via the pad PAD2 to achieve the same value as the voltage value, and then turning the switches SW7A3, SW7A5, SW7A4 and SW7A6 OFF and the switches SW7A2, SW7A8, SW7A3 and SW7A7 ON. With this, it is possible to adjust the manufacturing process variations. For the temperature variations and the voltage variations, a temperature detection circuit, or the like, is used to detect a change in the chip temperature, wherein the core is not shut down within a certain range, but the core is shut down and the power supply and the substrate control circuit are operated beyond the certain range. The voltage variations can similarly be controlled by means of a voltage variation detection circuit. With respect to the voltage, the core is shut down and the power supply and the substrate control circuit are operated when there is issued an external command for changing the power supply voltage and the substrate voltage value inside the core. Despite the lower precision than the adaptive method, this is a more robust method and does not consume the power of the control circuits 17P and 17G while the core is operating, whereby it is possible to reduce the power consumption.

Referring back to FIG. 6A, an A-D converter may be inserted between the node 6A1 and the node 6B1, and a digital multiplier may be used instead of the multiplier 6C. The comparator 6D may be a digital comparator. In such a case, the node 6C1 and the reference voltage Vref are represented in terms of digital values by a plurality of bit strings. Moreover, the variable resistive element 6F and the resistive element Rg may be provided in a configuration where MOS transistors, or the like, are connected in parallel, wherein the MOS transistors are controlled by digital values by using the node 6D1 as a bus.

In order to further increase the precision, the reference voltage Vref can be determined based on the time constant CR for the capacitance value C and the resistance value R of the conductor 1A of the transmission line 1A1, and the dielectric constant of the dielectric material surrounding the conductor 1A. The time constant CR can be determined by applying, to the transmission line 1A1, a voltage waveform that transitions so gently that the distributed constant does not need to be taken into consideration, and measuring the time of arrival thereof by using a DLL, or the like, provided in the integrated circuit. The resistance value R in DC is calculated based on the current source and the voltage value. Thus, the capacitance C is calculated. The value of the inductance L of the conductor 1A is calculated based on Expression 13. By setting this value to the reference voltage Vref before the signal propagates through the transmission line 1A1 at a high speed, it is possible to realize an accurate resistance value of the load resistor accommodating the process variations and the temperature variations of the on-chip transmission line 1A1. Thus, irrespective of the temperature and the process conditions, the amplitude of the waveform becomes constant even in a high-speed transmission, whereby it is possible to realize a stable signal transfer.

Whether these are controlled adaptively or by means of a fuse box, or the like, it can be realized by providing an analog switch, a fuse box, a pad and a power cut-off circuit of the feedback system as described above with reference to FIG. 17.

Effects of the method of the present invention will now be described.

If the conductance, i.e., the inverse of the resistance value of the resistive element Rg, changes by A, it is expressed as shown in Expression 32 below.

$$G = \frac{(1+\Delta) \times RC}{L} \qquad \text{[Expression 32]}$$

Figure 33:
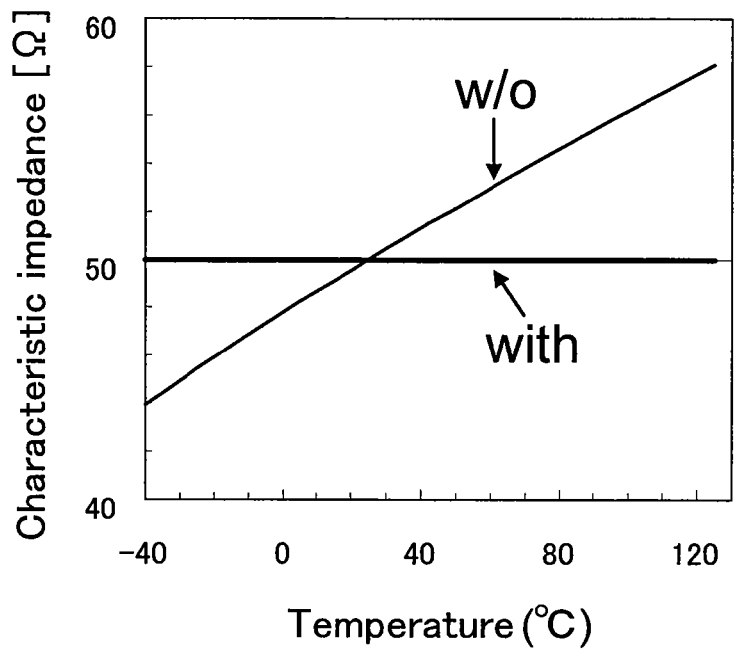
FIG. 33 is a graph showing the temperature along the horizontal axis and the characteristic impedance along the vertical axis, with and without a correction method of the present invention.

The attenuation constant α given by Expressions 11 and 12 above is expanded in Taylor expansion as follows by using Expression 32.

$$\alpha = \frac{R}{\sqrt{\frac{L}{C}}} \times \left(1 + \frac{1}{2}\Delta - \frac{1}{8}\frac{R^2\Delta^2}{(R^2+\omega^2L^2)}\right) \qquad \text{[Expression 33]}$$

Where copper is used for the conductor 1A, the resistance R has a 1.343-fold variation over a temperature range from 27° C. to 125° C. Using Z=50 [ohm] and R=50 [ohm] and taking into consideration the resistance variations over a temperature range from −40° C. to 125° C., the eyepattern attenuation constant varies by 50%. Moreover, the characteristic impedance varies by 10%. The more dominant factor for the waveform distortion is the characteristic impedance. Assuming that the terminating resistor has no temperature variations, variations in the characteristic impedance influence the reflection of the signal waveform to thereby cause a waveform distortion. FIG. 33 is a graph showing the characteristic impedance along the vertical axis against the temperature along the horizontal axis, with and without the present correction method. As can be seen from FIG. 33, with the present embodiment, the characteristic impedance does not vary with temperature. Thus, with the present embodiment, it is possible to reduce the waveform distortion. Moreover, if a voltage value reflecting the process variation value of the conductor 1A is used for the reference voltage Vref, the signal propagating through the transmission line 1A1 can have a non-distortion signal waveform independent of process or temperature variations. As described above, it is possible to further reduce the signal waveform distortion by adding a small circuit scale to the transmission line 1A1.

Various Applications

Figure 18:
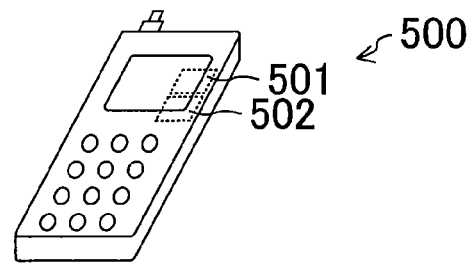
FIG. 18 is a general view of a communications apparatus including the electronic device.

FIG. 18 is a general view of a communications apparatus including an electronic device of the present invention. A portable telephone 500 includes a baseband LSI 501 and an application LSI 502. The baseband LSI 501 and the application LSI 502 are each a semiconductor integrated circuit including an electronic device of the present invention. Since an electronic device of the present invention is capable of transmitting information at a higher speed than in the prior art and is capable of operating with a smaller power consumption, the baseband LSI 501, the application LSI 502, and the portable telephone 500 using these LSIs can also operate with a low power consumption. Moreover, also for a semiconductor integrated circuit of the portable telephone 500 other than the baseband LSI 501 and the application LSI 502, effects as described above can be obtained by employing an electronic device of the present invention for a logic circuit included in such a semiconductor integrated circuit.

Figure 28:
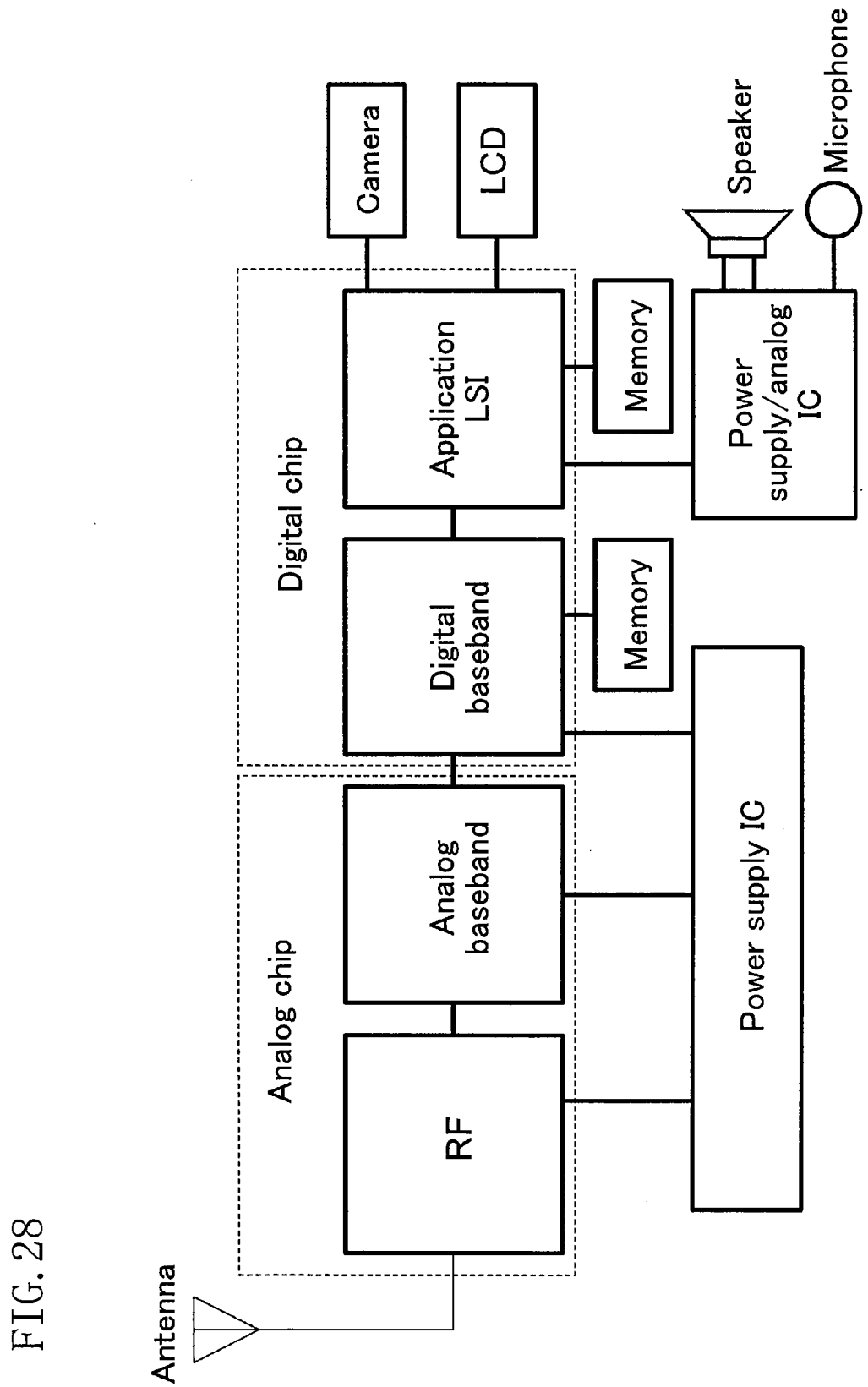
FIG. 28 shows the system of a portable telephone apparatus.

With the system of the portable telephone apparatus shown in FIG. 28, for example, what are surrounding the chips 501 and 502 of FIG. 18 are chips such as integrated chips, e.g., analog chips and digital chips, and these chips are connected to an antenna, a power supply IC, a memory, a camera, an LCD, etc.

The communications apparatus including an electronic device of the present invention should not be limited to a portable telephone, but includes other apparatuses such as a transmitter and a receiver in a communications system or a modem apparatus for transferring data. Thus, the present invention can reduce the power consumption for any type of communications apparatus, wired or wireless, optical or electrical, and digital or analog.

Figure 19:
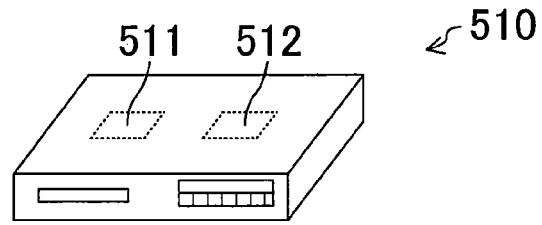
FIG. 19 is a general view of an information reproduction apparatus including the electronic device.

FIG. 19 is a general view of an information reproduction apparatus including an electronic device of the present invention. An optical disc apparatus 510 includes a media signal processing LSI 511 for processing a signal read out from an optical disc, and an error correction/servo process LSI 512 for correcting errors in the signal and performing a servo control of the optical pickup. The media signal processing LSI 511 and the error correction/servo process LSI 512 are each a semiconductor integrated circuit including an electronic device of the present invention. Since an electronic device of the present invention is capable of transmitting information at a higher speed than in the prior art and is capable of operating with a smaller power consumption, the media signal processing LSI 511, the error correction/servo process LSI 512, and the optical disc apparatus 510 using these LSIs can also operate with a low power consumption. Moreover, also for a semiconductor integrated circuit of the optical disc apparatus 510 other than the media signal processing LSI 511 and the error correction/servo process LSI 512, effects as described above can be obtained by employing an electronic device of the present invention for a logic circuit included in such a semiconductor integrated circuit.

Figure 29:
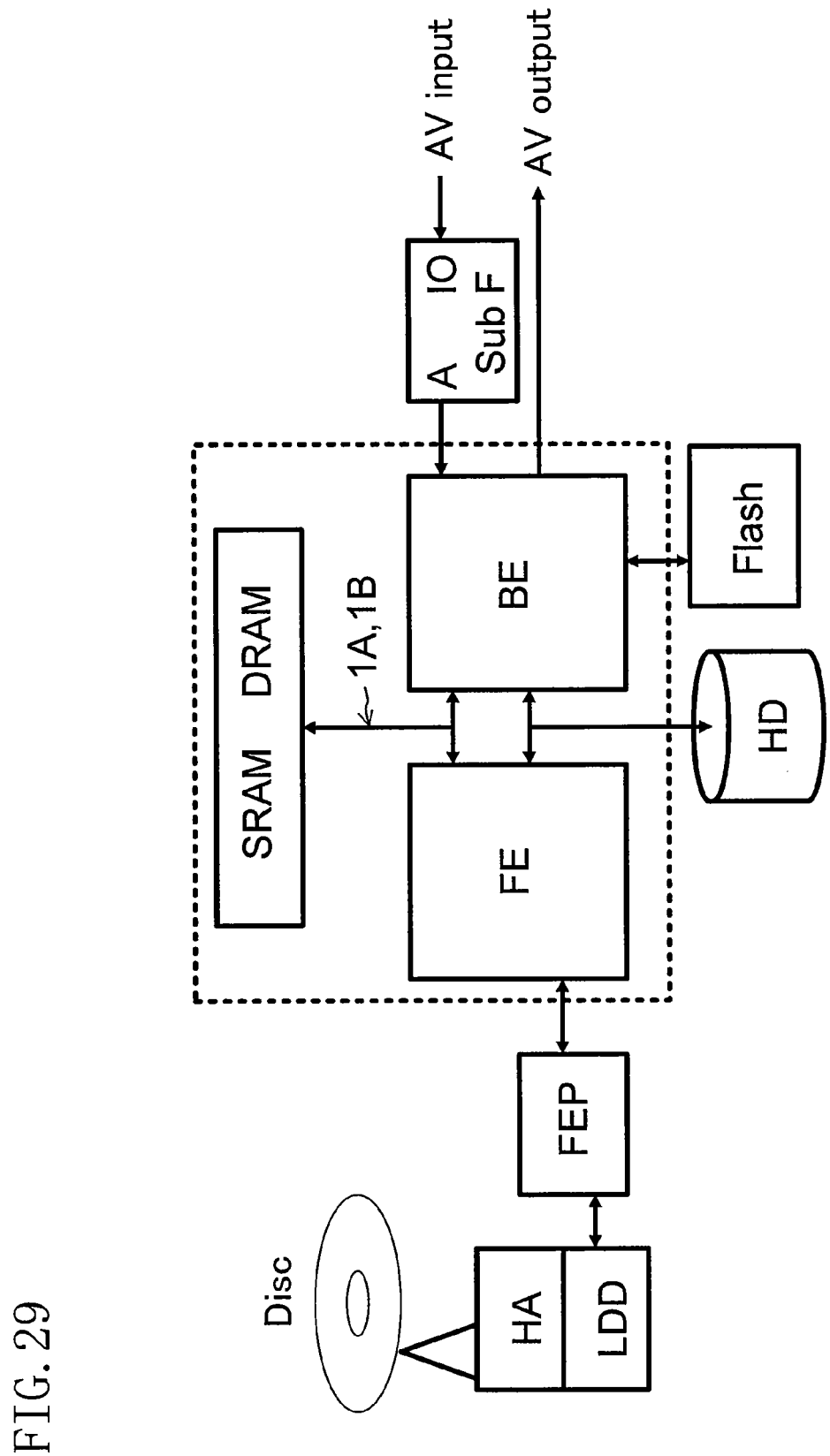
FIG. 29 is an FEP and an FE+BE integrated chip in a disc reproduction/recording apparatus.

In the disc reproduction/recording apparatus shown in FIG. 29, for example, the chips 511 and 512 of FIG. 19 correspond to an FEP and an FE+BE integrated chip, and are connected to an HD, a Flash AV IO Sub field (AV IO SUBF), an HA (head amplifier), an LDD, or the like.

The information reproduction apparatus including an electronic device of the present invention should not be limited to an optical disc apparatus, but includes other apparatuses such as an image recording/reproduction apparatus including a magnetic disc or an information recording/reproduction apparatus using a semiconductor memory as a medium. Thus, the present invention can reduce the power consumption for any type of information reproduction apparatus (which may have an information recording function), irrespective of the type of media carrying the information.

Figure 20:
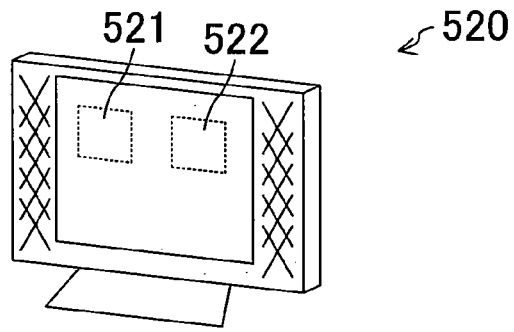
FIG. 20 is a general view of an image display apparatus including the electronic device.

FIG. 20 is a general view of an image display apparatus including an electronic device of the present invention. A television receiver 520 includes an image/sound processing LSI 521 for processing an image signal or a sound signal, and a display/sound source control LSI 522 for controlling devices such as a display screen and a speaker. The image/sound processing LSI 521 and the display/sound source control LSI 522 are each a semiconductor integrated circuit including an electronic device of the present invention. Since an electronic device of the present invention is capable of transmitting information at a higher speed than in the prior art and is capable of operating with a smaller power consumption, the image/sound processing LSI 521, the display/sound source control LSI 522, and the television receiver 520 using these LSIs can also operate with a low power consumption. Moreover, also for a semiconductor integrated circuit of the television receiver 520 other than the image/sound processing LSI 521 and the display/sound source control LSI 522, effects as described above can be obtained by employing an electronic device of the present invention for a logic circuit included in such a semiconductor integrated circuit.

Figure 30:
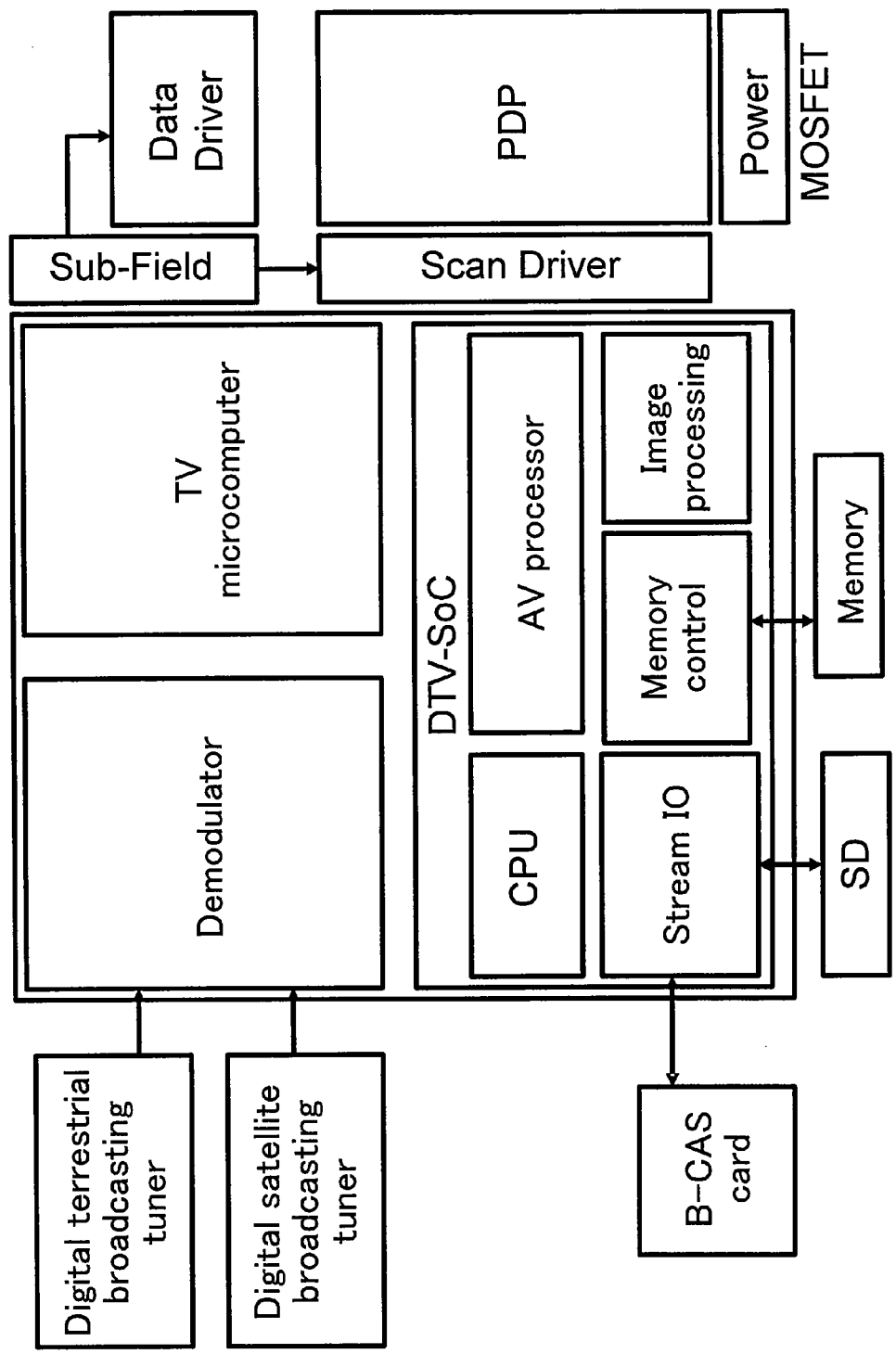
FIG. 30 shows a demodulator and a DTV-SOC of a digital TV apparatus.

The chips 521 and 522 of FIG. 20 are a demodulator and a DTV-SOC of a digital TV apparatus shown in FIG. 30, for example. They are connected to the peripheral elements such as a digital terrestrial broadcasting tuner, a digital satellite broadcasting tuner, a B-CAS card, an SD, a memory, a Sub-Field and a Scan Driver.

FIG. 31 shows a general view of a configuration inside the chip used in FIGS. 28, 29 and 30, and the interfaces. FIG. 31 shows a heterogeneous processor and a peripheral configuration thereto. Data are communicated through the conductors 1A and 1B of the present invention between the memory control section and the cores (an AV/IO core, a CPU core, a signal processing core, a stream IO core). The AV/IO core is a functional block for controlling images and sound. The CPU core is a user interface functional block. The signal processing core is a functional block for compressing/decompressing images and sound. The stream IO core is a functional block for taking in external image data and sound data, or for controlling the security of the data.

Figure 32:
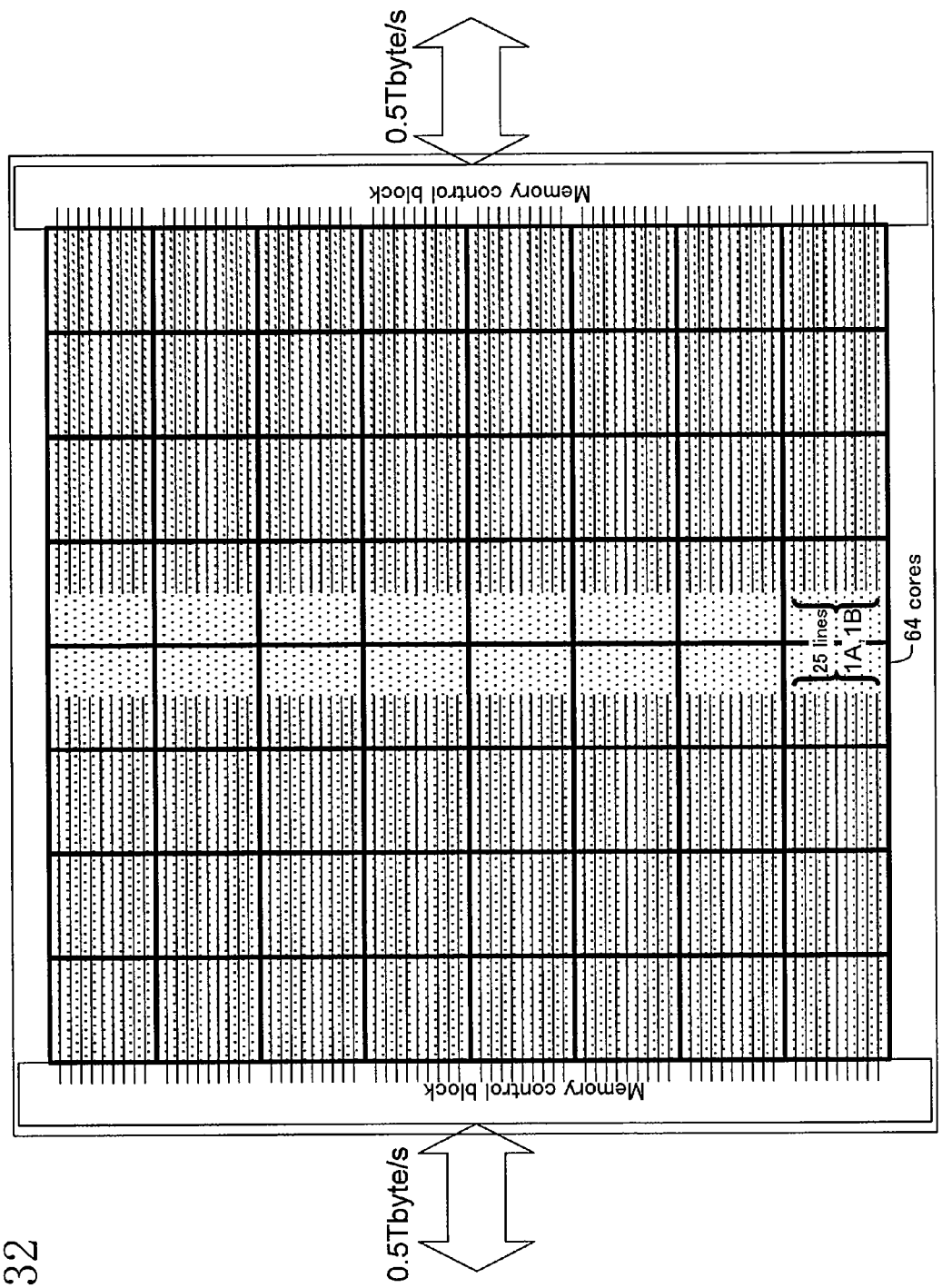
FIG. 32 shows a multi-core application of the present invention, including 64 cores.

The present invention is applicable to processors other than a heterogeneous processor. FIG. 32 shows a multi-core application including 64 cores. FIG. 32 shows a case where an external memory and the memory control section exchange data at 1 TByte/s, wherein 25 conductors 1A or 1B extend from the memory control section to each core.

The image display apparatus including an electronic device of the present invention should not be limited to a television receiver, but includes other apparatuses such as an apparatus for displaying data streamed through an electronic communications circuit. Thus, the present invention can reduce the power consumption for any type of image display apparatus, irrespective of the information transmission method.

Figure 21:
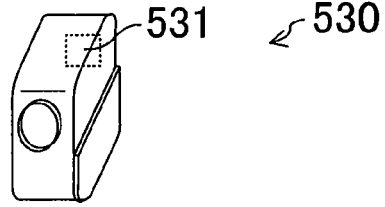
FIG. 21 is a general view of an electronic apparatus including the electronic device.

FIG. 21 is a general view of an electronic apparatus including an electronic device of the present invention. A digital camera 530 includes a signal processing LSI 531 being a semiconductor integrated circuit including an electronic device of the present invention. Since an electronic device of the present invention is capable of operating with a smaller power consumption than in the prior art, the signal processing LSI 531, and the digital camera 530 using the LSI can also operate with a low power consumption. Moreover, also for a semiconductor integrated circuit of the digital camera 530 other than the signal processing LSI 531, effects as described above can be obtained by employing an electronic device of the present invention for a logic circuit included in such a semiconductor integrated circuit.

The electronic apparatus including an electronic device of the present invention should not be limited to a digital camera, but generally includes apparatuses with a semiconductor integrated circuit, such as various sensors and electronic computers. With the present invention, it is possible to reduce the power consumption of electronic apparatuses in general.

Figure 22:
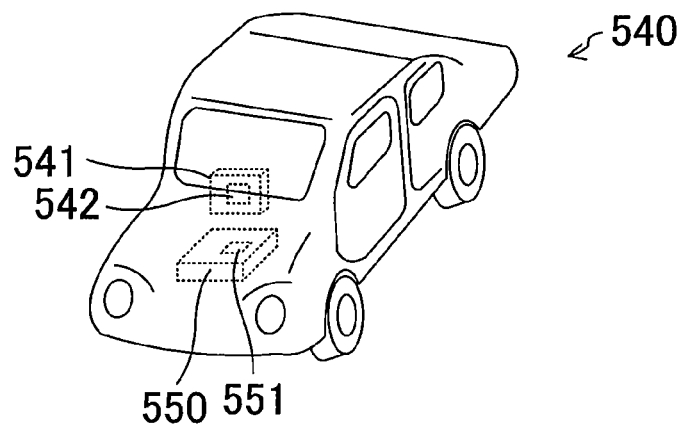
FIG. 22 is a general view of an electronic control apparatus including the electronic device, and a mobile apparatus using the electronic control apparatus.

FIG. 22 is a general view of an electronic control apparatus including an electronic device of the present invention, and a mobile apparatus using the electronic control apparatus. An automobile 540 includes an electronic control apparatus 550. The electronic control apparatus 550 includes an engine/transmission control LSI 551 for controlling the engine, the transmission, etc., of the automobile 540, the engine/transmission control LSI 551 being a semiconductor integrated circuit including an electronic device of the present invention. The automobile 540 further includes a navigation apparatus 541. As does the electronic control apparatus 550, the navigation apparatus 541 includes a navigation LSI 542 being a semiconductor integrated circuit including an electronic device of the present invention.

Since an electronic device of the present invention is capable of operating with a smaller power consumption than in the prior art, the engine/transmission control LSI 551, and the electronic control apparatus 550 using the LSI can also operate with a low power consumption. Similarly, the navigation LSI 542, and the navigation apparatus 541 using the LSI can also operate with a low power consumption. Moreover, also for a semiconductor integrated circuit of the electronic control apparatus 550 other than the engine/transmission control LSI 551, effects as described above can be obtained by employing an electronic device of the present invention for a logic circuit included in such a semiconductor integrated circuit. This similarly applies also to the navigation apparatus 541. With the reduction in the power consumption of the electronic control apparatus 550, it is possible to also reduce the power consumption of the automobile 540.

The electronic control apparatus including an electronic device of the present invention should not be limited to those controlling the engine or the transmission as described above, but generally includes apparatuses including a semiconductor integrated circuit for controlling the power source, such as a motor control apparatus. With the present invention, it is possible to reduce the power consumption of such an electronic control apparatus.

The mobile apparatus including an electronic device of the present invention should not be limited to automobiles, but generally includes those having an electronic control apparatus for controlling the engine, the motor, or the like, being a power source, such as trains and airplanes. With the present invention, it is possible to reduce the power consumption of such a mobile apparatus.

What is claimed is:
1. An electronic device, comprising:
at least one transmitter circuit;
at least one receiver circuit;
at least two conductors;

a dielectric surrounding the conductors; and a plurality of resistive elements connected in parallel between a first conductor including at least one of the conductors and a second conductor including at least one of the conductors excluding the first conductor, wherein:

the first conductor transfers a signal therethrough;

a length of a line of the first conductor is greater than or equal to one half of a product between an inverse of a signal transfer rate of the first conductor and a velocity of light traveling through the dielectric; and at least one of the resistive elements is provided along the line of the first conductor for every unit distance being equal to one half of the product between the signal transfer rate of the first conductor and the velocity of light traveling through the dielectric.

2. The electronic device of claim 1, wherein a potential of the second conductor is forcibly fixed from outside.

3. The electronic device of claim 2, wherein the fixed potential of the second conductor stays unchanged also while the first conductor is transferring a signal therethrough.

4. The electronic device of claim 1, wherein the second conductor transfers a complementary signal to the signal of the first conductor.

5. The electronic device of claim 1, wherein the line of the first conductor has a branched structure, and the resistive element is provided at a point of divergence.

6. The electronic device of claim 1, wherein the transmitter circuit or the receiver circuit is provided along the line of the first conductor.

7. The electronic device of claim 6, wherein the resistive element is included in the receiver circuit or the transmitter circuit.

8. The electronic device of claim 6, wherein the transmitter circuit sends out information on a signal-receiving position.

9. The electronic device of claim 6, wherein the transmitter circuit sends out, to the receiver circuit, information on a signal-transmitting position.

10. The electronic device of claim 6, wherein the receiver circuit adjusts a signal-receiving sensitivity depending on information on a position of the transmitter circuit.

11. The electronic device of claim 1, wherein a minimum signal transfer rate of the conductor is zero.

12. The electronic device of claim 1, further comprising:

an integration circuit for integrating together a resistance value of the first conductor and a resistance value of the resistive element; and a comparison circuit for comparing an integrated value obtained by the integration circuit with a reference value, wherein a resistance value of the resistive element is adjusted so that the integrated value and the reference value become equal to each other.

13. The electronic device of claim 12, wherein the reference value is an inductance value per unit capacitance of the first conductor.

14. The electronic device of claim 12, wherein the reference value is variable depending on a resulting shape of the conductor and an interlayer film surrounding the conductor.

15. The electronic device of claim 12, wherein the integration circuit is a multiplier.

16. The electronic device of claim 15, wherein the multiplier receives, as an input, a product between the resistance value of the resistive element and a current value of a constant current source.

17. The electronic device of claim 15, wherein the multiplier receives, as an input, a product between a resistance value of a conductor imitating the conductor and a current value of a constant current source.

18. The electronic device of claim 1, wherein the first conductor is a transmission signal line in a semiconductor integrated circuit.

19. The electronic device of claim 18, further comprising a power supply switch for tuning ON and OFF an external power supply to an FET in the semiconductor integrated circuit, wherein:

the power supply switch is connected to a power supply line from the external power supply; and the second conductor, which is connected to the first conductor in the semiconductor integrated circuit via the resistive element, is the power supply line.

20. The electronic device of claim 1, wherein the first conductor is connected to different processing units.

21. The electronic device of claim 1, wherein the first conductor is connected to a plurality of the same processing units.

22. The electronic device of claim 1, wherein the first conductor is connected to a plurality of processing elements forming a reconfigurable core.

23. The electronic device of claim 1, wherein a signal of the first conductor is transmitted from the transmitter circuit via a circuit receiving an electromagnetic wave.

24. The electronic device of claim 1, wherein:

the first conductor is covered by a silicon compound; and the silicon compound is polycrystalline in the resistive elements.

25. The electronic device of claim 1, wherein a connection between the conductor and a transmission signal line of a semiconductor integrated circuit is made via a conductor having a greater cross-sectional area than that of the conductor.

26. The electronic device of claim 1, wherein:

the resistive element includes at least one FET; and a source and a drain thereof are connected to different ones of the conductors, with a gate thereof receiving a voltage from a different conductor.

27. The electronic device of claim 1, wherein a voltage range of a signal line connected to the gate is a voltage region over which a source-drain current of the FET varies linearly while the first conductor is transferring a signal therethrough.

28. The electronic device of claim 27, wherein a voltage range of a signal line connected to the gate is a voltage region over which a source-drain current of the FET is cut off while the first conductor is not transferring a signal therethrough.

29. The electronic device of claim 28, wherein a voltage value of a substrate of the FET is variable independently of a source voltage, a drain voltage and a gate voltage thereof.

30. The electronic device of claim 1, wherein at an end portion of conductors connected to the first conductor via the resistive element, there exists a space greater than or equal to an interval at which other conductors are inserted.

31. The electronic device of claim 1, wherein at least one of conductors connected to the first conductor via the resistive element is arranged in parallel to the first conductor.

32. The electronic device of claim 1, wherein the second conductor is located between a semiconductor forming a substrate and the first conductor.

33. The electronic device of claim 32, wherein the second conductor includes a plurality of layers, with a bottom layer overlapping a third layer from the bottom layer.

34. A communications apparatus, comprising a semiconductor integrated circuit including the electronic device of claim 1.

35. An information reproduction apparatus, comprising a semiconductor integrated circuit including the electronic device of claim 1.

36. An image display apparatus, comprising a semiconductor integrated circuit including the electronic device of claim 1.

37. An electronic apparatus, comprising a semiconductor integrated circuit including the electronic device of claim 1.

38. An electronic control apparatus, comprising a semiconductor integrated circuit including the electronic device of claim 1.

39. A mobile apparatus, comprising the electronic control apparatus of claim 38.

* * * * *